(12) United States Patent
Kim et al.

(10) Patent No.: US 12,035,615 B2
(45) Date of Patent: Jul. 9, 2024

(54) ORGANIC LIGHT-EMITTING DEVICE, APPARATUS INCLUDING THE SAME, AND ORGANOMETALLIC COMPOUND

(71) Applicant: SAMSUNG DISPLAY CO., LTD., Yongin-si (KR)

(72) Inventors: Myeongsuk Kim, Yongin-si (KR); Byeongwook Yoo, Yongin-si (KR); Jimyoung Ye, Yongin-si (KR); Illhun Cho, Yongin-si (KR); Sunjae Kim, Goyang-si (KR); Jaeho Jeong, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 755 days.

(21) Appl. No.: 16/446,405

(22) Filed: Jun. 19, 2019

(65) Prior Publication Data
US 2020/0194693 A1  Jun. 18, 2020

(30) Foreign Application Priority Data

Dec. 13, 2018  (KR) .................. 10-2018-0161188

(51) Int. Cl.
*H10K 85/30*  (2023.01)
*C07F 15/00*  (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC ............. H01L 51/0087; H01L 51/5016; H01L 51/5056; H01L 51/5072; H01L 51/5088;
(Continued)

(56) References Cited

U.S. PATENT DOCUMENTS

2012/0018711 A1* 1/2012 Che .................. C07D 213/30
257/E51.026
2012/0187349 A1  7/2012 Stoessel et al.
(Continued)

FOREIGN PATENT DOCUMENTS

KR  10-2013-0043460 A  4/2013
KR  10-2013-0069723 A  6/2013
(Continued)

OTHER PUBLICATIONS

WO-2007088768-A1—translation (Year: 2007).*
(Continued)

*Primary Examiner* — Jennifer A Boyd
*Assistant Examiner* — Rachel Simbana
(74) *Attorney, Agent, or Firm* — Lewis Roca Rothgerber Christie LLP

(57) ABSTRACT

Provided are an organic light-emitting device, an apparatus including the same, and an organometallic compound represented by Formula 1. The organic light-emitting device includes: a first electrode; a second electrode; and an organic layer between the first electrode and the second electrode and including an emission layer. The organic layer includes an organometallic compound represented by Formula 1.

18 Claims, 2 Drawing Sheets

(51) Int. Cl.
- *C09K 11/06* (2006.01)
- *H10K 50/11* (2023.01)
- *H10K 50/15* (2023.01)
- *H10K 50/16* (2023.01)
- *H10K 50/17* (2023.01)
- *H10K 50/18* (2023.01)
- *H10K 101/10* (2023.01)

(52) U.S. Cl.
CPC .......... *C09K 2211/1029* (2013.01); *C09K 2211/1044* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/10* (2023.02)

(58) Field of Classification Search
CPC ............ H01L 51/5092; H01L 51/5096; H01L 51/5012; C07F 15/0086; C07F 15/0006; C07F 1/08; C07F 1/10; C07F 1/12; C07F 3/06; C07F 3/08; C07F 3/10; C07F 3/12; C07F 3/14; C07F 5/00; C07F 7/00; C07F 7/28; C07F 9/00; C07F 11/00; C07F 13/00; C07F 15/002; C07F 15/0033; C07F 15/0046; C07F 15/006; C07F 15/0073; C07F 15/02; C07F 15/04; C07F 15/06; C09K 11/06; C09K 2211/1029; C09K 2211/1044; C09K 2211/185; C09K 2211/183; C09K 2211/187; H10K 85/342; H10K 85/346; H10K 85/636; H10K 85/30; H10K 85/331; H10K 85/341; H10K 85/344; H10K 85/348; H10K 85/371; H10K 85/381

See application file for complete search history.

(56) References Cited

U.S. PATENT DOCUMENTS

| | | |
|---|---|---|
| 2018/0013078 A1 | 1/2018 | Lee et al. |
| 2018/0062088 A1 | 3/2018 | Cho et al. |

FOREIGN PATENT DOCUMENTS

| | | | |
|---|---|---|---|
| KR | 10-2018-0005128 A | 1/2018 | |
| KR | 10-2018-0023297 A | 3/2018 | |
| WO | WO-2007088768 A1 * | 8/2007 | ......... H01L 51/0087 |

OTHER PUBLICATIONS

Wu, Wenting; Wu, Wanhua; Ji, S.; Guo, H. Zhao, J.; 2010, Observation of Room-Temperature Deep-Red/Near-IR Phosphorescent of Pyrene with Cylcoplatinated Complexes: An Experimental and Theoretical Study, Eur. J. Inorg. Chem., 4470-4482 (Year: 2010).*

Heng, W.Y.; Hu, J.; Yip, J.H.; 2007, Attaching Gold and Platinum to the Rim of Pyrene: A Synthetic and Spectroscopic Study, Organometallics, 27, 6760-6768 (Year: 2007).*

* cited by examiner

ORGANIC LIGHT-EMITTING DEVICE, APPARATUS INCLUDING THE SAME, AND ORGANOMETALLIC COMPOUND

CROSS-REFERENCE TO RELATED APPLICATION

This application claims priority to and the benefit of Korean Patent Application No. 10-2018-0161188, filed on Dec. 13, 2018, in the Korean Intellectual Property Office, the entire content of which is incorporated herein by reference.

BACKGROUND

1. Field

One or more embodiments relate to an organic light-emitting device, an apparatus including the same, and an organometallic compound.

2. Description of the Related Art

Organic light-emitting devices are self-emission devices that produce full-color images, and also have wide viewing angles, high contrast ratios, short response times, and excellent characteristics in terms of brightness, driving voltage, and response speed, as compared to other devices in the art.

An example of such organic light-emitting devices may include a first electrode on a substrate, and a hole transport region, an emission layer, an electron transport region, and a second electrode, which are sequentially on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit (e.g., transition or relax) from an excited state to a ground state, thereby generating light.

SUMMARY

One or more embodiments include an organic light-emitting device, an apparatus including the same, and a novel organometallic compound.

Additional aspects of embodiments will be set forth in part in the description which follows and, in part, will be apparent from the description, or may be learned by practice of the presented embodiments.

An aspect of an embodiment of the present disclosure provides an organic light-emitting device that includes: a first electrode; a second electrode; and an organic layer between the first electrode and the second electrode and including an emission layer, wherein the organic layer includes an organometallic compound represented by Formula 1:

Formula 1

Formula 1-1

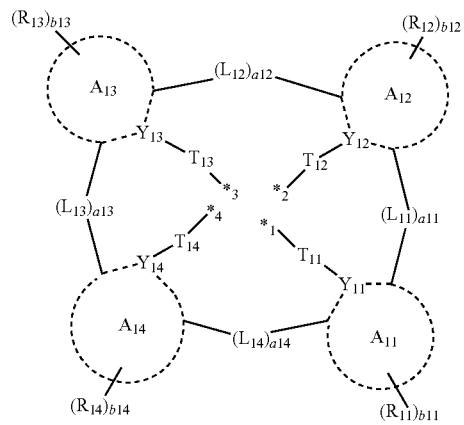

Formula 2

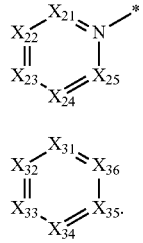

Formula 3

In Formulae 1, 1-1, 2, and 3, $M_1$ may be selected from a first-row transition metal, a second-row transition metal, and a third-row transition metal, of the Periodic Table of Elements,

*1 to *4 each indicate a binding site to $M_1$, $L_1$ may be a ligand represented by Formula 1-1, $L_2$ may be selected from a monodentate ligand and a bidentate ligand, n1 may be 1, n2 may be selected from 0, 1, and 2, $A_{11}$ may be a group represented by Formula 2, $A_{12}$ and $A_{14}$ may each independently be selected from a group represented by Formula 2, a group represented by Formula 3, a $C_5$-$C_{60}$ carbocyclic group, and a $C_1$-$C_{60}$ heterocyclic group, $A_{13}$ may be a group represented by Formula 3, $Y_{11}$ may be N, $Y_{12}$ to $Y_{14}$ may each independently be N and C, $T_{11}$ to $T_{14}$ may each independently be selected from a single bond, *—O—*', *—S—*', *—C($R_{15}$)($R_{16}$)—*', *—N($R_{15}$)—*', and *—P($R_{15}$)—*', $L_{11}$ to $L_{14}$ may each independently be selected from a single bond, *—O—*', *—S—*', *—C($R_{17}$)($R_{18}$)—*', *—C($R_{17}$)=*', *=C($R_{17}$)—*', *—C($R_{17}$)=C($R_{18}$)—*', *—C(=O)—*', *—C(=S)—*', *—C≡C—*', *—B($R_{17}$)—*', *—N($R_{17}$)—*', *—P($R_{17}$)—*', *—Si($R_{17}$)($R_{18}$)—*', *—P($R_{17}$)($R_{18}$)—*', and *—Ge($R_{17}$)($R_{18}$)—*', a11 to a14 may each independently be selected from 0, 1, 2, and 3, wherein at least three selected from a11 to a14 may be selected from 1, 2, and 3, when a11 is 0, $A_{11}$ and $A_{12}$ may not be linked, when a12 is 0, $A_{12}$ and $A_{13}$ may not be linked, when a13 is 0, $A_{13}$ and $A_{14}$ may not be linked, and when a14 is 0, $A_{14}$ and $A_{11}$ may not be linked, $X_{21}$ may be N, N—*, C—*, or $C(R_{21})$, $X_{22}$ may be N, N—*, C—*, or $C(R_{22})$, $X_{23}$ may be N, N—*, C—*, or $C(R_{23})$, $X_{24}$ may be N, N—*, C—*, or $C(R_{24})$, and $X_{25}$ may be N or N—*, $X_{31}$ may be N, N—*, C—*, or $C(R_{31})$, $X_{32}$ may be N, N—*, C—*, or $C(R_{32})$, $X_{33}$ may be N, N—*, C—*, or $C(R_{33})$, $X_{34}$ may be N, N—*, C—*, or $C(R_{34})$, $X_{35}$ may be N, N—*, C—*, or $C(R_{35})$, and $X_{36}$ may be N, N—*, C—*, or $C(R_{36})$, $R_{11}$ to $R_{18}$, $R_{21}$ to $R_{24}$, and $R_{31}$ to $R_{36}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si$(Q_1)(Q_2)(Q_3)$, —B$(Q_1)(Q_2)$, —N$(Q_1)(Q_2)$, —P$(Q_1)(Q_2)$, —C($=$O)$(Q_1)$, —S($=$O)$(Q_1)$, —S($=$O)$_2(Q_1)$, —P($=$O)$(Q_1)(Q_2)$, and —P($=$S)$(Q_1)(Q_2)$, $R_{17}$ and $R_{11}$, $R_{17}$ and $R_{12}$, $R_{17}$ and $R_{13}$, and/or $R_{17}$ and $R_{14}$ may optionally be linked to form a substituted or unsubstituted $C_5$-$C_{60}$ carbocyclic group or a substituted or unsubstituted $C_1$-$C_{60}$ heterocyclic group, $R_{17}$ and $R_{18}$ may optionally be linked to form a substituted or unsubstituted $C_5$-$C_{60}$ carbocyclic group or a substituted or unsubstituted $C_1$-$C_{60}$ heterocyclic group, $R_{21}$ to $R_{24}$ may optionally be linked to form a substituted or unsubstituted $C_5$-$C_{60}$ carbocyclic group or a substituted or unsubstituted $C_1$-$C_{60}$ heterocyclic group, $R_{31}$ to $R_{36}$ may optionally be linked to form a substituted or unsubstituted $C_5$-$C_{60}$ carbocyclic group or a substituted or unsubstituted $C_1$-$C_{60}$ heterocyclic group, b11 to b14 may each independently be selected from 1, 2, 3, 4, 5, 6, 7, and 8, $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group, and

* and *' each indicate a binding site to a neighboring atom.

Another aspect of an embodiment of the present disclosure provides an apparatus including the organic light-emitting device.

Another aspect of an embodiment of the present disclosure provides an organometallic compound represented by Formula 1.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Figure 1:
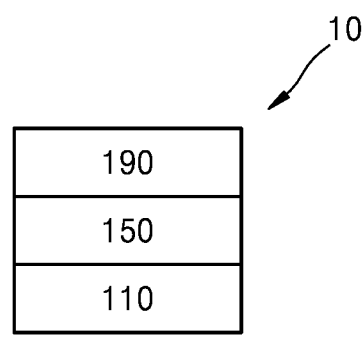
FIG. 1 is a schematic cross-sectional view of an organic light-emitting device according to an embodiment.

The subject matter of the present disclosure will now be described more fully with reference to exemplary embodiments. The subject matter of the present disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Features of embodiments of the present disclosure, and how to achieve those features, will become apparent by reference to the embodiments that are described herein below in more detail, together with the accompanying drawings. The subject matter of the present disclosure may, however, be embodied in many different forms and should not be limited to the exemplary embodiments described herein.

Hereinafter, embodiments are described in more detail by referring to the attached drawings, and in the drawings, like reference numerals denote like elements, and a duplicative explanation thereof may not be repeated herein.

As used herein, the singular forms "a," "an," and "the" are intended to include the plural forms as well, unless the context clearly indicates otherwise.

It will be further understood that the terms "comprises" and/or "comprising," as used herein, specify the presence of stated features or components, but do not preclude the presence or addition of one or more other features or components. As used herein, the term "and/or" includes any and all combinations of one or more of the associated listed items. Expressions such as "at least one of," when preceding a list of elements, modify the entire list of elements and do not modify the individual elements of the list.

It will be understood that when a layer, region, or component is referred to as being "on" or "onto" another layer, region, or component, it may be directly or indirectly formed on the other layer, region, or component. For example, intervening layers, regions, or components may be present. In addition, it will also be understood that when an element or layer is referred to as being "between" two elements or layers, it can be the only element or layer between the two elements or layers, or one or more intervening elements or layers may also be present.

Sizes of components in the drawings may be exaggerated for convenience of explanation. In other words, because sizes and thicknesses of components in the drawings may be arbitrarily illustrated for convenience of explanation, the following embodiments of the present disclosure are not limited thereto.

An aspect of an embodiment of the present disclosure provides an organic light-emitting device that includes: a first electrode; a second electrode; and an organic layer between the first electrode and the second electrode and including an emission layer, wherein the organic layer includes at least one of the organometallic compound represented by Formula 1.

$$M_1(L_1)_{n1}(L_2)_{n2} \qquad \text{Formula 1}$$

In Formula 1, $M_1$ may be selected from a first-row transition metal, a second-row transition metal, and a third-row transition metal, of the Periodic Table of Elements.

For example, in Formula 1, $M_1$ may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm), but embodiments of the present disclosure are not limited thereto.

In one embodiment, in Formula 1, $M_1$ may be selected from Pt, Pd, Cu, Ag, Au, Rh, Ir, Ru, and Os, but embodiments of the present disclosure are not limited thereto.

In one embodiment, in Formula 1, $M_1$ may be selected from Pt, Pd, Cu, Ag, Au, Ru, and Os, but embodiments of the present disclosure are not limited thereto.

In one embodiment, in Formula 1, $M_1$ may be selected from Pt, Pd, Ru, and Os, but embodiments of the present disclosure are not limited thereto.

In Formula 1, $L_1$ may be a ligand represented by Formula 1-1:

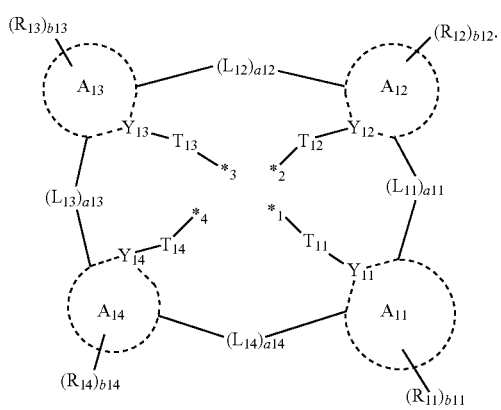

Formula 1-1

In Formula 1-1, *1 to *4 each indicate a binding site to $M_1$, and $A_{11}$ to $A_{14}$, $Y_{11}$ to $Y_{14}$, $T_{11}$ to $T_{14}$, $L_{11}$ to $L_{14}$, a11 to a14, $R_{11}$ to $R_{14}$, and b11 to b14 may each independently be the same as described herein below.

In Formula 1, n1 indicates the number of $L_1$(s), and n1 may be 1.

In Formula 1, $L_2$ may be selected from a monodentate ligand and a bidentate ligand.

In Formula 1, n2 indicates the number of $L_2$(s), and n2 may be selected from 0, 1, and 2.

For example, in Formula 1, n2 may be 0 or 2, but embodiments of the present disclosure are not limited thereto.

In Formula 1-1, $A_{11}$ may be a group represented by Formula 2, $A_{12}$ and $A_{14}$ may each independently be selected from a group represented by Formula 2, a group represented by Formula 3, a $C_5$-$C_{60}$ carbocyclic group, and a $C_1$-$C_{60}$ heterocyclic group, and $A_{13}$ may be a group represented by Formula 3:

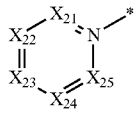

Formula 2

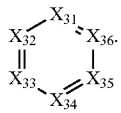

Formula 3

In Formulae 2 and 3, $X_{21}$ to $X_{25}$ and $X_{31}$ to $X_{36}$ may each independently be the same as described herein below.

For example, in Formula 1-1, $A_{12}$ and $A_{14}$ may each independently be selected from a group represented by Formula 2, a group represented by Formula 3, a) a 6-membered ring, b) a condensed ring in which at least two 6-membered rings are condensed (e.g., combined together), and c) at least one 6-membered ring and one 5-membered ring are condensed (e.g., combined together).

The 6-membered ring may be selected from a cyclohexane group, a cyclohexene group, a cyclohexadiene group, an adamantane group, a norbornane group, a norbornene group, a benzene group, a pyridine group, a dihydropyridine group, tetrahydropyridine group, a pyrimidine group, a dihydropyrimidine group, a tetrahydropyrimidine group, a pyrazine group, a dihydropyrazine group, a tetrahydropyrazine group, a pyridazine group, a dihydropyridazine group, a tetrahydropyridazine group, and a triazine group, the 5-membered ring may be selected from a cyclopentane group, a cyclopentene group, a cyclopentadiene group, a furan group, a thiophene group, a silole group, a pyrrole group, a pyrazole group, an imidazole group, a triazole group, a 2,3-dihydroimidazole group, a 2,3-dihydrotriazole group, an oxazole group, an isoxazole group, a thiazole group, an isothiazole group, an oxadiazole group, and a thiadiazole group, but embodiments of the present disclosure are not limited thereto.

In more detail, the 6-membered ring may be selected from a cyclohexane group, a cyclohexene group, a cyclohexadiene group, a benzene group, a pyridine group, a pyrimidine group, a pyrazine group, a pyridazine group, and a triazine group, and the 5-membered ring may be selected from a cyclopentane group, a cyclopentene group, a cyclopentadiene group, a furan group, a thiophene group, a pyrrole group, an oxazole group, and a thiazole group, but embodiments of the present disclosure are not limited thereto.

In Formula 1-1, $Y_{11}$ may be N, and $Y_{12}$ to $Y_{14}$ may each independently be selected from N and C. In some embodiments, in Formula 1-1, $Y_{11}$ may correspond to the N atom of Formula 2, $Y_{13}$ may correspond to one of $X_{31}$ to $X_{34}$ of Formula 3 (one of $X_{31}$ to $X_{34}$ of Formula 3 being N), $Y_{12}$ and $Y_{14}$ may each respectively correspond to the N atom or one of $X_{21}$ to $X_{25}$ of Formula 3, one of $X_{31}$ to $X_{34}$ of Formula 3, a ring atom of the $C_5$-$C_{60}$ carbocyclic group, or a ring atom of the $C_1$-$C_{60}$ heterocyclic group.

For example, in Formula 1-1, two selected from $Y_{12}$ to $Y_{14}$ may each independently be C, and the other thereof may be N, but embodiments of the present disclosure are not limited thereto.

In Formula 1-1, $T_{11}$ to $T_{14}$ may each independently be selected from a single bond, *—O—*', *—S—*', *—C($R_{15}$)($R_{16}$)—*', *—N($R_{16}$)—*', and *—P($R_{15}$)—*', and $R_{15}$ and $R_{16}$ may each independently be the same as described herein below, and and *' each indicate a binding site to a neighboring atom.

For example, in Formula 1-1, $T_{14}$ may be selected from a single bond, *—O—*', *—S—*', *—C($R_{15}$)($R_{16}$)—*', *—N($R_{16}$)—*', and *—P($R_{15}$)—*', and $T_{11}$ to $T_{13}$ may each independently be a single bond, but embodiments of the present disclosure are not limited thereto.

In Formula 1-1, $L_{11}$ to $L_{14}$ may each independently be selected from a single bond, *—O—*', *—S—*', *—C($R_{17}$)($R_{18}$)—*', *—C($R_{17}$)=*', *=C($R_{17}$)—*', *—C($R_{17}$)=C($R_{18}$)—*', *—C(=O)—*', *—C(=S)—*', *—C≡C—*', *—B($R_{17}$)—*', *—N($R_{17}$)—*', *—P($R_{17}$)—*', *—Si($R_{17}$)($R_{18}$)—*', *—P($R_{17}$)($R_{18}$)—*', and *—Ge($R_{17}$)($R_{18}$)—*', $R_{17}$ and $R_{18}$ may each independently be the same as described herein below, and

* and *' each indicate a binding site to a neighboring atom.

For example, in Formula 1-1, $L_{11}$ to $L_{14}$ may each independently be a single bond, but embodiments of the present disclosure are not limited thereto.

In Formula 1-1, a11 to a14 may each independently be selected from 0, 1, 2, and 3, wherein at least three selected from a11 to a14 may be selected from 1, 2, and 3,
  when a11 is 0, $A_{11}$ and $A_{12}$ may not be linked (e.g., may not be directly chemically bonded to one another),
  when a12 is 0, $A_{12}$ and $A_{13}$ may not be linked (e.g., may not be directly chemically bonded to one another),
  when a13 is 0, $A_{13}$ and $A_{14}$ may not be linked (e.g., may not be directly chemically bonded to one another), and
  when a14 is 0, $A_{14}$ and $A_{11}$ may not be linked (e.g., may not be directly chemically bonded to one another).

For example, in Formula 1-1, a11 to a14 may each independently be selected from 0 and 1,
  the sum of a11 to a14 may be selected from 3 and 4, but embodiments of the present disclosure are not limited thereto.

In one embodiment, in Formula 1-1, a11 to a13 may each independently be 1, and a14 may be 0, but embodiments of the present disclosure are not limited thereto.

In one embodiment, in the organometallic compound, a ring formed by $M_1$, $T_{11}$, $Y_{11}$, $(L_{11})_{a11}$, $Y_{12}$, and $T_{12}$, a ring formed by $M_1$, $T_{12}$, $Y_{12}$, $(L_{12})_{a12}$, $Y_{13}$, and $T_{13}$, a ring formed by $M_1$, $T_{13}$, $Y_{13}$, $(L_{13})_{a13}$, $Y_{14}$, and $T_{14}$, and a ring formed by $M_1$, $T_{14}$, $Y_{14}$, $(L_{14})_{a14}$, $Y_{11}$, and $T_{11}$ may each independently be a 5-membered ring, a 6-membered ring, or a 7-membered ring, but embodiments of the present disclosure are not limited thereto.

In Formula 2, $X_{21}$ may be N, N—*, C—*, or C($R_{21}$), $X_{22}$ may be N, N—*, C—*, or C($R_{22}$), $X_{23}$ may be N, N—*, C—*, or C($R_{23}$), $X_{24}$ may be N, N—*, C—*, or C($R_{24}$), and $X_{25}$ may be N or N—*, $R_{21}$ to $R_{24}$ may each independently be the same as described herein below, and

* indicates a binding site to a neighboring atom.

For example, in Formula 2, $X_{21}$ may be C($R_{21}$), $X_{22}$ may be C($R_{22}$), $X_{23}$ may be C($R_{23}$), $X_{24}$ may be C($R_{24}$), $X_{25}$ may be N, and $R_{21}$ and $R_{22}$ may be linked (e.g., may be directly chemically bonded to one another) to form a substituted or unsubstituted $C_5$-$C_{60}$ carbocyclic group or a substituted or unsubstituted $C_1$-$C_{60}$ heterocyclic group;

$X_{21}$ may be C—*, $X_{22}$ may be C($R_{22}$), $X_{23}$ may be C($R_{23}$), $X_{24}$ may be C($R_{24}$), $X_{25}$ may be N, and $R_{22}$ and $R_{23}$ may be linked (e.g., may be directly chemically bonded to one another) to form a substituted or unsubstituted $C_5$-$C_{60}$ carbocyclic group or a substituted or unsubstituted $C_1$-$C_{60}$ heterocyclic group;

$X_{21}$ may be C—*, $X_{22}$ may be C($R_{22}$), $X_{23}$ may be C($R_{23}$), $X_{24}$ may be C($R_{24}$), $X_{25}$ may be N, and $R_{23}$ and $R_{24}$ may be linked (e.g., may be directly chemically bonded to one another) to form a substituted or unsubstituted $C_5$-$C_{60}$ carbocyclic group or a substituted or unsubstituted $C_1$-$C_{60}$ heterocyclic group;

$X_{21}$ may be C($R_{21}$), $X_{22}$ may be C($R_{22}$), $X_{23}$ may be C($R_{23}$), $X_{24}$ may be C($R_{24}$), $X_{25}$ may be N, and $R_{21}$ and $R_{22}$, and $R_{22}$ and $R_{23}$ may each independently be linked (e.g., may be directly chemically bonded to one another) to form a substituted or unsubstituted $C_5$-$C_{60}$ carbocyclic group or a substituted or unsubstituted $C_1$-$C_{60}$ heterocyclic group;

$X_{21}$ may be C—*, $X_{22}$ may be C($R_{22}$), $X_{23}$ may be C($R_{23}$), $X_{24}$ may be C($R_{24}$), $X_{25}$ may be N, and $R_{22}$ and $R_{23}$, and $R_{23}$ and $R_{24}$ may each independently be linked (e.g., may be directly chemically bonded to one another) to form a substituted or unsubstituted $C_5$-$C_{60}$ carbocyclic group or a substituted or unsubstituted $C_1$-$C_{60}$ heterocyclic group;

$X_{21}$ may be C($R_{21}$), $X_{22}$ may be C($R_{22}$), $X_{23}$ may be C($R_{23}$), $X_{24}$ may be C($R_{24}$), $X_{25}$ may be N, and $R_{21}$ and $R_{22}$, and $R_{23}$ and $R_{24}$ may each independently be linked (e.g., may be directly chemically bonded to one another) to form a substituted or unsubstituted $C_5$-$C_{60}$ carbocyclic group or a substituted or unsubstituted $C_1$-$C_{60}$ heterocyclic group; or $X_{21}$ may be C($R_{21}$), $X_{22}$ may be C($R_{22}$), $X_{23}$ may be C($R_{23}$), $X_{24}$ may be C($R_{24}$), $X_{25}$ may be N, and $R_{21}$ and $R_{22}$, $R_{22}$ and $R_{23}$, and $R_{23}$ and $R_{24}$ may each independently be linked (e.g., may be directly chemically bonded to one another) to form a substituted or unsubstituted $C_5$-$C_{60}$ carbocyclic group or a substituted or unsubstituted $C_1$-$C_{60}$ heterocyclic group, but embodiments of the present disclosure are not limited thereto.

In one embodiment, in Formula 1-1, $A_{11}$ may be represented by one selected from Formulae 2-1 to 2-7, but embodiments of the present disclosure are not limited thereto:

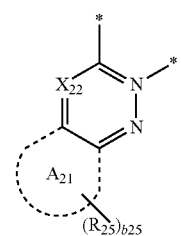

2-1

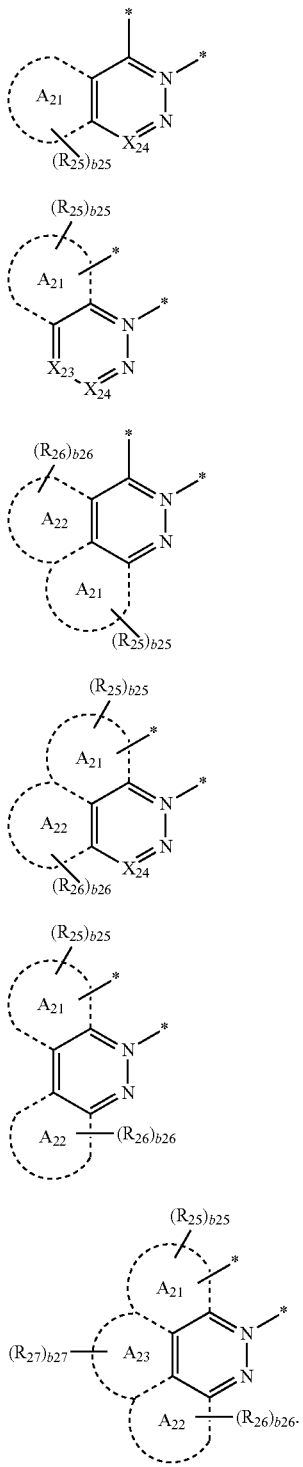

In Formulae 2-1 to 2-7, $X_{22}$ to $X_{24}$ may each independently be the same as described with respect to Formula 2, $R_{25}$ to $R_{27}$ may each independently be the same as described with respect to connection with $R_{21}$ in Formula 2, $R_{25}$ to $R_{27}$ may optionally be linked (e.g., may be directly chemically bonded to one another) to form a substituted or unsubstituted $C_5$-$C_{60}$ carbocyclic group or a substituted or unsubstituted $C_1$-$C_{60}$ heterocyclic group, b25 to b27 may each independently be selected from 1, 2, 3, 4, 5, 6, 7, and 8, $A_{21}$ to $A_{23}$ may each independently be selected from a benzene group, a naphthalene group, a phenalene group, an anthracene group, a pyrene group, a chrysene group, and a triphenylene group, and

* indicates a binding site to a neighboring atom.

In Formula 3, $X_{31}$ may be N, N—*, C—*, or $C(R_{31})$, $X_{32}$ may be N, N—*, C—*, or $C(R_{32})$, $X_{33}$ may be N, N—*, C—*, or $C(R_{33})$, $X_{34}$ may be N, N—*, C—*, or $C(R_{34})$, $X_{35}$ may be N, N—*, C—*, or $C(R_{35})$, and $X_{36}$ may be N, N—*, C—*, or $C(R_{36})$, $R_{31}$ to $R_{36}$ may each independently be the same as described herein below, and

* indicates a binding site to a neighboring atom.

For example, in Formula 3, $X_{31}$ may be N—*, $X_{32}$ may be $C(R_{32})$, $X_{33}$ may be $C(R_{33})$, $X_{34}$ may be $C(R_{34})$, $X_{35}$ may be $C(R_{35})$, and $X_{36}$ may be $C(R_{36})$;

$X_{31}$ may be C—*, $X_{32}$ may be $C(R_{32})$, $X_{33}$ may be $C(R_{33})$, $X_{34}$ may be $C(R_{34})$, $X_{35}$ may be $C(R_{35})$, and $X_{36}$ may be $C(R_{36})$; or $X_{31}$ may be N—*, $X_{32}$ may be $C(R_{32})$, $X_{33}$ may be $C(R_{33})$, $X_{34}$ may be N, $X_{35}$ may be $C(R_{35})$, and $X_{36}$ may be $C(R_{36})$, but embodiments of the present disclosure are not limited thereto.

In Formulae 1-1, 2, and 3, $R_{11}$ to $R_{18}$, $R_{21}$ to $R_{24}$, and $R_{31}$ to $R_{36}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$B(=O)_2(Q_1)$, —$P(=O)(Q_1)(Q_2)$, and —$P(=S)(Q_1)(Q_2)$, $R_{17}$ and $R_{11}$, $R_{17}$ and $R_{12}$, $R_{17}$ and $R_{13}$, and/or $R_{17}$ and $R_{14}$ may optionally be linked (e.g., may be directly chemically bonded to one another) to form a substituted or unsubstituted $C_5$-$C_{60}$ carbocyclic group or a substituted or unsubstituted $C_1$-$C_{60}$ heterocyclic group, $R_{17}$ and $R_{18}$ may optionally be linked (e.g., may be directly chemically bonded to one another) to form a substituted or unsubstituted $C_5$-$C_{60}$ carbocyclic group or a substituted or unsubstituted $C_1$-$C_{60}$ heterocyclic group, $R_{21}$ to $R_{24}$ may optionally be linked (e.g., may be directly chemically bonded to one another) to form a substituted or unsubstituted $C_5$-$C_{60}$ carbocyclic group or a substituted or unsubstituted $C_1$-$C_{60}$ heterocyclic group, $R_{31}$ to $R_{36}$ may optionally be linked (e.g., may be directly chemically bonded to one another) to form a substituted or unsubstituted $C_5$-$C_{60}$ carbocyclic group or a substituted or unsubstituted $C_1$-$C_{60}$ heterocyclic group, and $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group.

For example, in Formulae 1-1, 2, and 3, $R_{11}$ to $R_{18}$, $R_{21}$ to $R_{24}$, and $R_{31}$ to $R_{36}$ may each independently be selected from:

hydrogen, deuterium, —F, —Cl, —Br, —I, a cyano group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a cyano group, a phenyl group, a biphenyl group, and a terphenyl group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, and an indolocarbazolyl group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, and an indolocarbazolyl group, each substituted with at least one selected from deuterium, —F, —Cl, —Br, —I, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphtho silolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, an indolocarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)($Q_{31}$), —S(=O)$_2$($Q_{31}$), —P(=O)($Q_{31}$)($Q_{32}$), and —P(=S)($Q_{31}$)($Q_{32}$); and —Si($Q_1$)($Q_2$)($Q_3$), —N($Q_1$)($Q_2$), —B($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), and $Q_1$ to $Q_3$ and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, but embodiments of the present disclosure are not limited thereto.

In one embodiment, in Formulae 1-1, 2, and 3, $R_{11}$ to $R_{18}$, $R_{21}$ to $R_{24}$, and $R_{31}$ to $R_{36}$ may each independently be selected from:

hydrogen, deuterium, —F, —Cl, —Br, —I, a cyano group, and a $C_1$-$C_{20}$ alkyl group;

a $C_1$-$C_{20}$ alkyl group substituted with at least one selected from deuterium, —F, —Cl, —Br, —I, and a cyano group;

a cyclopentyl group and a cyclohexyl group;

groups represented by Formulae 5-1 to 5-138; and

—Si(C)$_1$)($Q_2$)($Q_3$), —N($Q_1$)($Q_2$), —B($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), but embodiments of the present disclosure are not limited thereto:

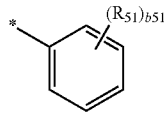

5-1

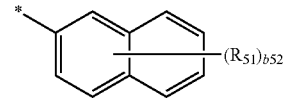

5-2

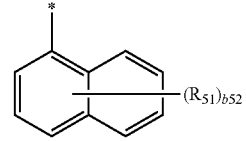

5-3

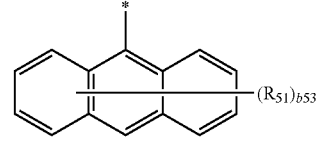

5-4

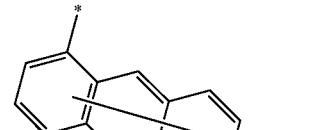

5-5

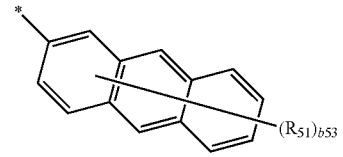

5-6

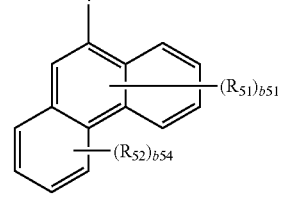

5-7

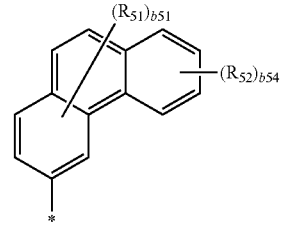

5-8

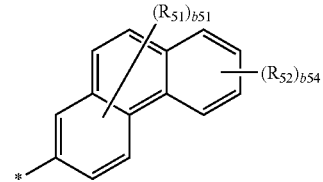

5-9

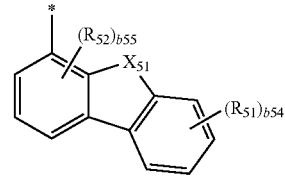

5-10

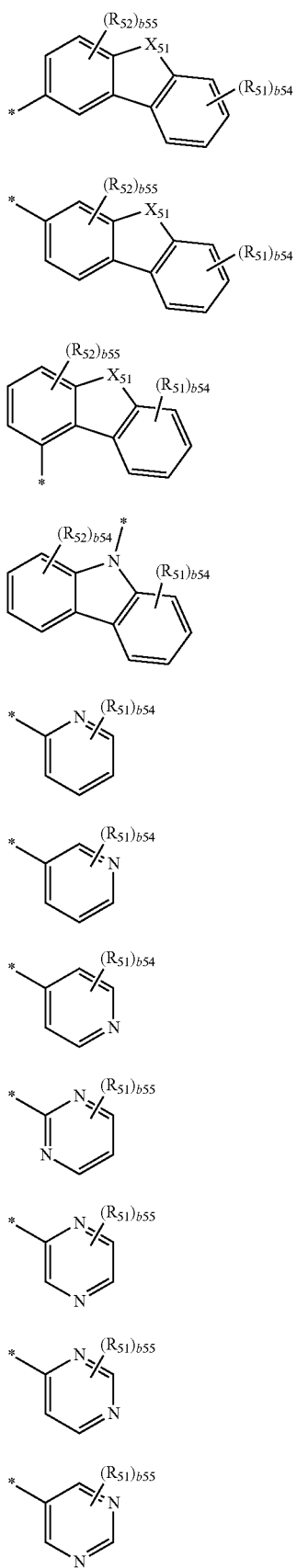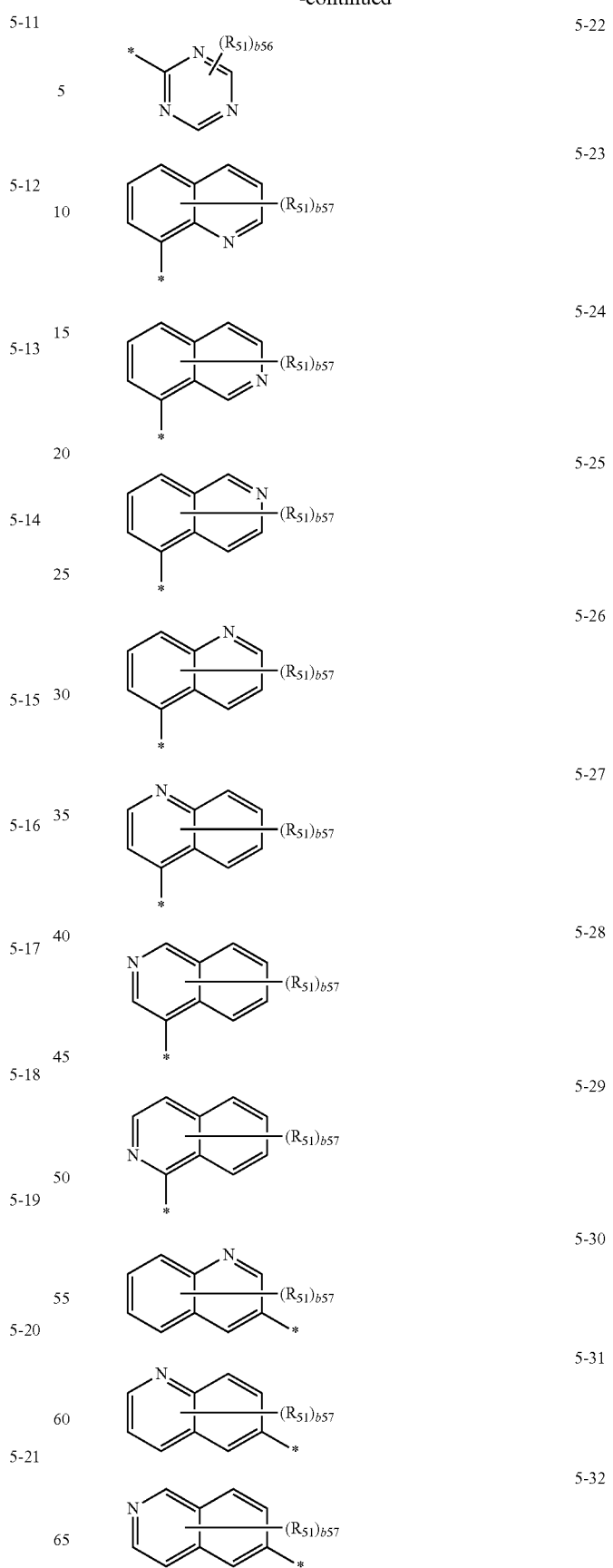

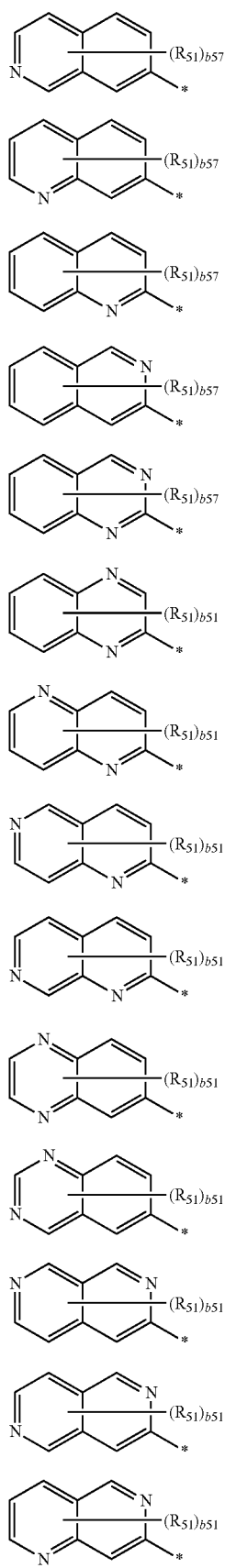
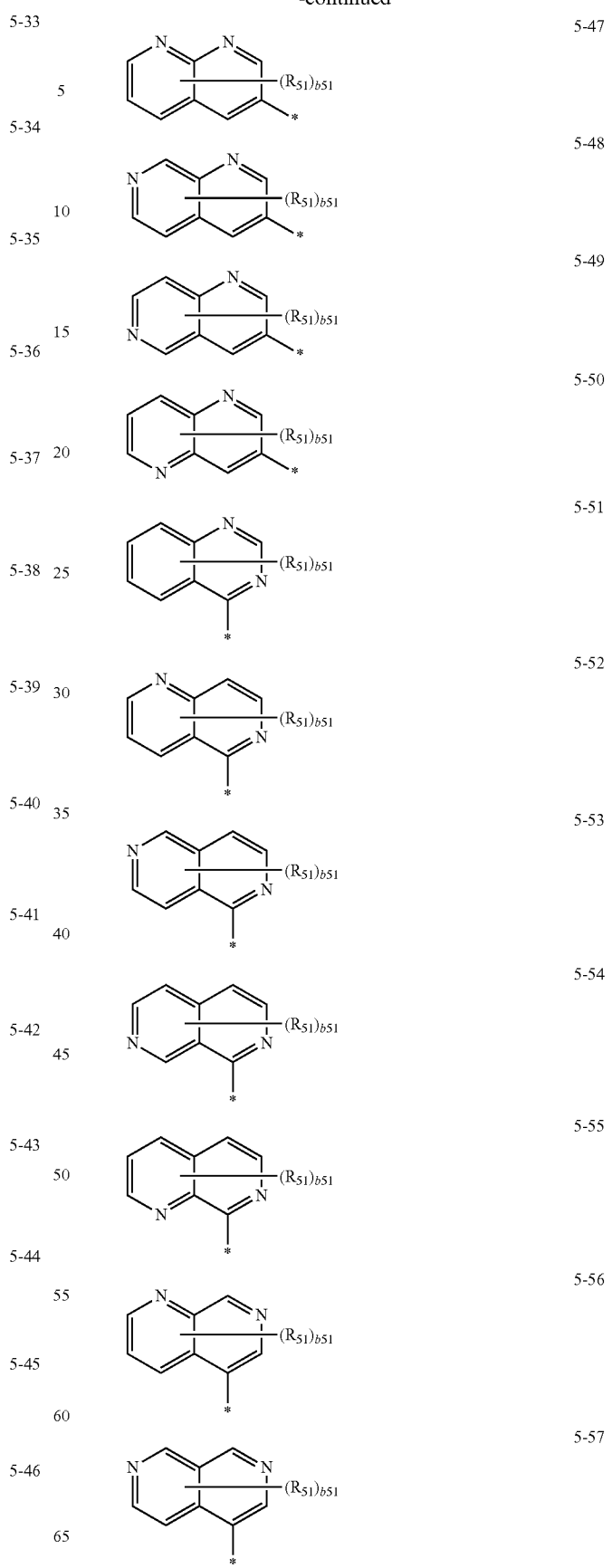

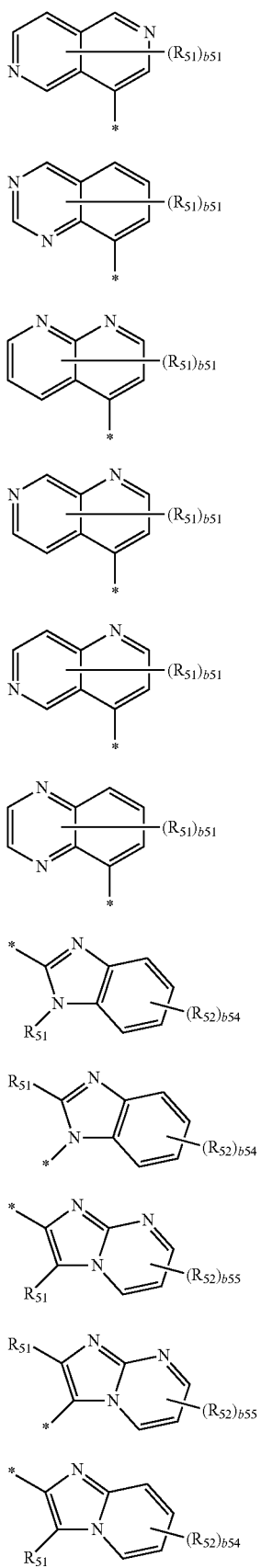
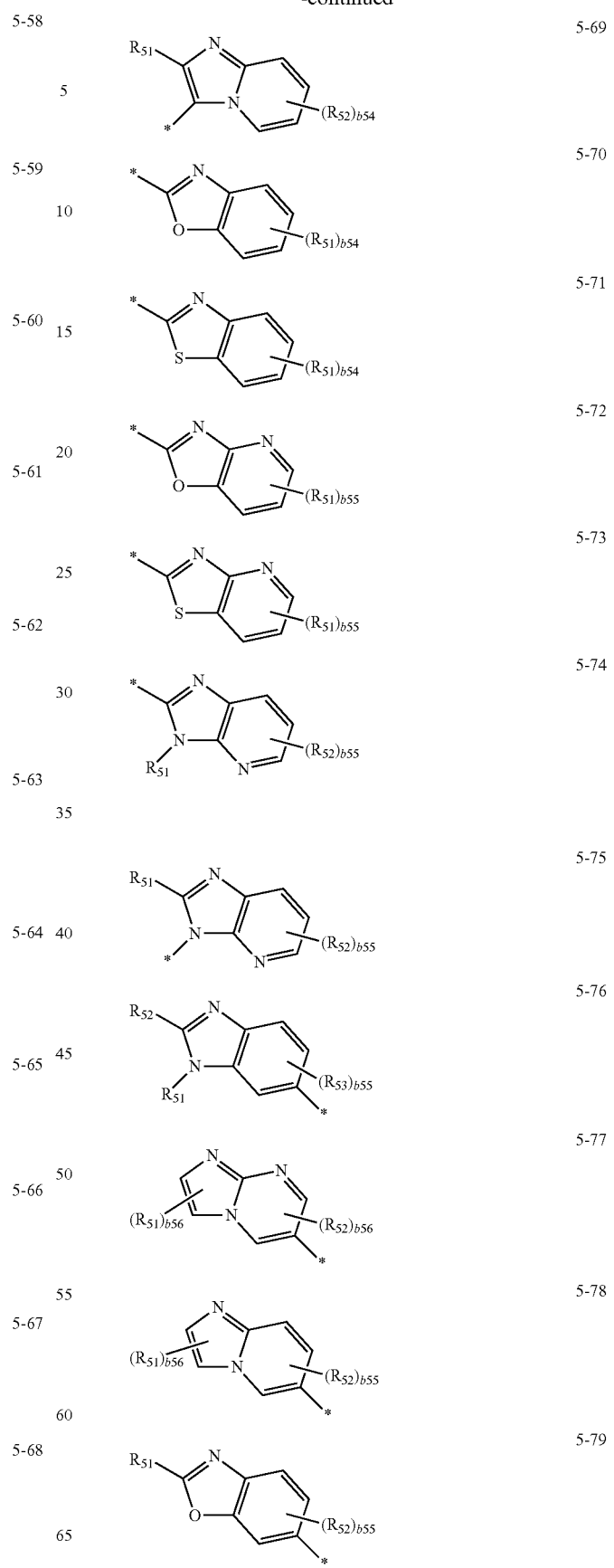

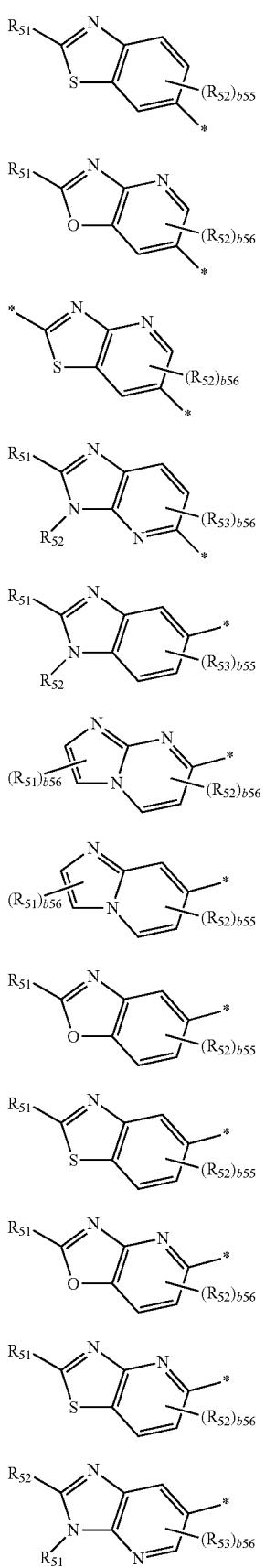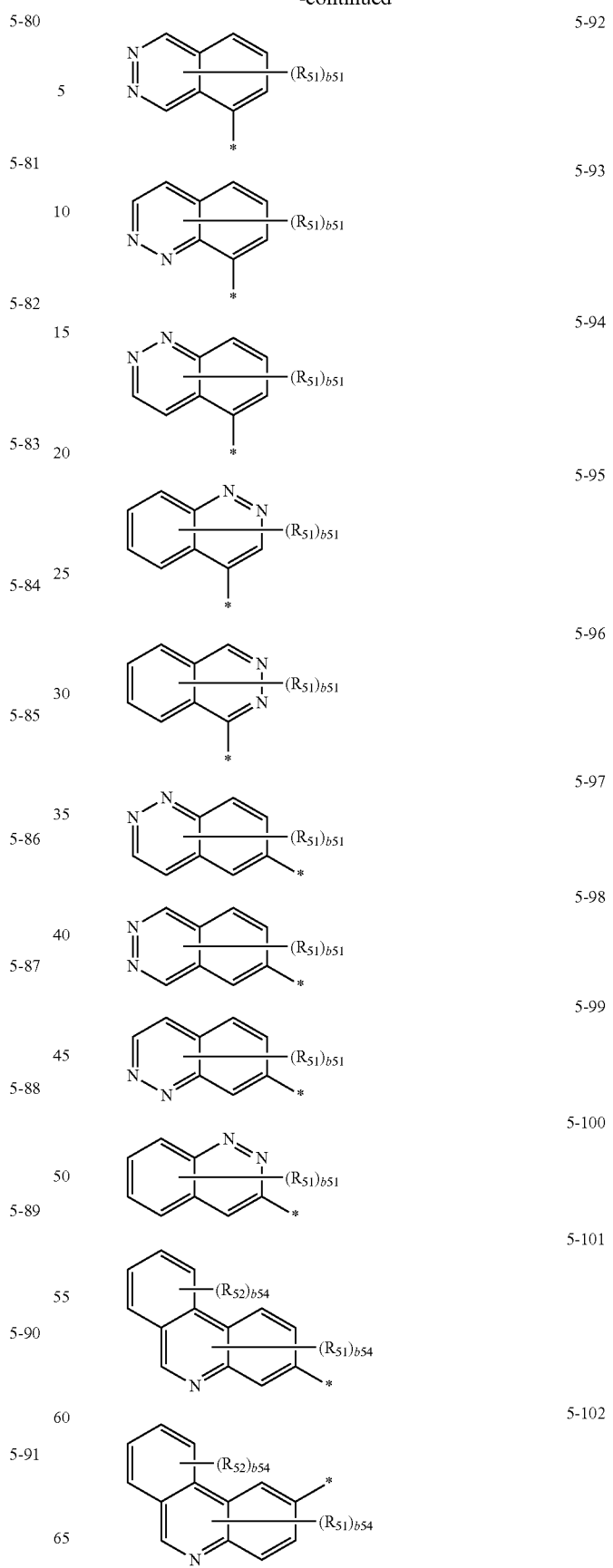

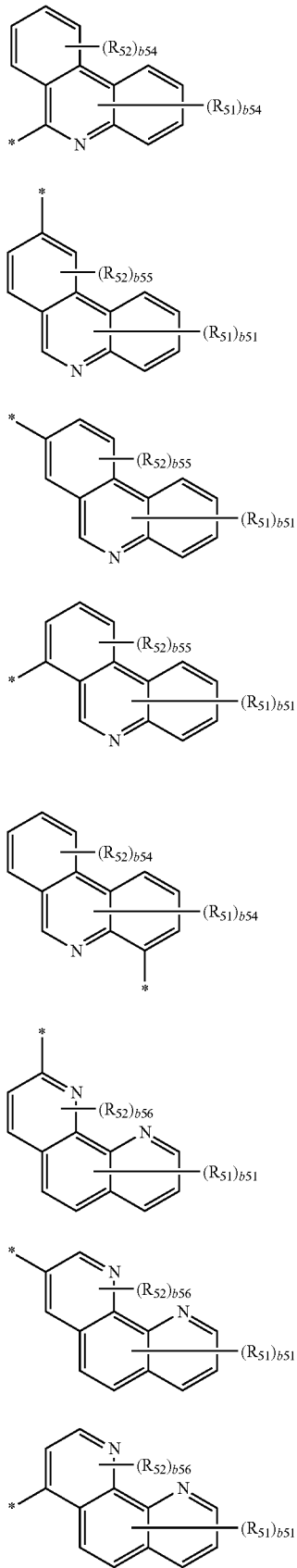
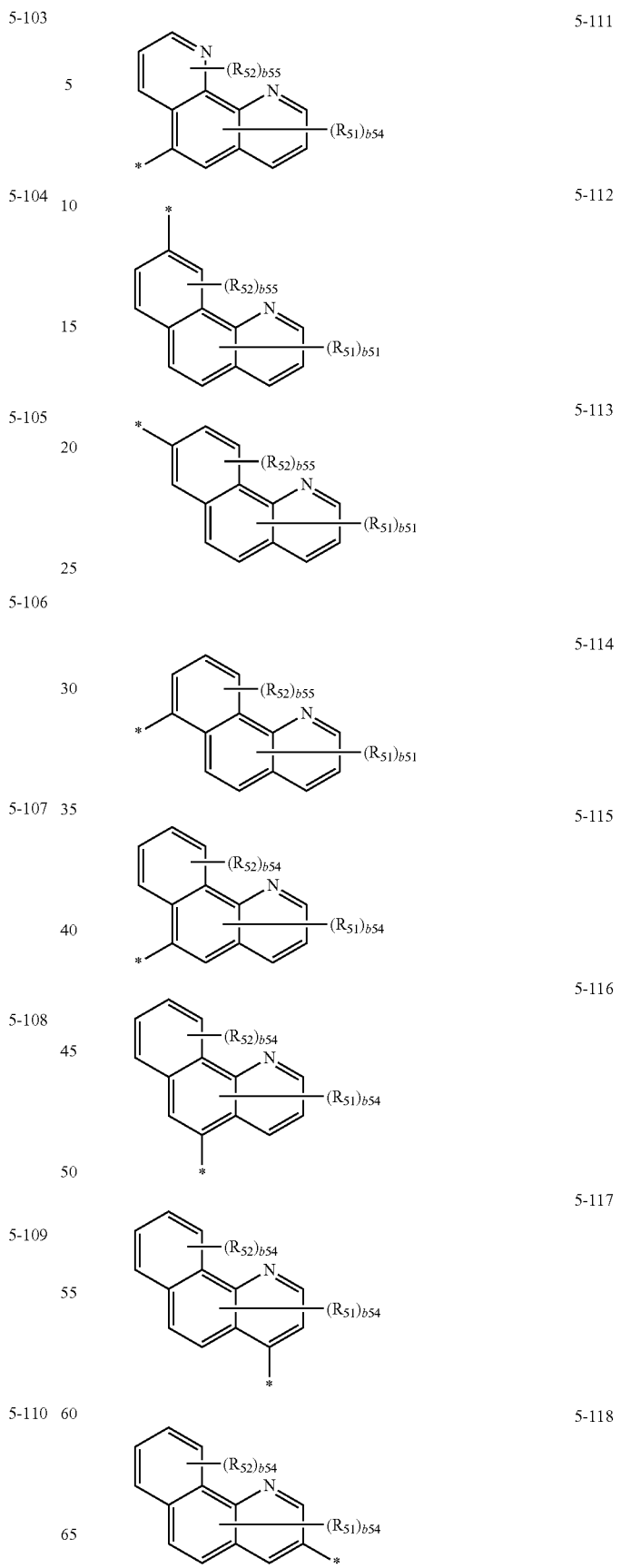

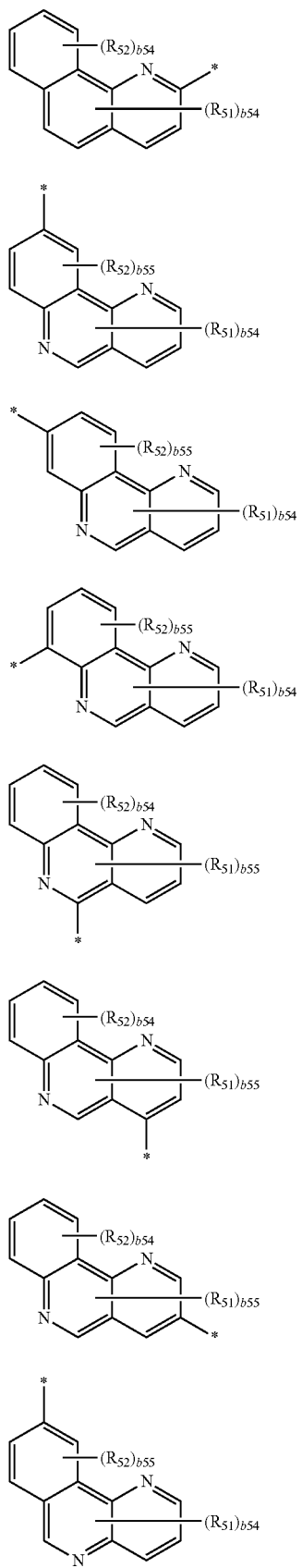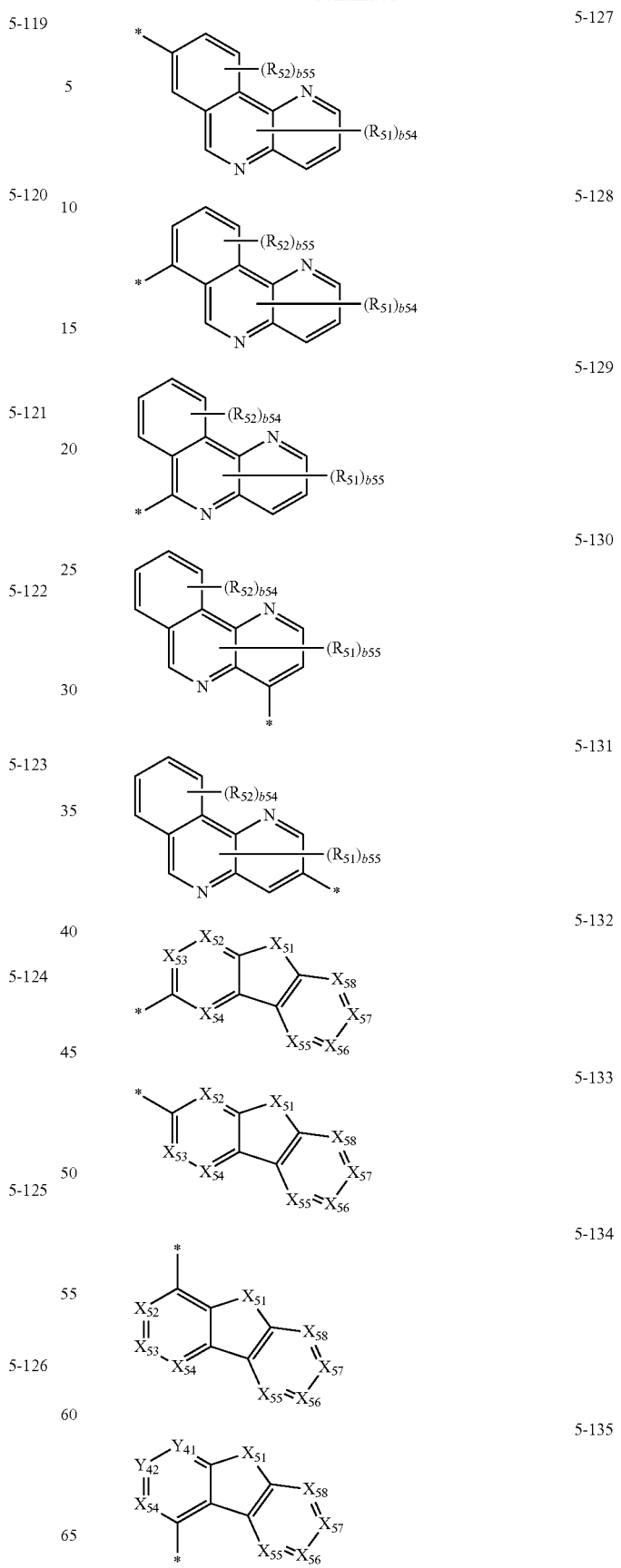

-continued

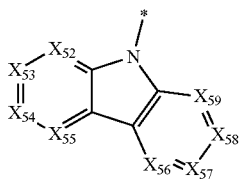
5-136

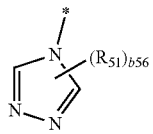
5-137

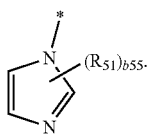
5-138

In Formulae 5-1 to 5-138, $X_{51}$ may be selected from O, S, N($R_{51}$), and C($R_{51}$)($R_{60}$),
$X_{52}$ may be N or C($R_{52}$), $X_{53}$ may be N or C($R_{53}$), $X_{54}$ may be N or C($R_{54}$), $X_{55}$ may be N or C($R_{55}$), $X_{56}$ may be N or C($R_{58}$), $X_{57}$ may be N or C($R_{57}$), $X_{58}$ may be N or C($R_{58}$), and $X_{59}$ may be N or C($R_{59}$), $R_{51}$ to $R_{60}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a thiophenyl group, a furanyl group, a silolyl group, a carbazolyl group, an indolyl group, an isoindolyl group, a benzofuranyl group, a benzothiophenyl group, a benzosilolyl group, a dibenzofuranyl group, a dibenzothiophenyl group, a benzocarbazolyl group, a dibenzocarbazolyl group, a dibenzosilolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)($Q_{31}$), —S(=O)$_2$($Q_{31}$), —P(=O)($Q_{31}$)($Q_{32}$), and —P(=S)($Q_{31}$)($Q_{32}$), $Q_1$ to $Q_3$ and $Q_{31}$ to $Q_{33}$ may each independently be selected from a $C_1$-$C_{60}$ alkyl group, a phenyl group, a biphenyl group, and a terphenyl group.

b51 may be selected from 1, 2, 3, 4, and 5,
b52 may be selected from 1, 2, 3, 4, 5, 6, and 7,
b53 may be selected from 1, 2, 3, 4, 5, 6, 7, 8, and 9,
b54 may be selected from 1, 2, 3, and 4,
b55 may be selected from 1, 2, and 3,
b56 may be selected from 1 and 2,
b57 may be selected from 1, 2, 3, 4, 5, and 6, and
* indicates a binding site to a neighboring atom.

in one embodiment, in Formulae 1-1, 2, and 3, $R_{11}$ to $R_{18}$, $R_{21}$ to $R_{24}$, and $R_{31}$ to $R_{36}$ may each independently be selected from:

hydrogen, deuterium, —F, —Cl, —Br, —I, a cyano group, a methyl group, an ethyl group, an n-propyl group, an isopropyl group, an n-butyl group, an isobutyl group, a sec-butyl group, and a tert-butyl group;

a methyl group, an ethyl group, an n-propyl group, an isopropyl group, an n-butyl group, an isobutyl group, a sec-butyl group, and a tert-butyl group, each substituted with at least one selected from deuterium, —F, —Cl, —Br, —I, and a cyano group;

a cyclopentyl group and a cyclohexyl group; and groups represented by Formulae 6-1 to 6-259, but embodiments of the present disclosure are not limited thereto:

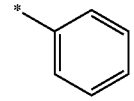
6-1

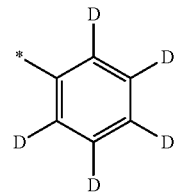
6-2

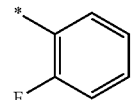
6-3

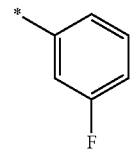
6-4

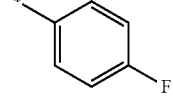
6-5

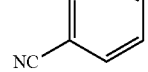
6-6

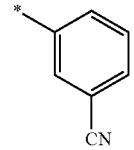
6-7

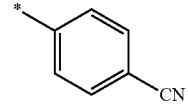
6-8

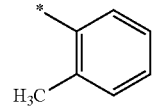
6-9

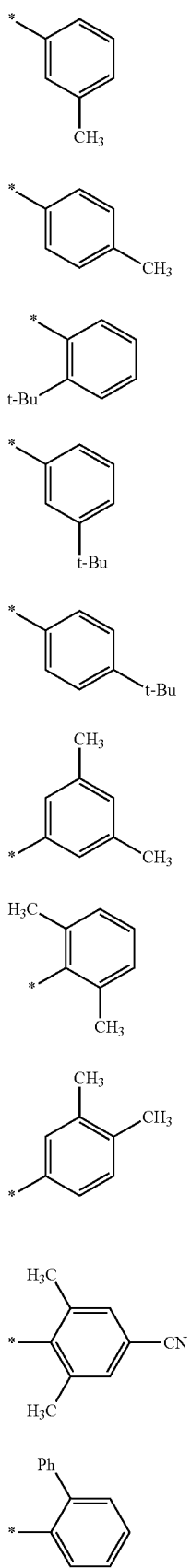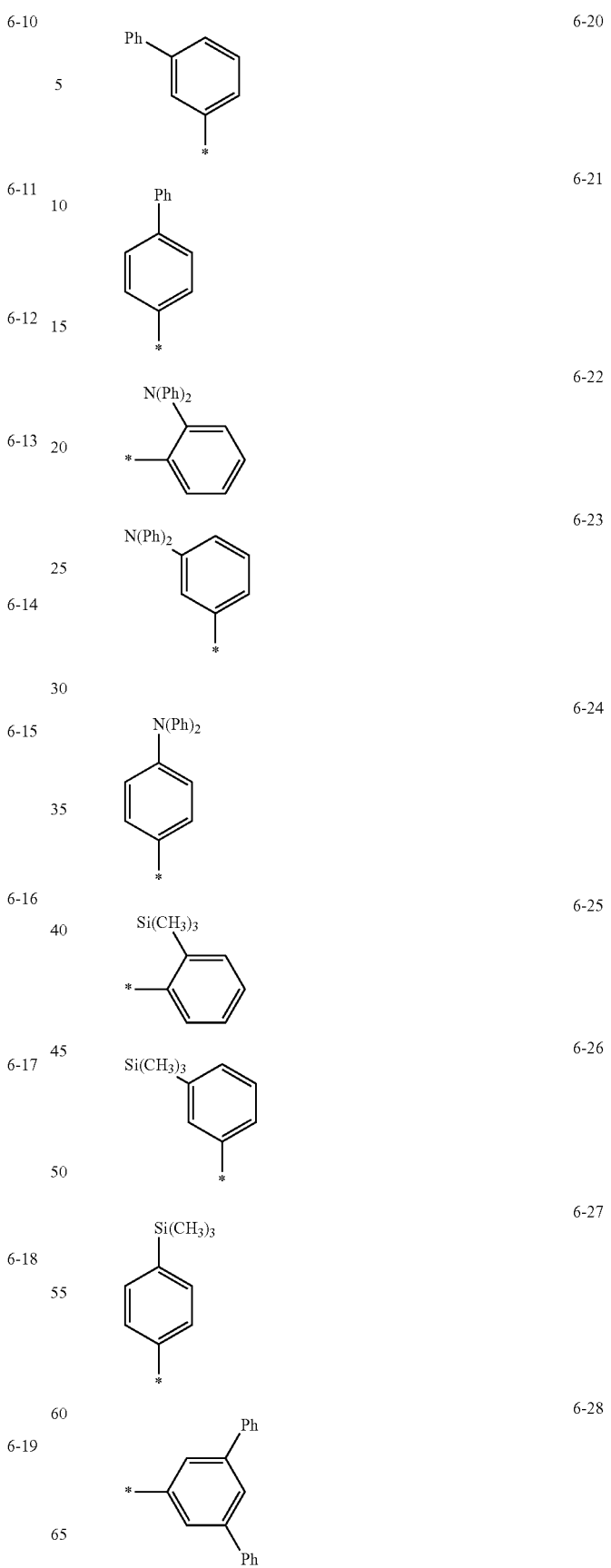

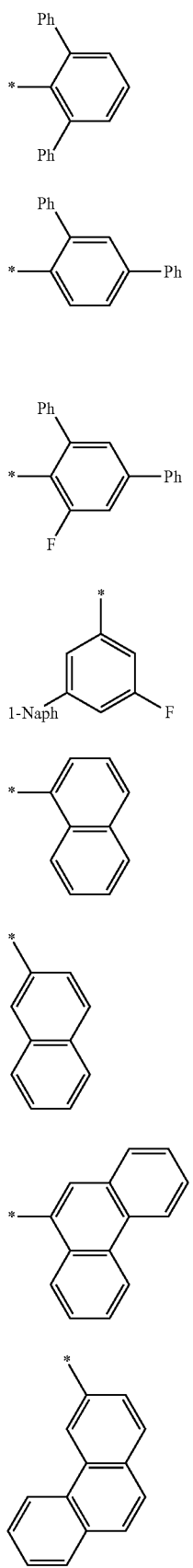
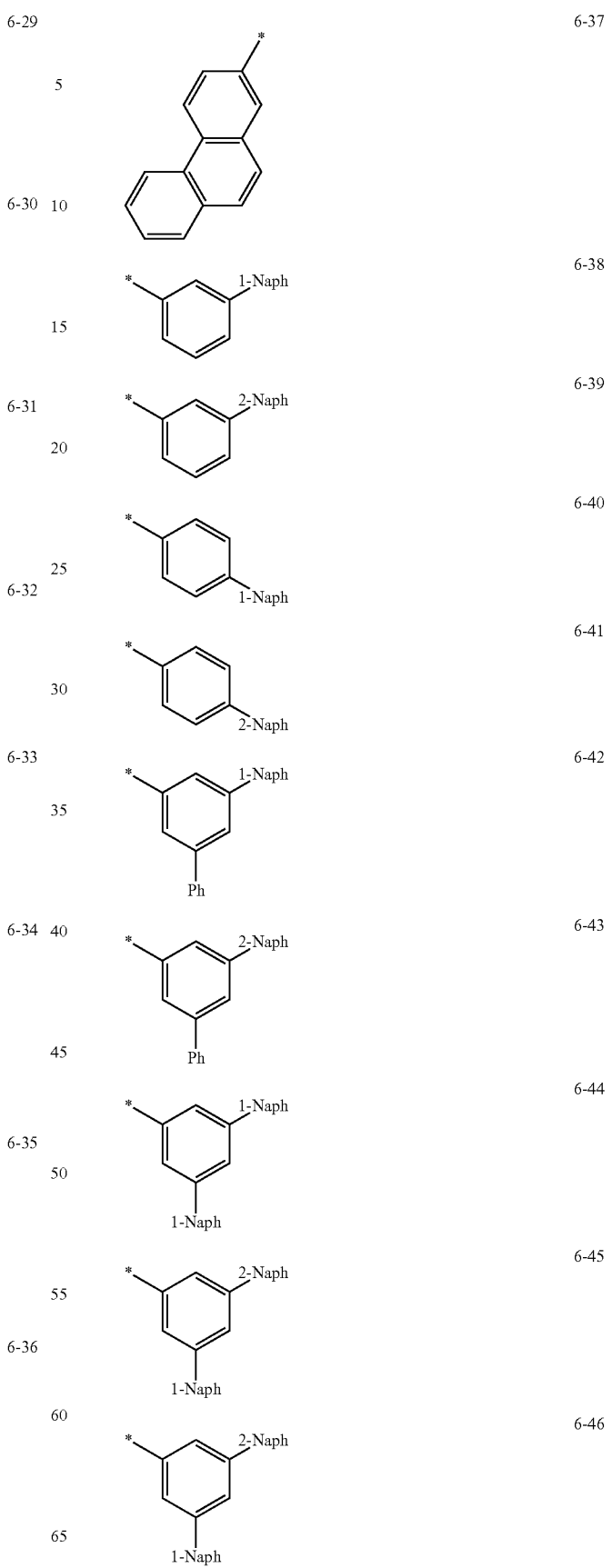

-continued
6-47 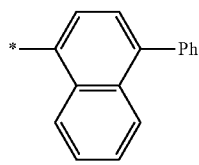
6-48 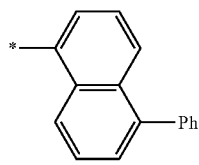
6-49 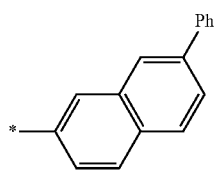
6-50 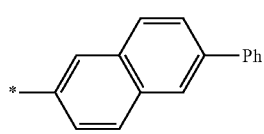
6-51 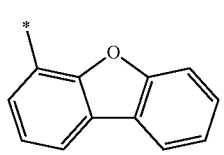
6-52 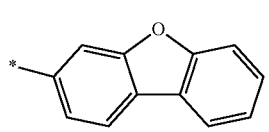
6-53 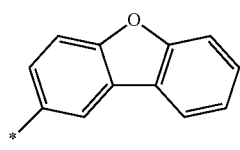
6-54 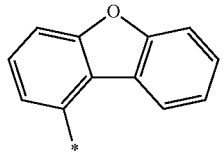
6-55 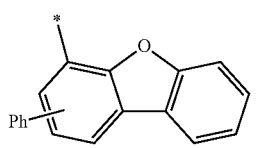
6-56 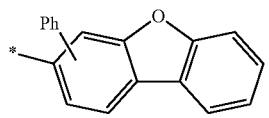
-continued
6-57 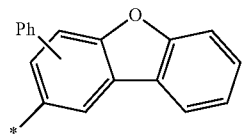
6-58 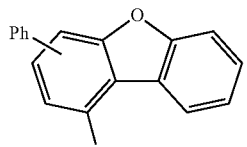
6-59 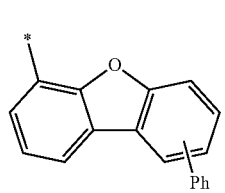
6-60 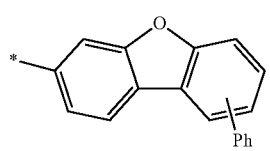
6-61 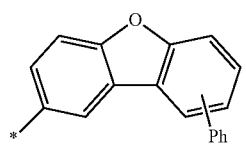
6-62 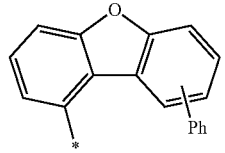
6-63 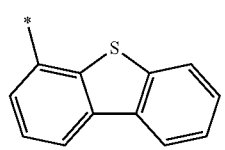
6-64 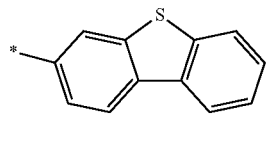
6-65 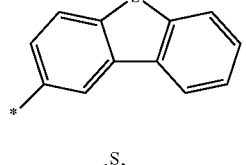
6-66 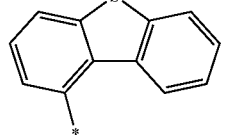

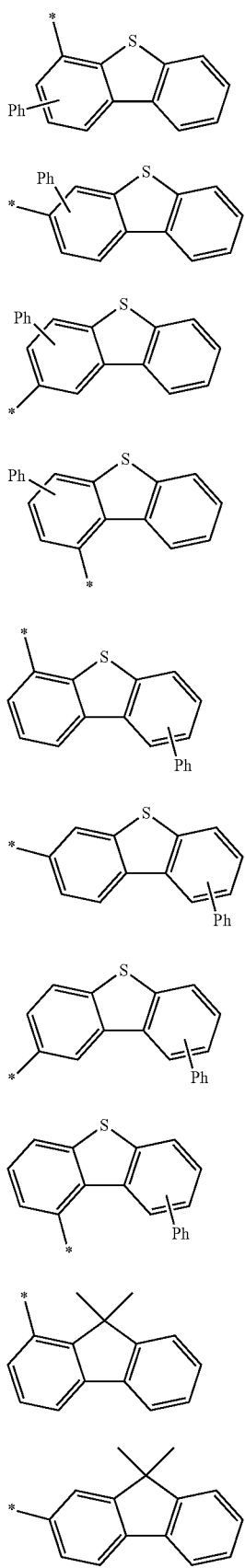
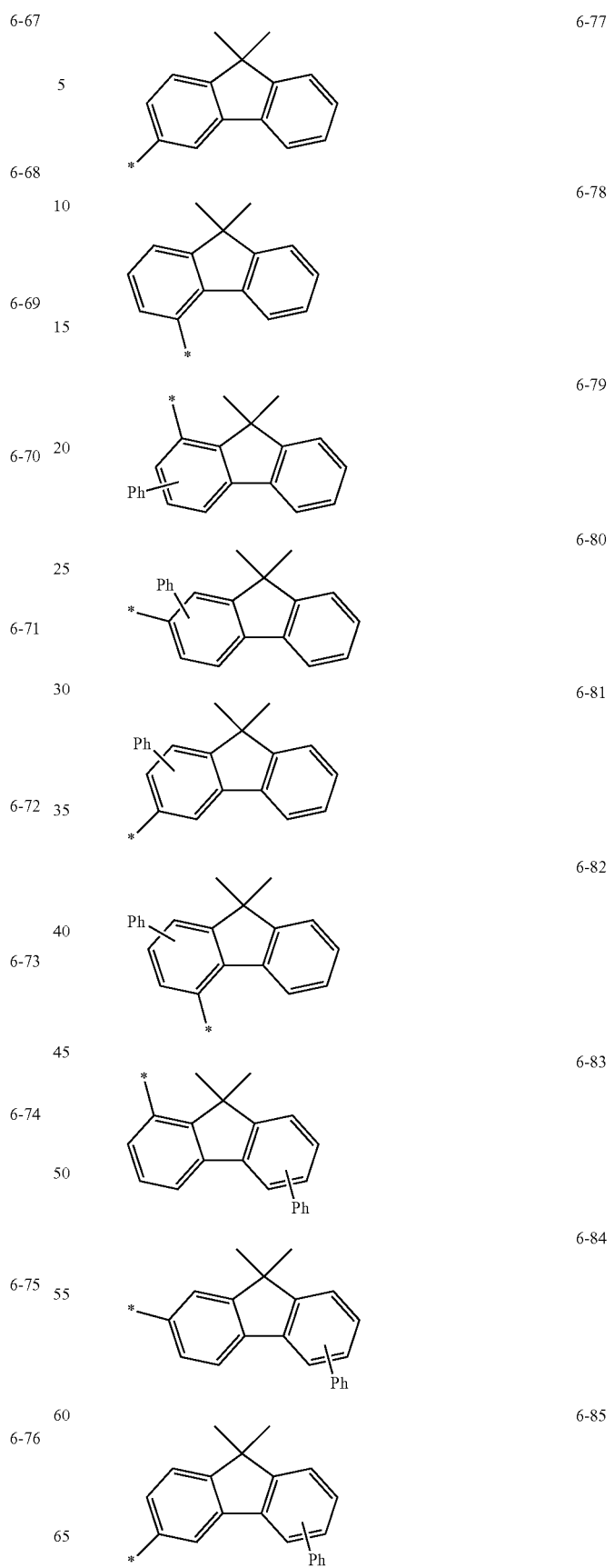

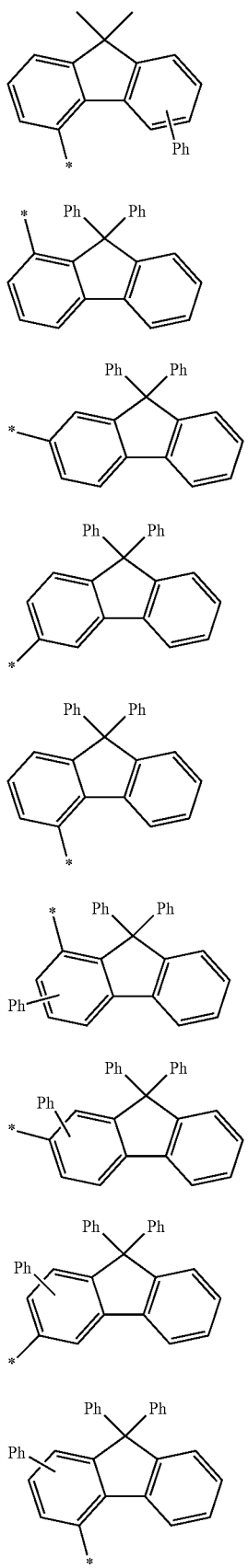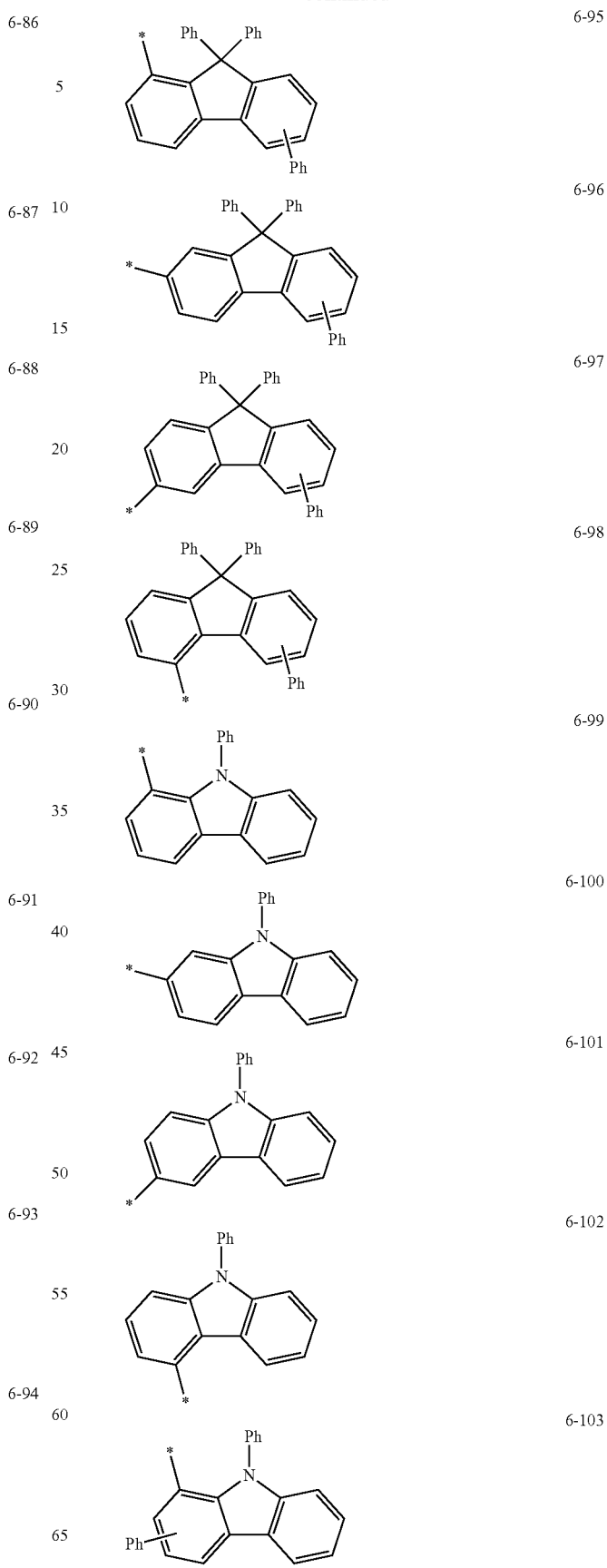

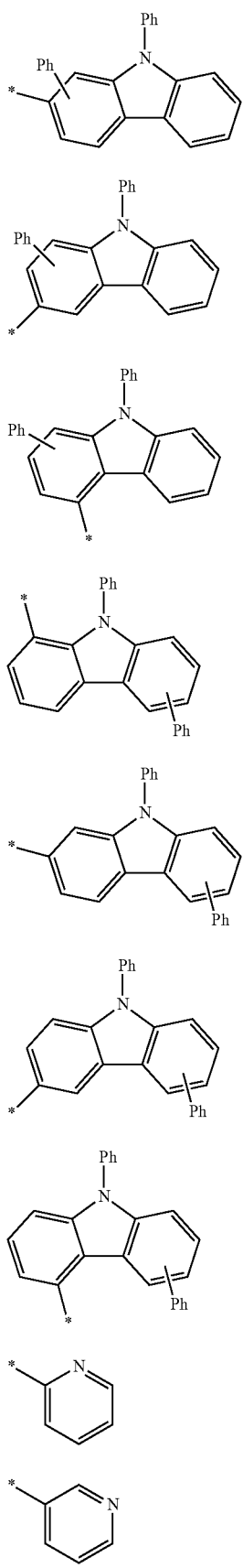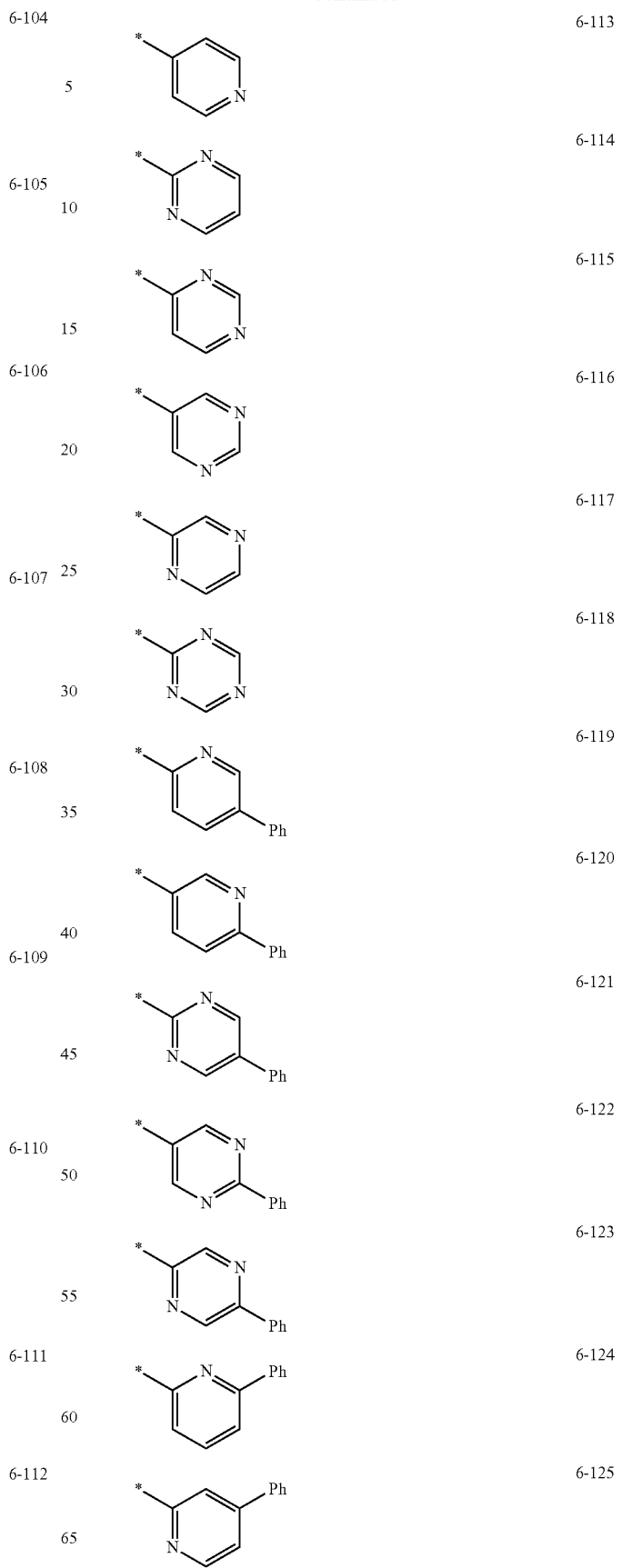

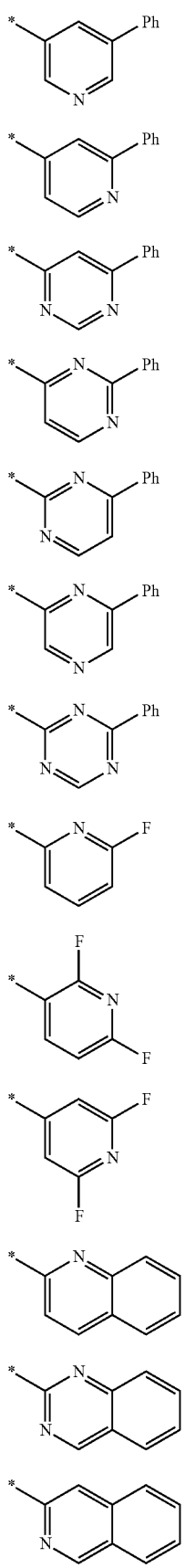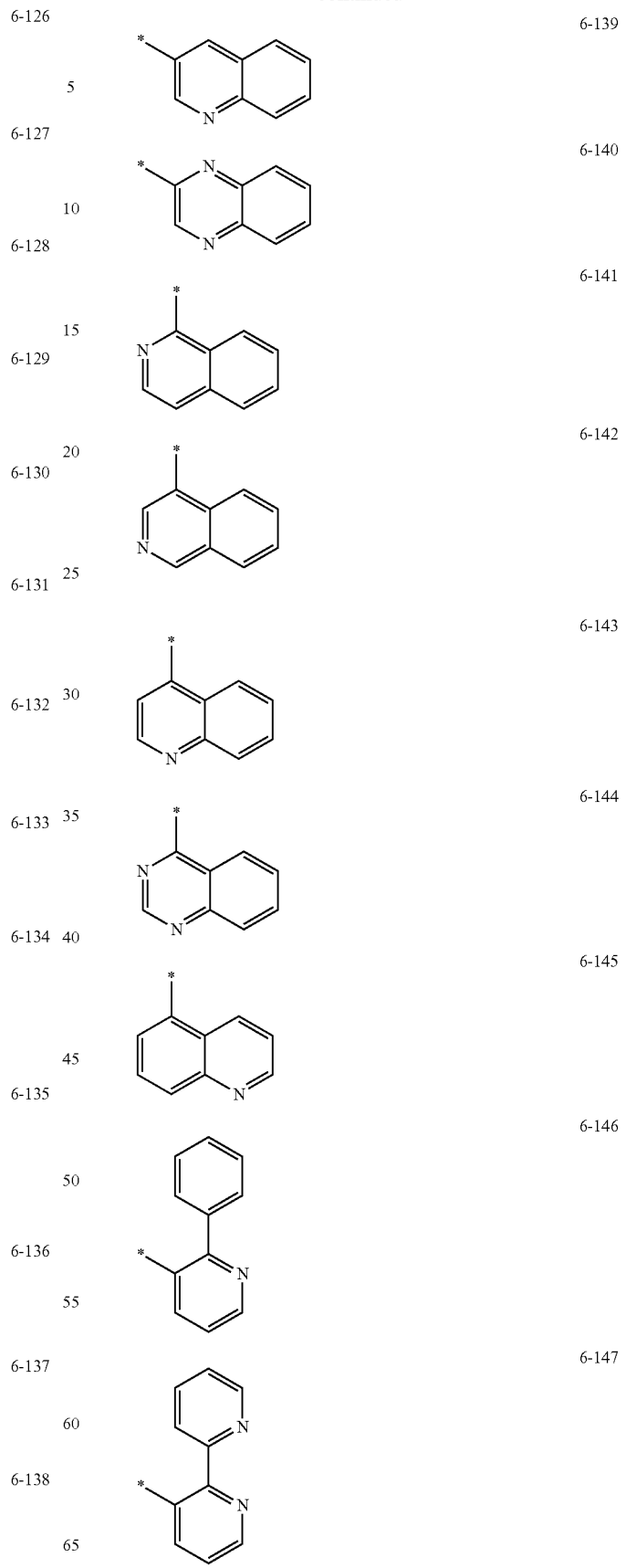

6-148
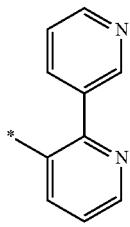
6-149
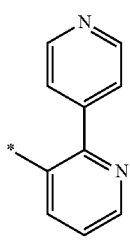
6-150
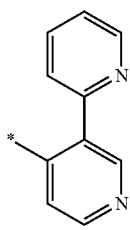
6-151
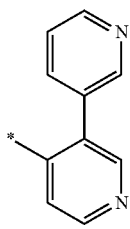
6-152
6-153
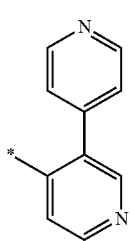
6-154
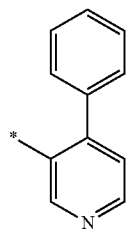
6-155
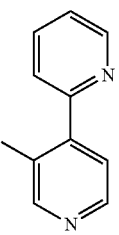
6-156
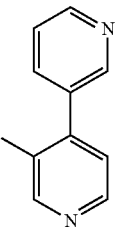
6-157
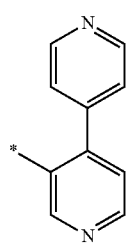
6-158
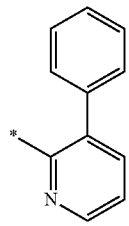
6-159
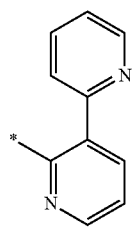

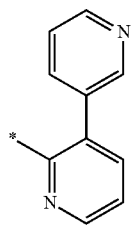# 6-160
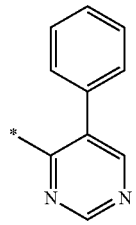# 6-166
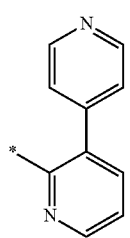# 6-161
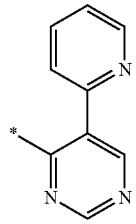# 6-167
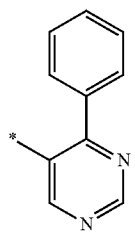# 6-162
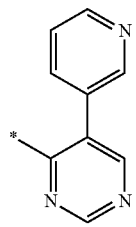# 6-168
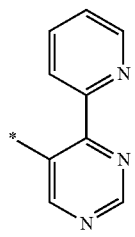# 6-163
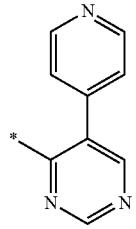# 6-169
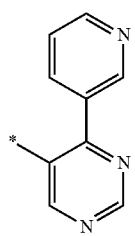# 6-164
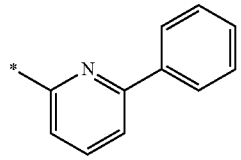# 6-170
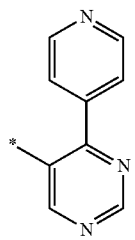# 6-165
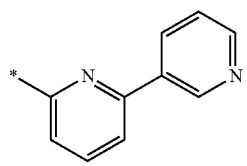# 6-171
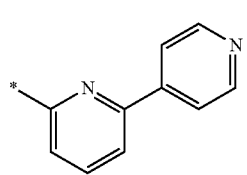# 6-172
6-173

6-173
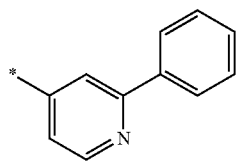
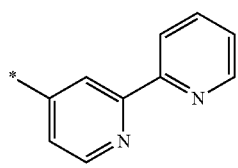
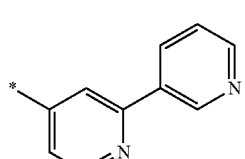
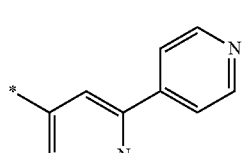
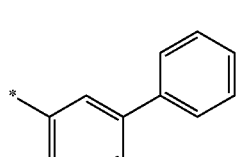
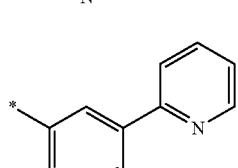
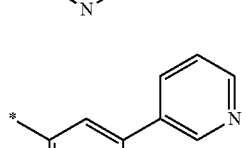
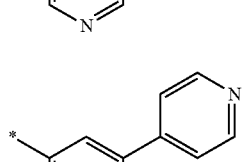
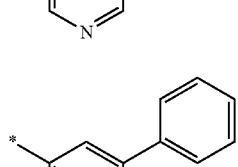
6-174
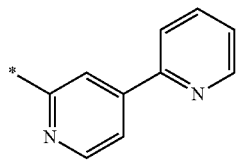
6-175
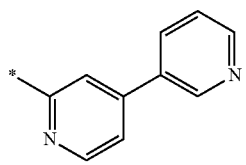
6-176
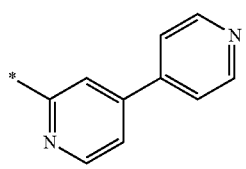
6-177
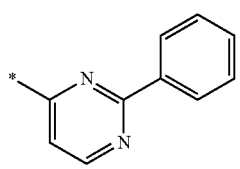
6-178
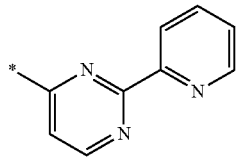
6-179
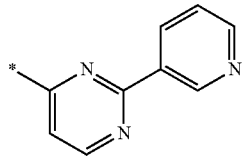
6-180
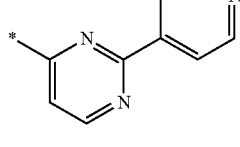
6-181
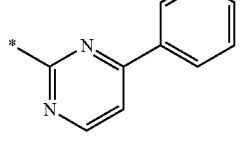
6-182
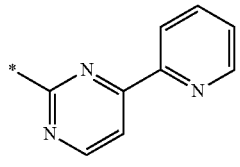
6-183
6-184
6-185
6-186
6-187
6-188
6-189
6-190
6-191

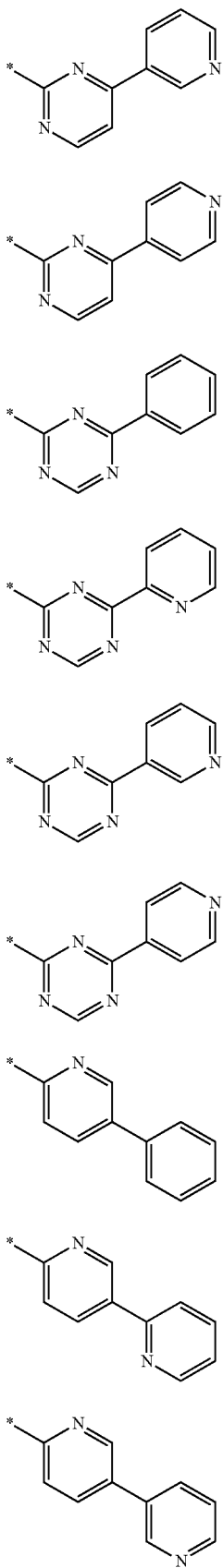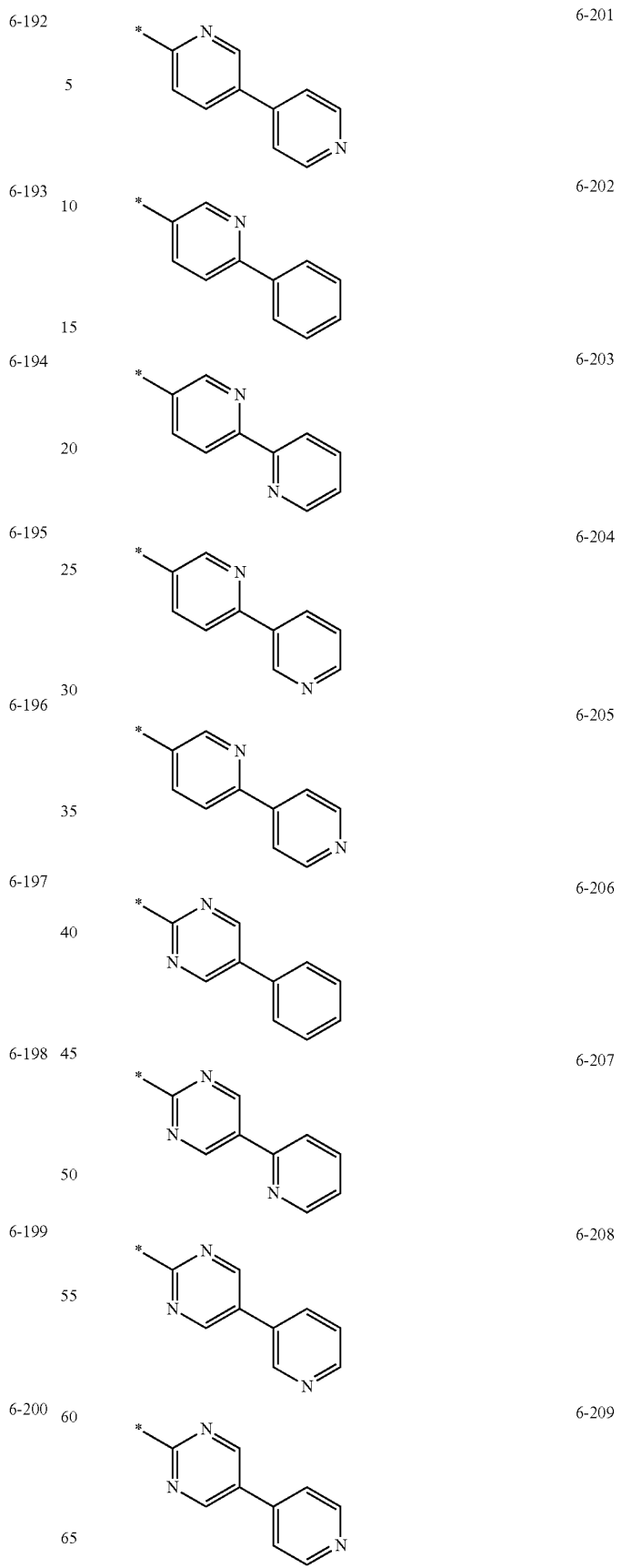

6-210 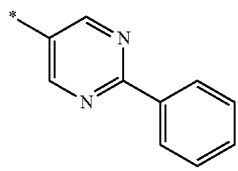
6-211 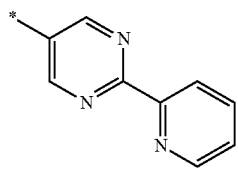
6-212 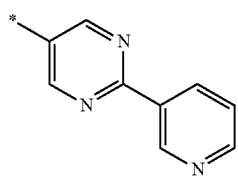
6-213 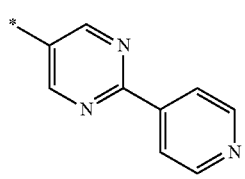
6-214 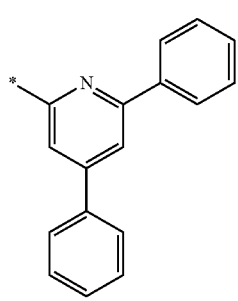
6-215 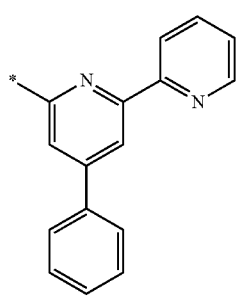
6-216 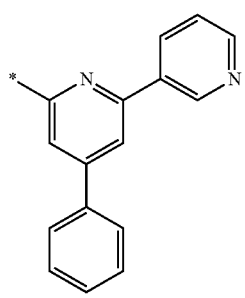
6-217 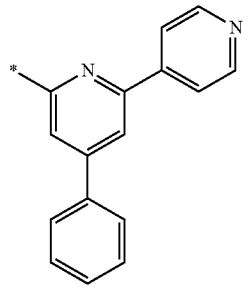
6-218 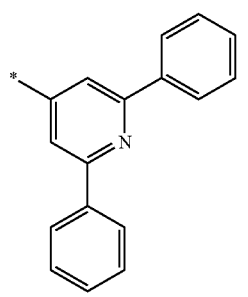
6-219 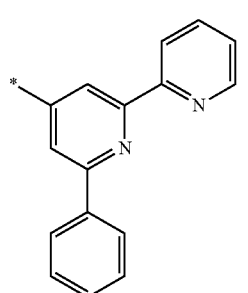
6-220 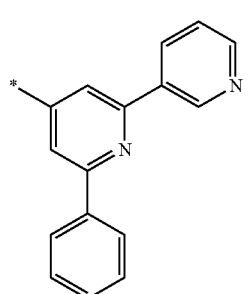
6-221 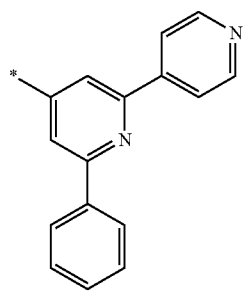

6-222 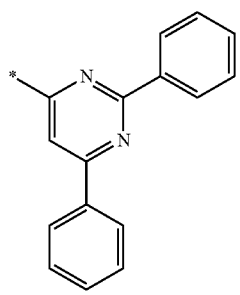
6-223 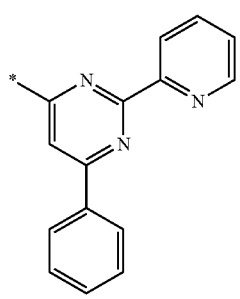
6-224 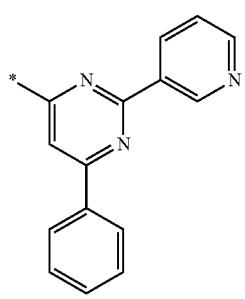
6-225 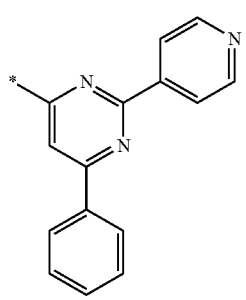
6-226 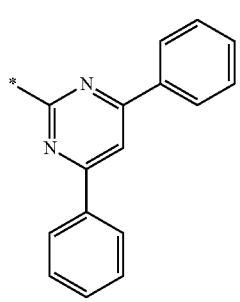
6-227 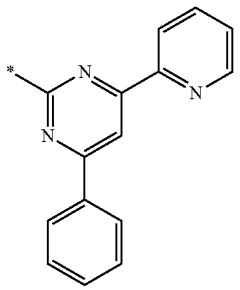
6-228 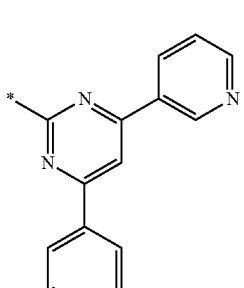
6-229 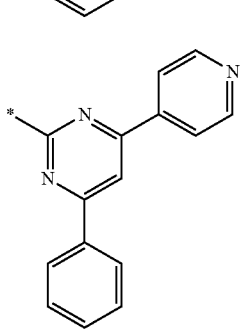
6-230 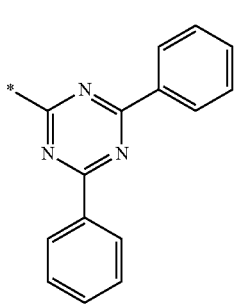
6-231 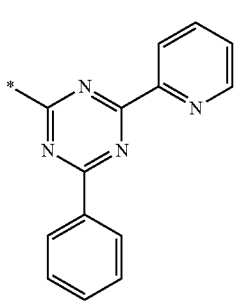

6-232 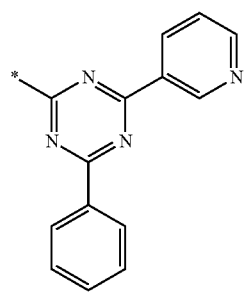
6-233 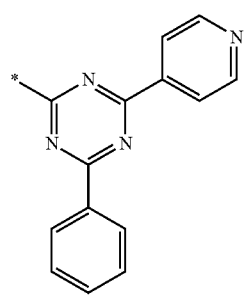
6-234 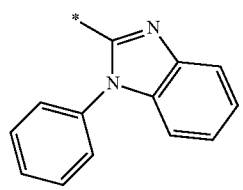
6-235 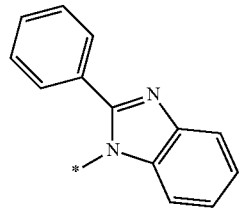
6-236 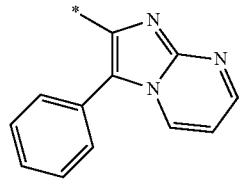
6-237 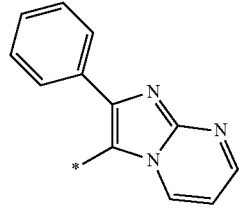
6-238 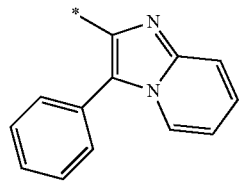
6-239 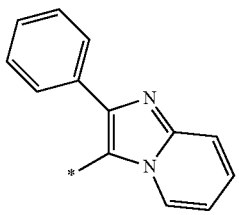
6-240 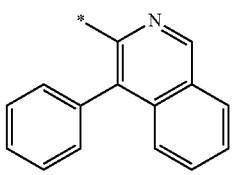
6-241 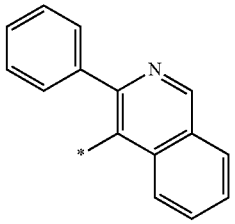
6-242 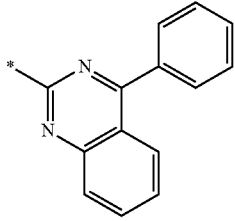
6-243 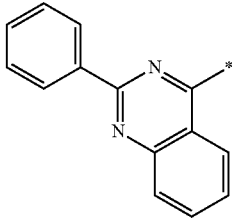
6-244 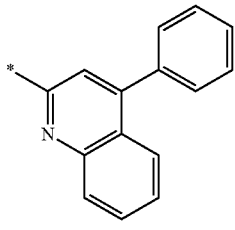
6-245 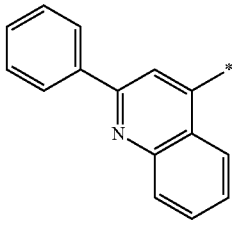

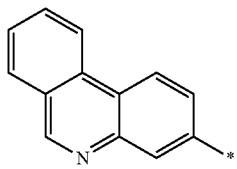
6-246

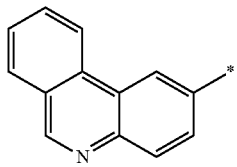
6-247

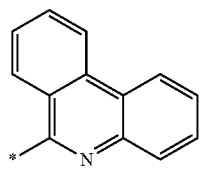
6-248

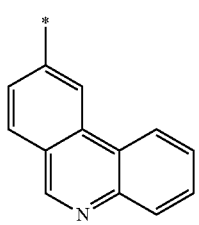
6-249

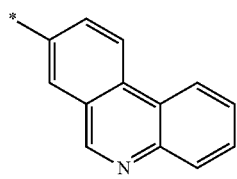
6-250

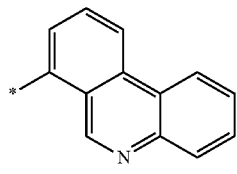
6-251

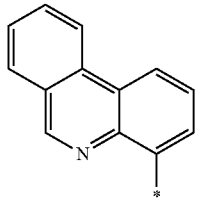
6-252

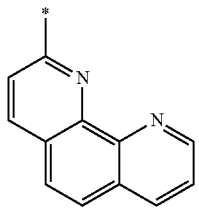
6-253

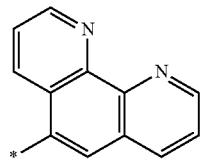
6-254

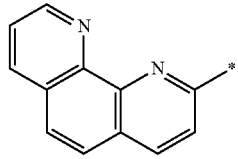
6-255

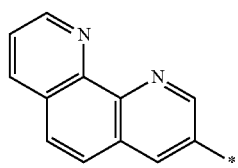
6-256

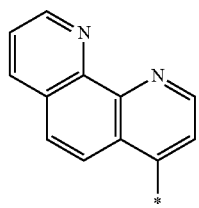
6-257

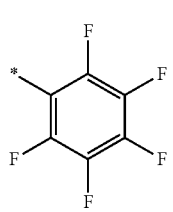
6-258

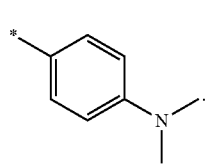
6-259

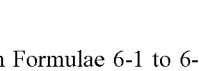

In Formulae 6-1 to 6-259,

"t-Bu" indicates a tert-butyl group,

"Ph" indicates a phenyl group,

"1-Naph" indicates a 1-naphthyl group,

"2-Naph" indicates a 2-naphthyl group, and

* indicates a binding site to a neighboring atom.

In Formula 1-1, b11 to b14 may each independently be selected from 1, 2, 3, 4, 5, 6, 7, and 8.

In one embodiment, in Formula 1, $L_1$ may be a ligand represented by Formula 1-11, but embodiments of the present disclosure are not limited thereto:

Formula 1-11

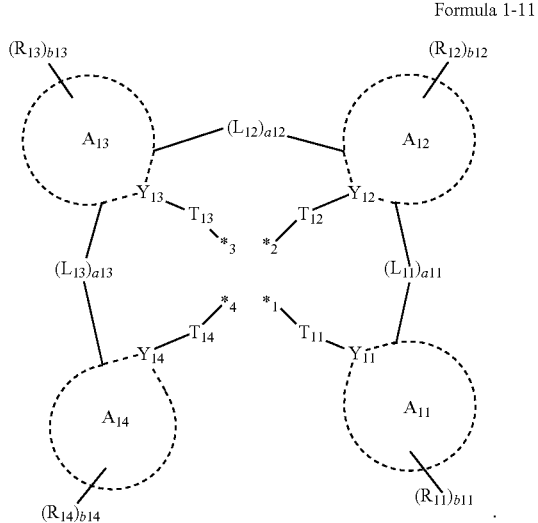

In Formula 1-11,

*1 to *4, $A_{11}$ to $A_{14}$, $Y_{11}$ to $Y_{14}$, $T_{11}$ to $T_{14}$, $L_{11}$ to $L_{13}$, a11 to a13, $R_{11}$ to $R_{14}$, and b11 to b14 may each independently be the same as described with respect to Formula 1-1.

For example, in Formula 1-11, $A_{11}$ may be represented by one selected from Formulae 2-1 to 2-7, but embodiments of the present disclosure are not limited thereto.

In one or more embodiments, in Formula 1, $L_1$ may be a ligand represented by one selected from Formulae 1-21 and 1-22, but embodiments of the present disclosure are not limited thereto:

1-21

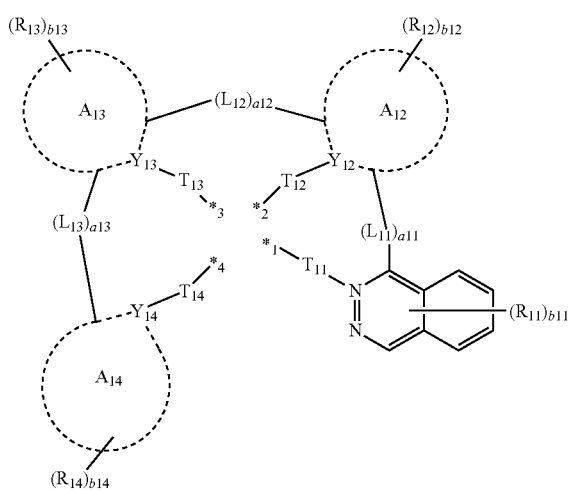

1-22

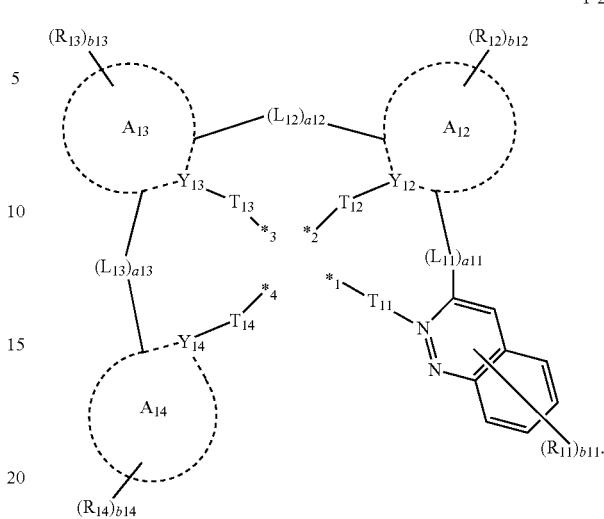

In Formulae 1-21 and 1-22,

*1 to *4, $A_{12}$ to $A_{14}$, $Y_{11}$ to $Y_{14}$, $T_{11}$ to $T_{14}$, $L_{11}$ to $L_{13}$, a11 to a13, $R_{11}$ to $R_{14}$, and b11 to b14 may each independently be the same as described with respect to Formula 1-1.

In one embodiment, in Formula 1, $L_2$ may be a ligand represented by one selected from Formulae 7-1 to 7-11, but embodiments of the present disclosure are not limited thereto:

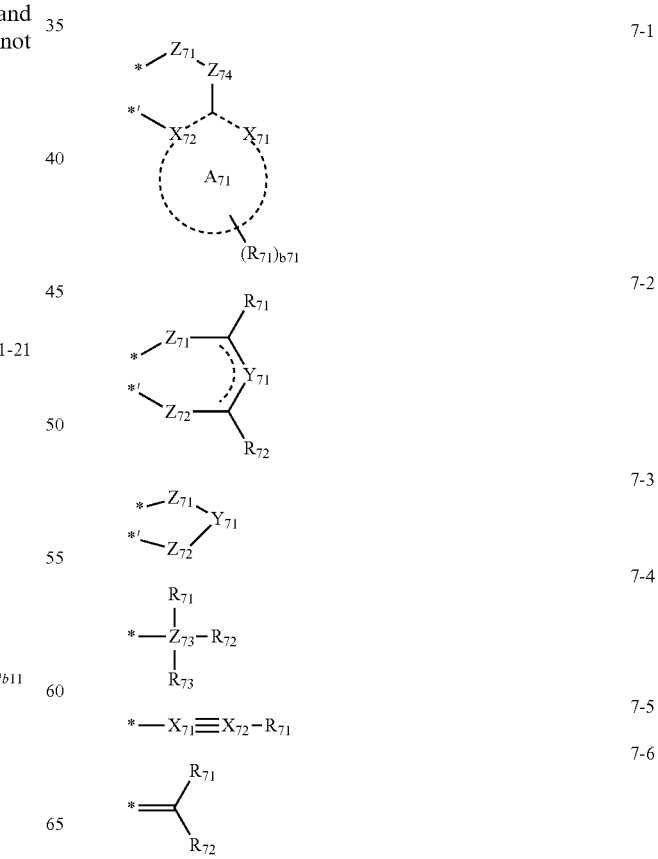

-continued

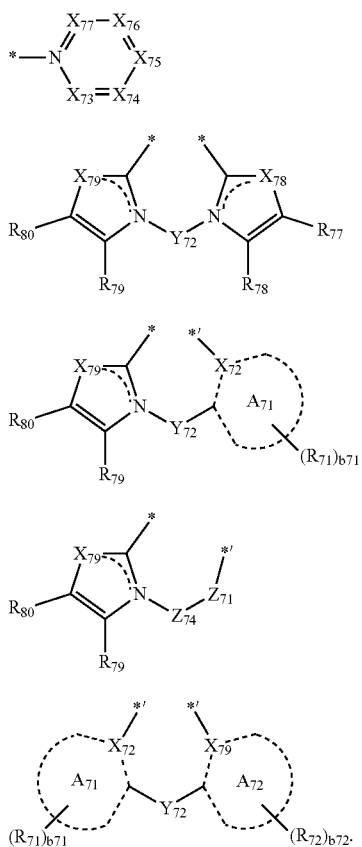

In Formulae 7-1 to 7-11, $A_{71}$ and $A_{72}$ may each independently be selected from a $C_5$-$C_{20}$ carbocyclic group and a $C_1$-$C_{20}$ heterocyclic group, $X_{71}$ and $X_{72}$ may each independently be selected from C and N, $X_{73}$ may be N or $C(Q_{73})$, $X_{24}$ may be N or $C(Q_{74})$, $X_{75}$ may be N or $C(Q_{75})$, $X_{76}$ may be N or $C(Q_{76})$, and $X_{27}$ may be N or $C(Q_{77})$, $X_{78}$ may be O, S, or $N(Q_{78})$, and $X_{29}$ may be O, S, or $N(Q_{79})$, $Y_{71}$ and $Y_{72}$ may each independently be selected from a single bond, a double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group, $Z_{71}$ and $Z_{72}$ may each independently be selected from N, O, $N(R_{75})$, $P(R_{75})(R_{76})$, and $As(R_{75})(R_{76})$, $Z_{73}$ may be selected from P and As, $Z_{74}$ may be selected from CO and $CH_2$, $R_{71}$ to $R_{80}$ and $Q_{73}$ to $Q_{79}$ may each independently be selected from hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{71}$ and $R_{72}$ may optionally be linked (e.g., may be directly chemically bonded to one another) to form a ring, $R_{77}$ and $R_{78}$ may optionally be linked (e.g., may be directly chemically bonded to one another) to form a ring, $R_{78}$ and $R_{79}$ may optionally be linked (e.g., may be directly chemically bonded to one another) to form a ring, and $R_{79}$ and $R_{80}$ may optionally be linked (e.g., may be directly chemically bonded to one another) to form a ring, b71 and b72 may each independently be selected from 1, 2, and 3,

* and *' each indicate a binding site to a neighboring atom, and for example, in Formula 7-1, $A_{71}$ and $A_{72}$ may each independently be selected from a benzene group, a naphthalene group, an imidazole group, a benzimidazole group, a pyridine group, a pyrimidine group, a triazine group, a quinoline group, and an isoquinoline group, but embodiments of the present disclosure are not limited thereto.

For example, in Formula 7-1, $X_{72}$ and $X_{79}$ may each independently be N, but embodiments of the present disclosure are not limited thereto.

For example, in Formula 7-7, $X_{73}$ may be $C(Q_{73})$, $X_{74}$ may be $C(Q_{74})$, $X_{75}$ may be $C(Q_{75})$, $X_{76}$ may be $C(Q_{76})$, and $X_{77}$ may be $C(Q_{77})$, but embodiments of the present disclosure are not limited thereto.

For example, in Formula 7-8, $X_{78}$ may be $N(Q_{78})$, and $X_{79}$ may be $N(Q_{79})$, but embodiments of the present disclosure are not limited thereto.

For example, in Formulae 7-2, 7-3, and 7-8, $Y_{71}$ and $Y_{72}$ may each independently be selected from a substituted or unsubstituted methylene group and a substituted or unsubstituted phenylene group, but embodiments of the present disclosure are not limited thereto.

For example, in Formulae 7-1 and 7-2, $Z_{71}$ and $Z_{72}$ may each independently be O, but embodiments of the present disclosure are not limited thereto.

For example, in Formula 7-4, $Z_{73}$ may be P, but embodiments of the present disclosure are not limited thereto.

For example, in Formulae 7-1 to 7-8, $R_{71}$ to $R_{80}$ and $Q_{73}$ to $Q_{79}$ may each independently be selected from:

hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a phenyl group, a naphthyl group, a pyridinyl group, and a pyrimidinyl group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group; and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, but embodiments of the present disclosure are not limited thereto.

For example, in Formula 1, L$_2$ may be a ligand represented by one selected from Formulae 8-1 to 8-11, but embodiments of the present disclosure are not limited thereto:

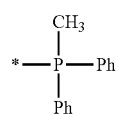

8-1

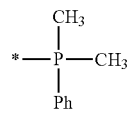

8-2

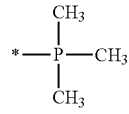

8-3

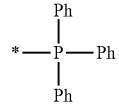

8-4

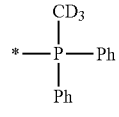

8-5

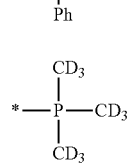

8-6

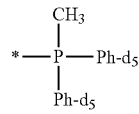

8-7

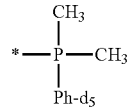

8-8

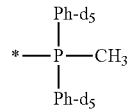

8-9

8-10

8-11
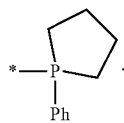
*indicates a binding site to a neighboring atom.
In one embodiment, in Formula 1, n1 may be 1, and n2 may be 0; or n1 may be 1, and n2 may be 2, but embodiments of the present disclosure are not limited thereto.
In more detail, the organometallic compound represented by Formula 1 may be selected from Compounds 1 to 35, but embodiments of the present disclosure are not limited thereto:
1
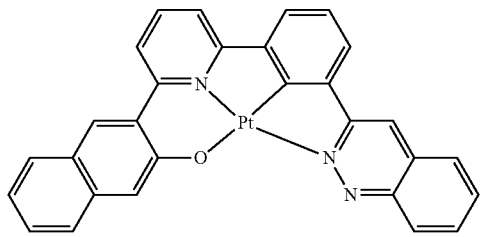
2
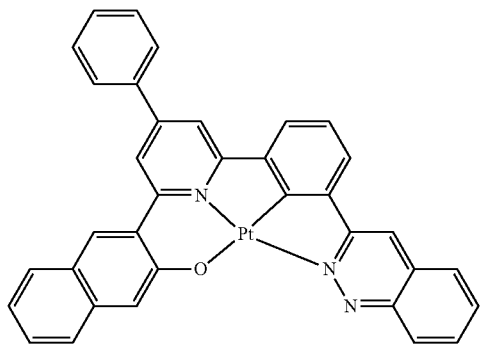
3
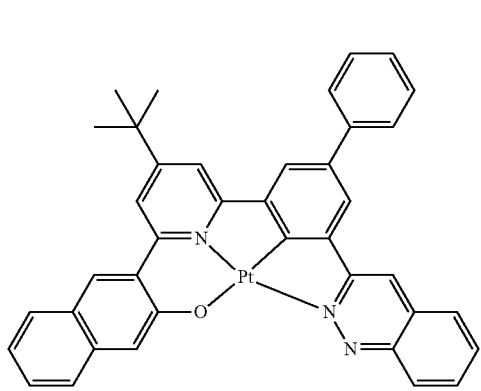
4
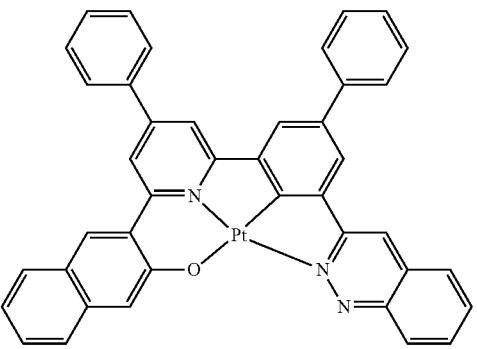
5
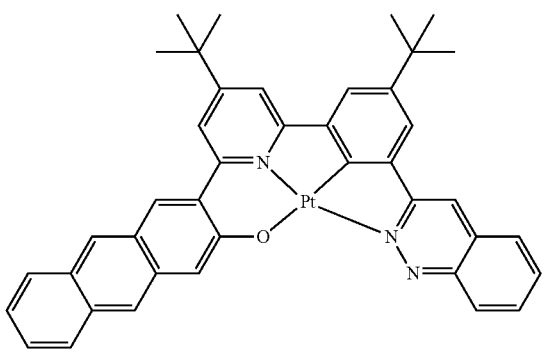
6
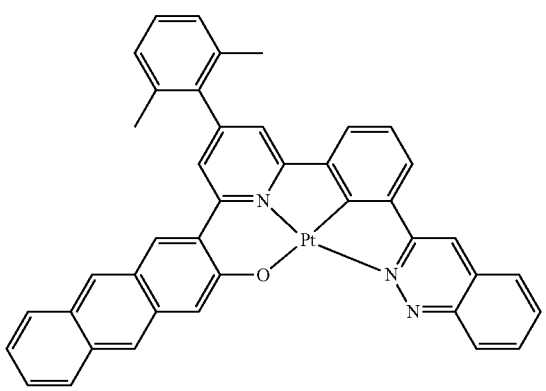
7
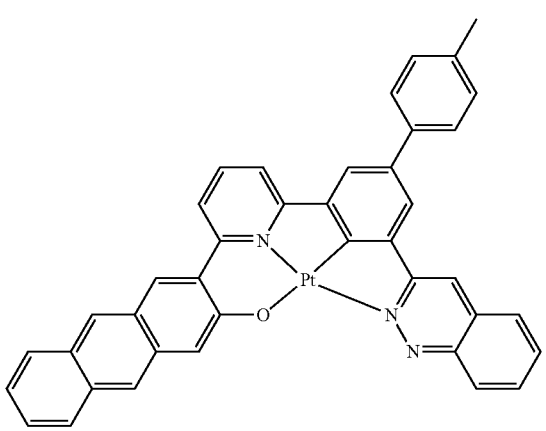

8
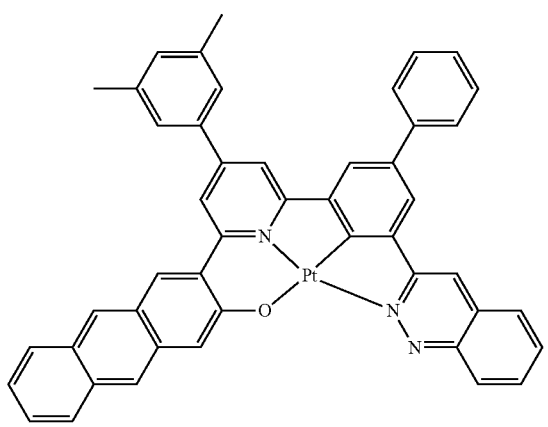
9
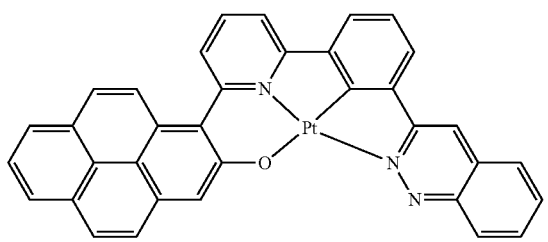
10
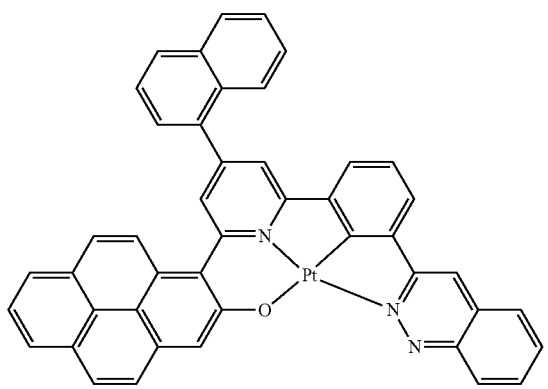
11
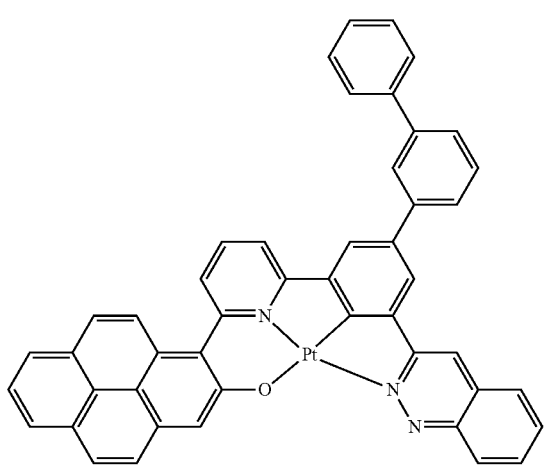
12
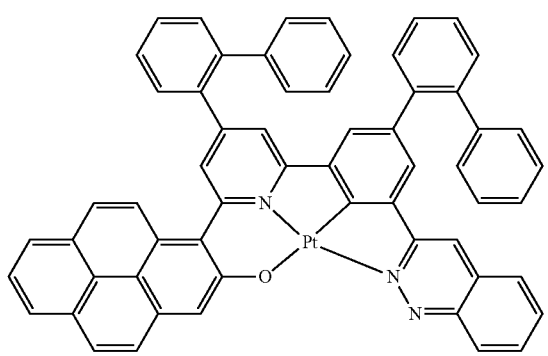
13
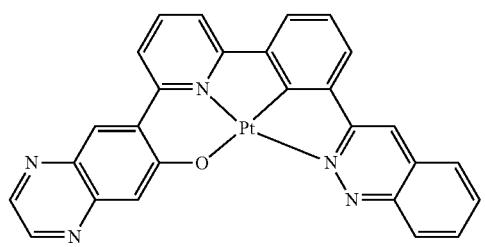
14
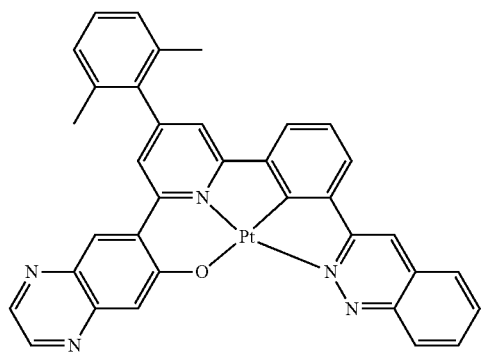
15
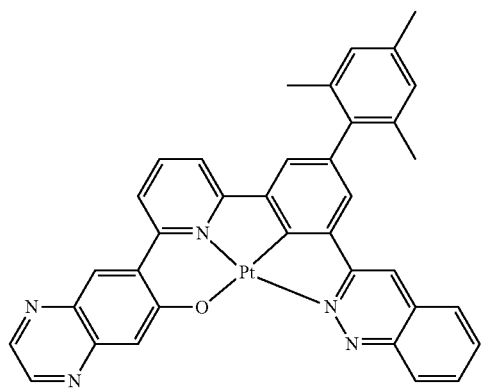

-continued

24
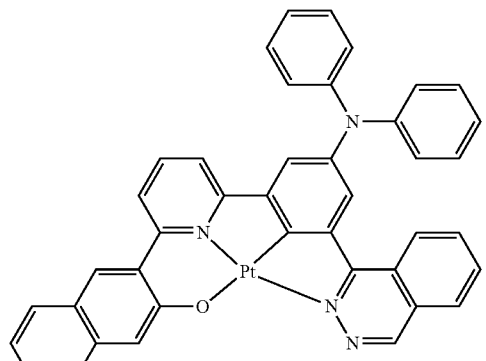
25
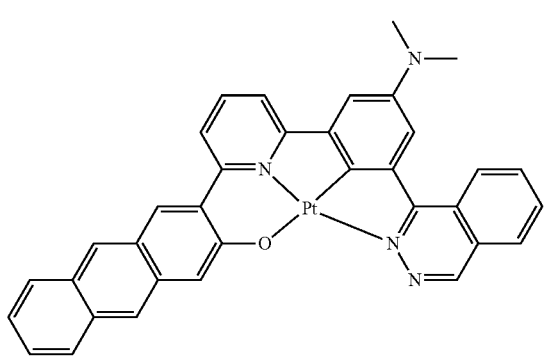
26
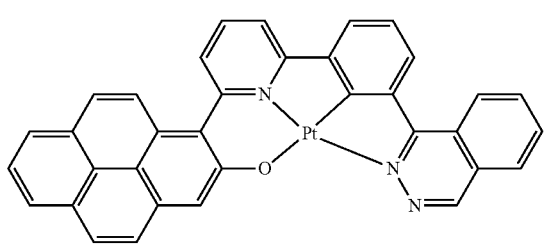
27
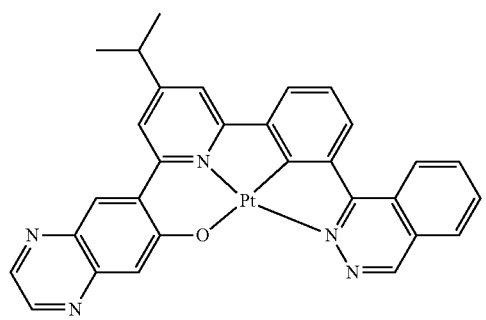
28
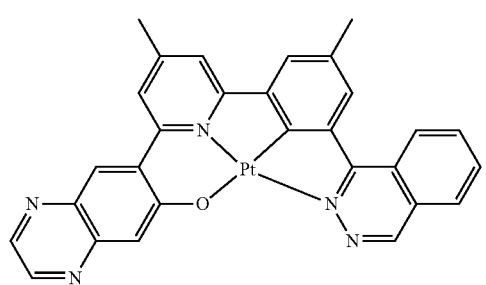
29
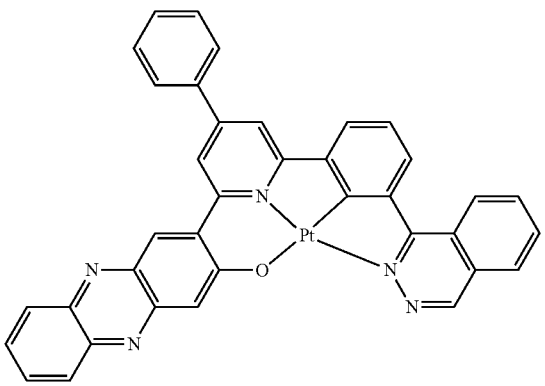
30
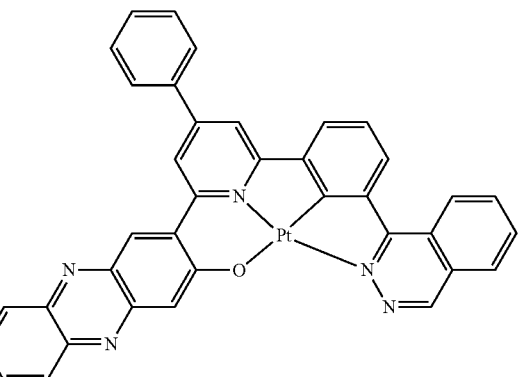
31
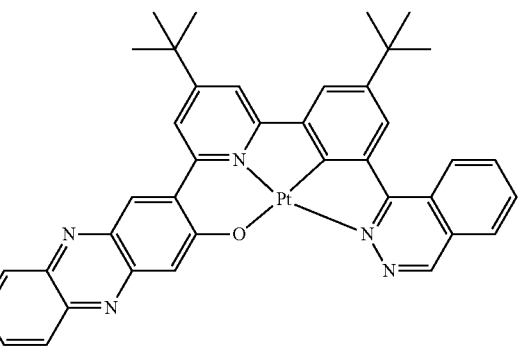
32
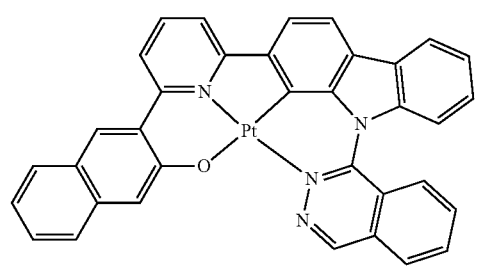

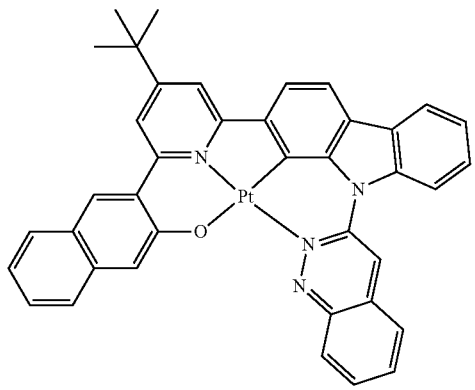

33

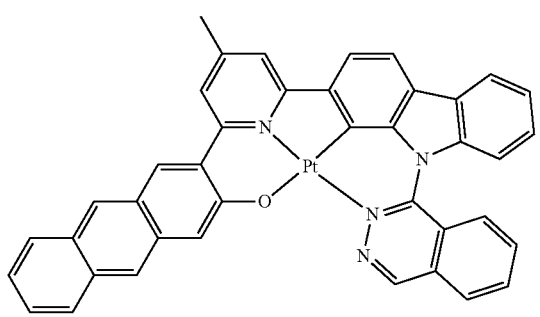

34

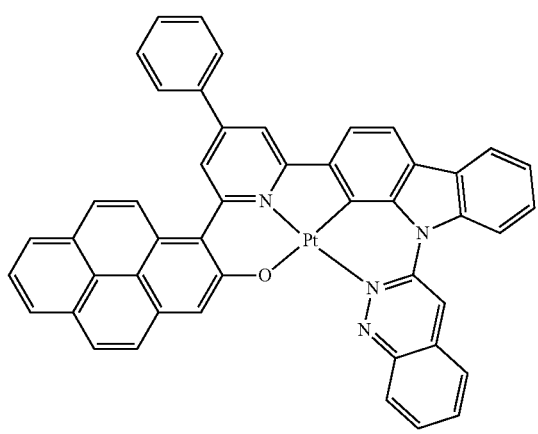

35

The organometallic compound may emit red light or near-infrared (NIR) light having a maximum emission wavelength of, for example, about 720 nm or more, about 720 nm or more and about 2,500 nm or less, about 750 nm or more and about 2,500 nm or less, or about 750 nm or more and about 1,500 nm or less.

In one embodiment, the organometallic compound may emit NIR light having a maximum emission wavelength of about 850 nm or more and about 2,500 nm or less, or about 850 nm or more and 1,500 nm or less. The organometallic compound that emits NIR light having such a maximum emission wavelength clearly distinguishes from the organometallic compound that emits red visible light having a maximum emission wavelength of, for example, about 650 nm or more and about 720 nm or less.

An organic light-emitting device including the organometallic compound represented by Formula 1 may emit red light or near-infrared light having a maximum emission wavelength of about 720 nm or more, about 720 nm to about 2,500 nm, about 750 nm to about 2,500 nm, or about 750 nm to about 1,500 nm and may also have a low driving voltage and high external quantum efficiency.

A synthesis method for the organometallic compound represented by Formula 1 should be readily apparent to those of ordinary skill in the art upon reviewing the following examples.

At least one of the organometallic compound of Formula 1 may be used between a pair of electrodes of an organic light-emitting device. Accordingly, provided is an organic light-emitting device including: a first electrode; a second electrode facing the first electrode; and an organic layer between the first electrode and the second electrode and including an emission layer, wherein the organic layer includes at least one organometallic cyclic compound represented by Formula 1.

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1."

For example, the organic layer may include, as the organometallic compound, only Compound 1. In this regard, Compound 1 may exist in an emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 may all exist in an emission layer), or different layers (for example, Compound 1 may exist in an emission layer and Compound 2 may exist in an electron transport region).

In one embodiment,
the first electrode of the organic light-emitting device may be an anode,
the second electrode of the organic light-emitting device may be a cathode,
the organic layer may further include a hole transport region between the first electrode and the emission layer and/or an electron transport region between the emission layer and the second electrode,
the hole transport region may include a hole injection layer, a hole transport layer, an emission auxiliary layer, an electron blocking layer, or any combination thereof, and
the electron transport region may include a hole blocking layer, an electron transport layer, an electron injection layer, or any combination thereof.

The term "organic layer," as used herein, refers to a single layer and/or a plurality of layers between the first electrode and the second electrode of the organic light-emitting device. A material included in the "organic layer" is not limited to an organic material. For example, the organic layer may include an inorganic material.

In one embodiment, the emission layer may include the organometallic compound represented by Formula 1. The emission layer may further include, in addition to the organometallic compound, a host, wherein an amount of the organometallic compound may be smaller than that of the host in the mission layer.

In one or more embodiments, the hole transport region may include an electron blocking layer, and the electron blocking layer may include the organometallic compound; and/or the electron transport region may include a hole blocking layer, and the hole blocking layer may include the organometallic compound.

In one or more embodiments, at least one of the hole transport region and the emission layer may include an arylamine-containing compound, an acridine-containing compound, and a carbazole-containing compound; and/or at least one of the emission layer and the electron transport region may include a silicon-containing compound, a phosphine oxide-containing compound, a sulfur oxide-containing compound, an indium oxide-containing compound, a triazine-containing compound, a pyrimidine-containing compound, a pyridine-containing compound, a dibenzofuran-containing compound, and a dibenzothiophene-containing compound.

Description of FIG. 1

FIG. 1 is a schematic view of an organic light-emitting device 10 according to an embodiment. The organic light-emitting device 10 includes a first electrode 110, an organic layer 150, and a second electrode 190.

Hereinafter, the structure of the organic light-emitting device 10 according to an embodiment and a method of manufacturing the organic light-emitting device 10 will be described in connection with FIG. 1.

First Electrode 110

In FIG. 1, a substrate may additionally be under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be formed by depositing or sputtering a material for forming the first electrode 110 on the substrate. When the first electrode 110 is an anode, the material for a first electrode may be selected from materials having a high work function to facilitate hole injection.

The first electrode 110 may be a reflective electrode, a semi-transmissive electrode, or a transmissive electrode. When the first electrode 110 is a transmissive electrode, a material for forming a first electrode may be selected from indium tin oxide (ITO), indium zinc oxide (IZO), tin oxide ($SnO_2$), zinc oxide (ZnO), and any combinations thereof, but embodiments of the present disclosure are not limited thereto. In one or more embodiments, when the first electrode 110 is a semi-transmissive electrode or a reflective electrode, a material for forming a first electrode may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but embodiments of the present disclosure are not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Organic Layer 150

The organic layer 150 is on the first electrode 110. The organic layer 150 may include an emission layer.

The organic layer 150 may further include a hole transport region between the first electrode 110 and the emission layer, and an electron transport region between the emission layer and the second electrode 190.

Hole Transport Region in Organic Layer 150

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/ electron blocking layer structure, wherein for each structure, constituting layers are sequentially stacked from the first electrode 110 in this stated order, but the structure of the hole transport region is not limited thereto.

The hole transport region may include at least one selected from m-MTDATA, TDATA, 2-TNATA, NPB (NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly (4-styrenesulfonate) (PEDOT/PSS), polyaniline/camphor sulfonic acid (PANT/CSA), polyaniline/poly(4-styrenesulfonate) (PANT/PSS), a group represented by Formula 201, and a group represented by Formula 202:

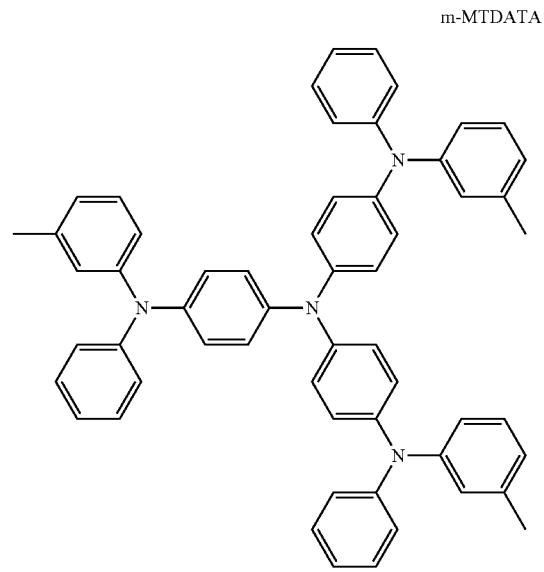

m-MTDATA

TDATA
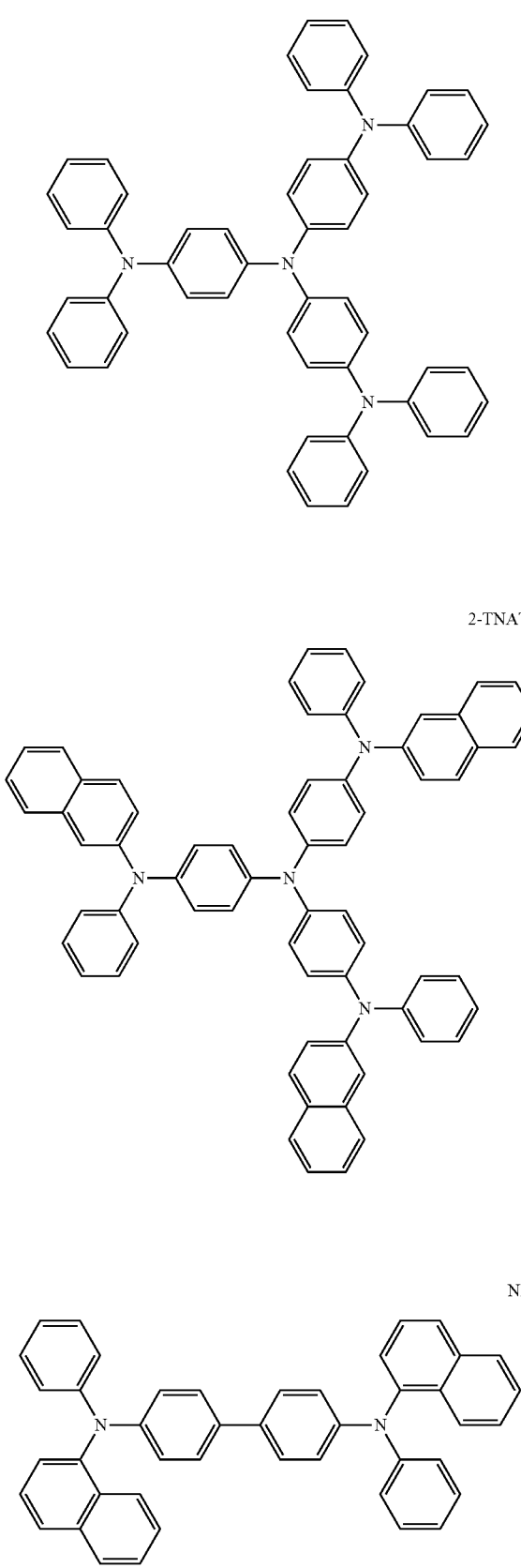
2-TNATA
NPB
β-NPB
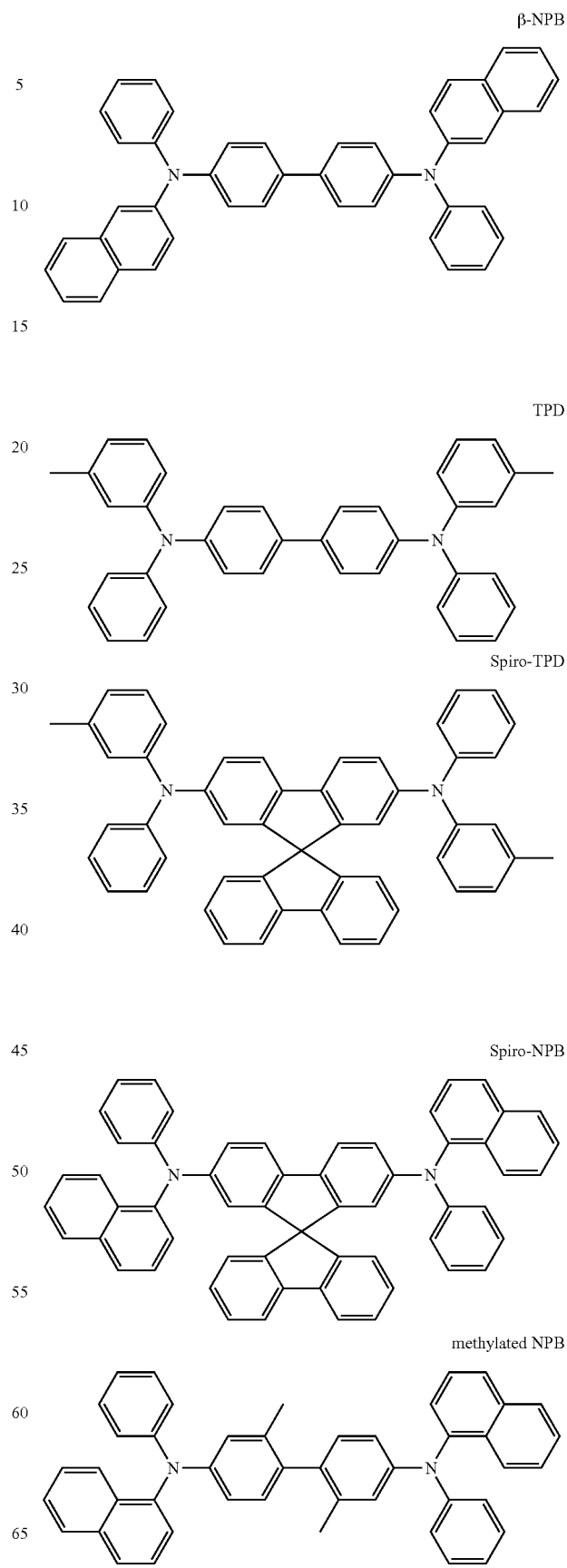
TPD
Spiro-TPD
Spiro-NPB
methylated NPB -continued

TAPC

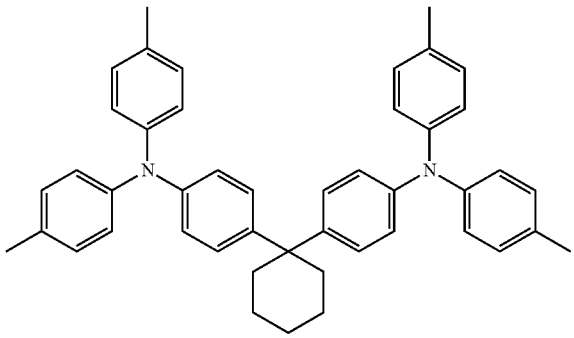

HMTPD

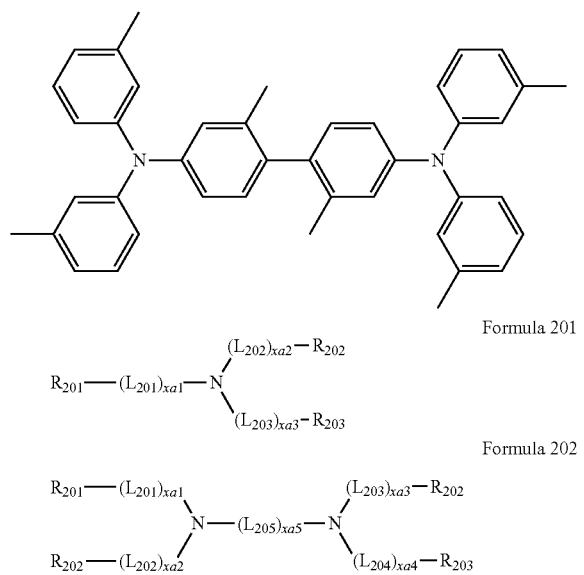

Formula 201

$R_{201}—(L_{201})_{xa1}—N\begin{smallmatrix}(L_{202})_{xa2}—R_{202}\\(L_{203})_{xa3}—R_{203}\end{smallmatrix}$ Formula 202

$R_{201}—(L_{201})_{xa1}\diagdown\qquad (L_{203})_{xa3}—R_{202}$
$\qquad\qquad N—(L_{205})_{xa5}—N$
$R_{202}—(L_{202})_{xa2}\diagup\qquad (L_{204})_{xa4}—R_{203}$ In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer of 0 to 3, xa5 may be an integer of 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one embodiment, in Formula 202, $R_{201}$ and $R_{202}$ may optionally be linked (e.g., may be directly chemically bonded to one another) via a single bond, a dimethyl-methylene group, or a diphenyl-methylene group, and $R_{203}$ and $R_{204}$ may optionally be linked (e.g., may be directly chemically bonded to one another) via a single bond, a dimethyl-methylene group, or a diphenyl-methylene group.

In one embodiment, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ are the same as described herein above.

In one or more embodiments, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be linked (e.g., may be directly chemically bonded to one another) via a single bond, and/or ii) $R_{203}$ and $R_{204}$ may be linked (e.g., may be directly chemically bonded to one another) via a single bond.

In one or more embodiments, in Formula 202, at least one selected from $R_{201}$ to $R_{204}$ may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201A:

Formula 201A

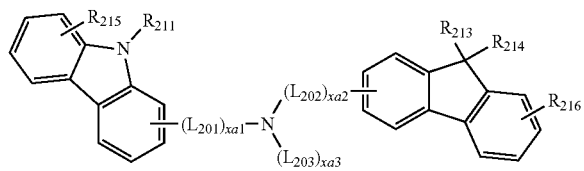

In one embodiment, the compound represented by Formula 201 may be represented by Formula 201A(1) below, but embodiments of the present disclosure are not limited thereto:

Formula 201A(1)

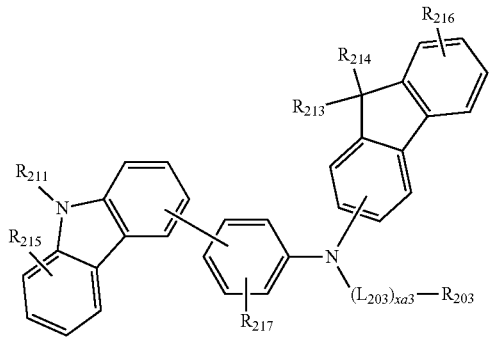

In one embodiment, the compound represented by Formula 201 may be represented by Formula 201A-1 below, but embodiments of the present disclosure are not limited thereto:

Formula 201A-1

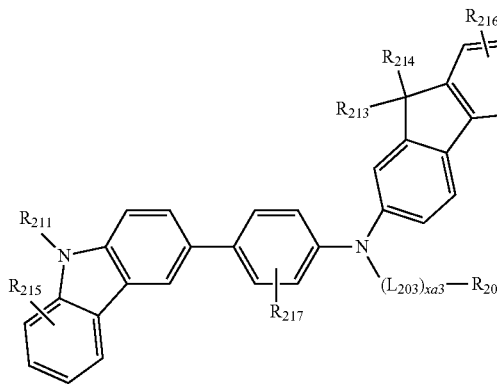

In one embodiment, the compound represented by Formula 202 may be represented by Formula 202A:

Formula 202A

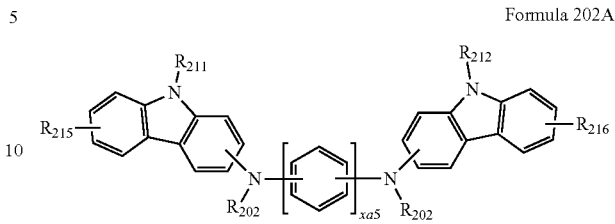

In one or more embodiments, the compound represented by Formula 202 may be represented by Formula 202A-1:

Formula 202A-1

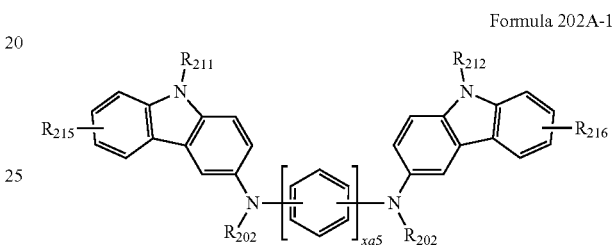

In Formulae 201A, 201A(1), 201A-1, 202A, and 202A-1, $L_{201}$ to $L_{203}$, xa1 to xa3, xa5, and $R_{202}$ to $R_{204}$ are the same as described herein above.

$R_{211}$ and $R_{212}$ are each independently defined the same as $R_{203}$, $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but embodiments of the present disclosure are not limited thereto:

85 HT1
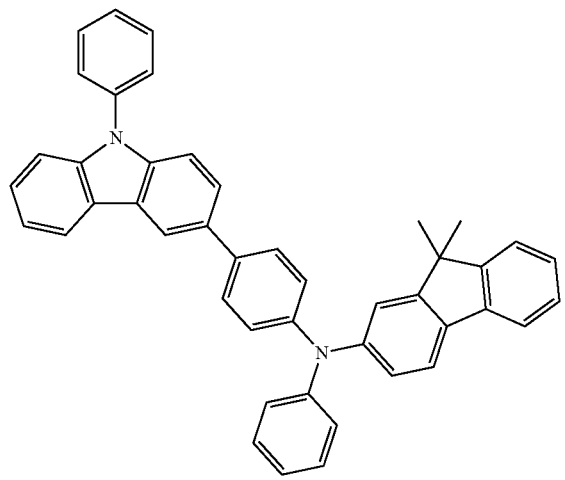
86 HT2
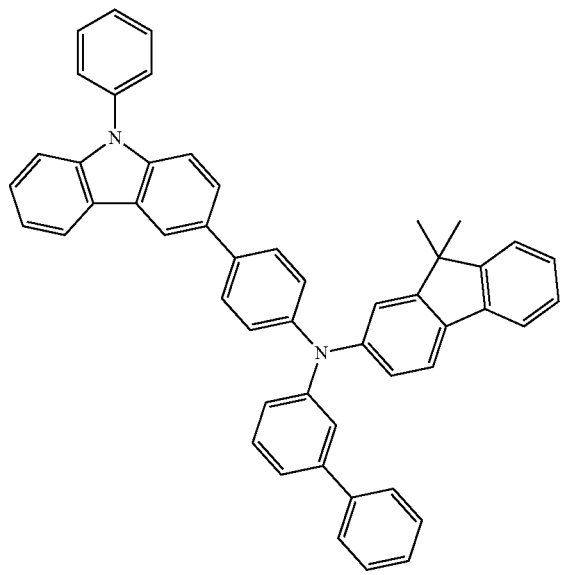
HT3
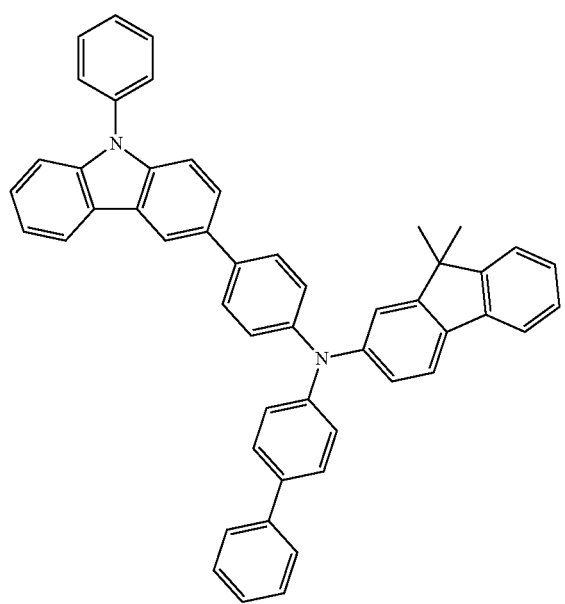
HT4
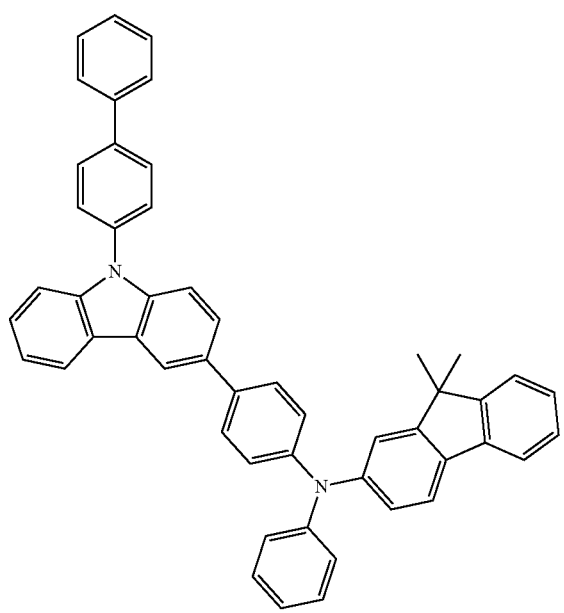

HT5
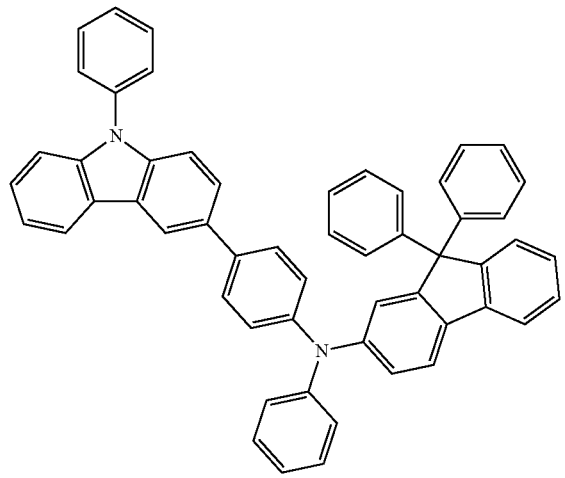
HT6
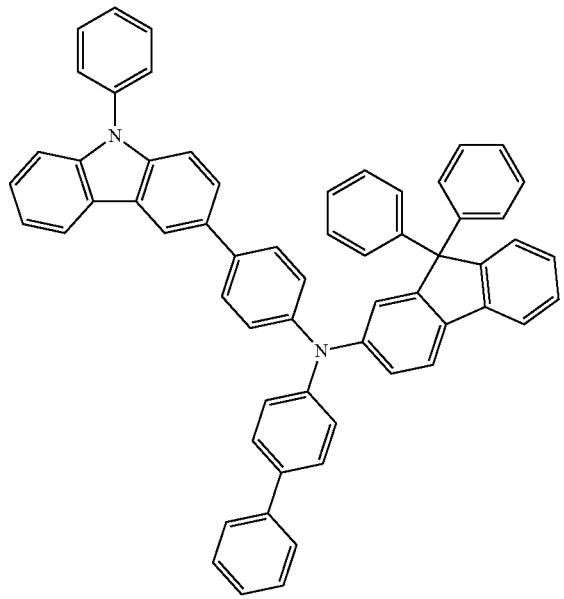
HT7
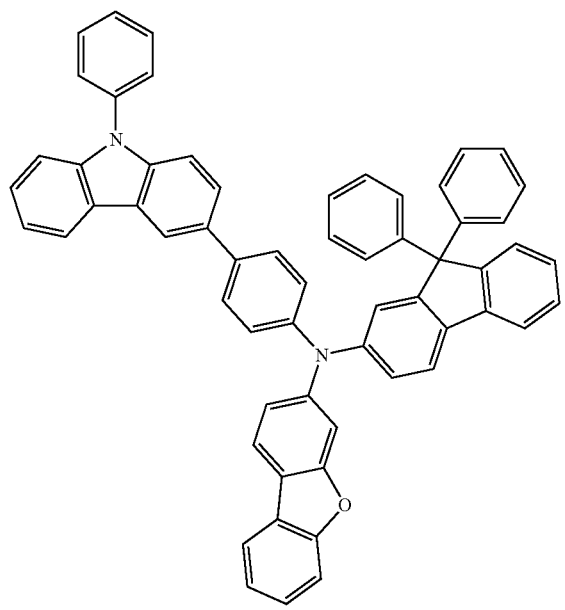
HT8
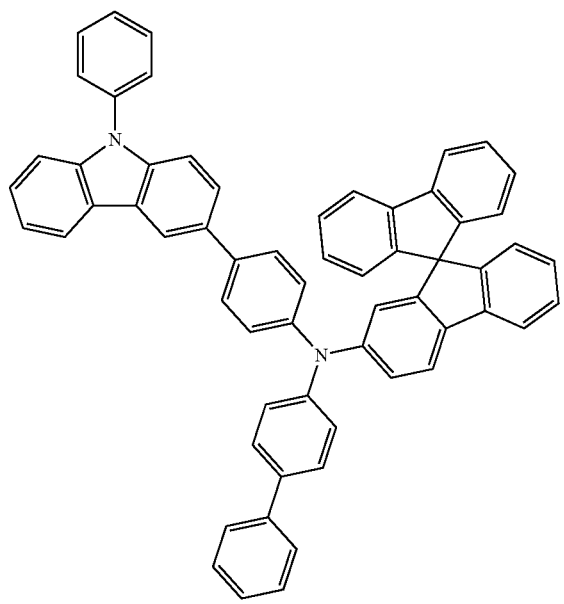

-continued
HT9
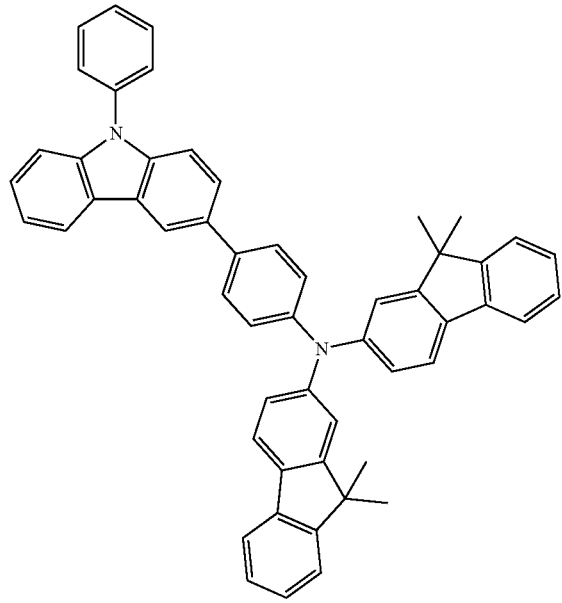
HT10
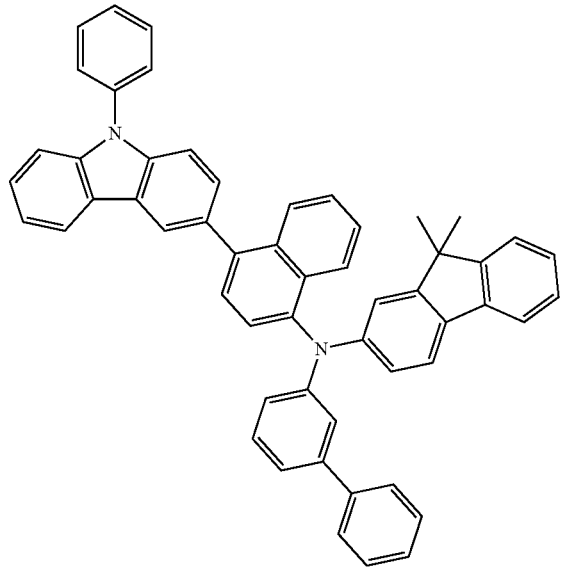
HT11
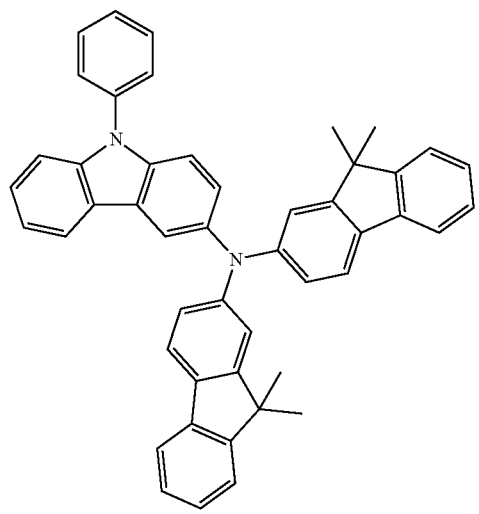
HT12
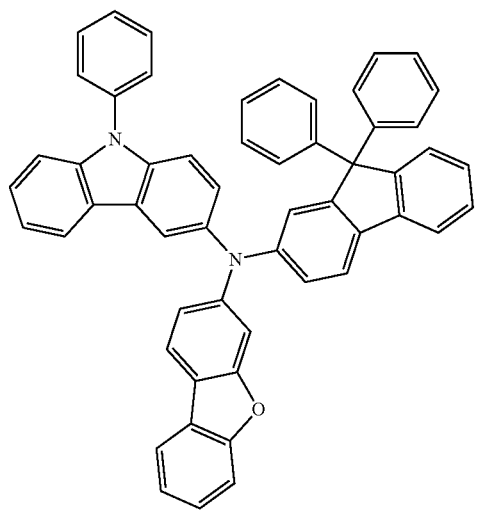

-continued
HT13
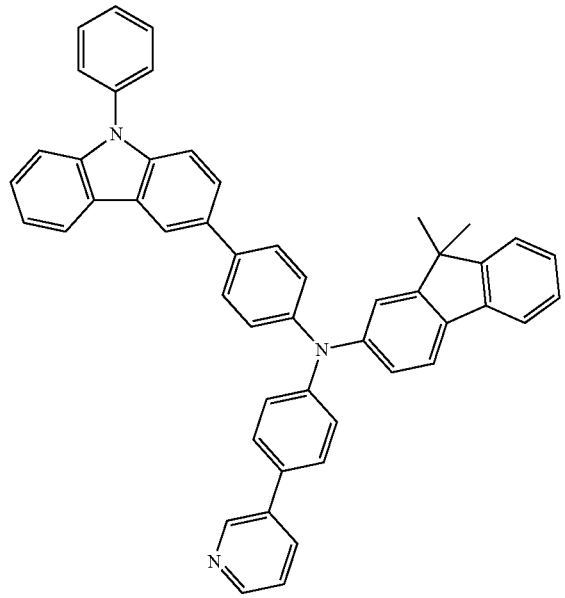
HT14
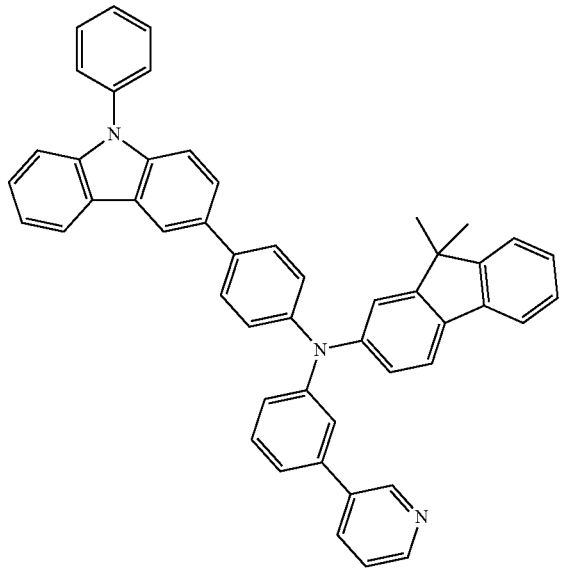
HT15
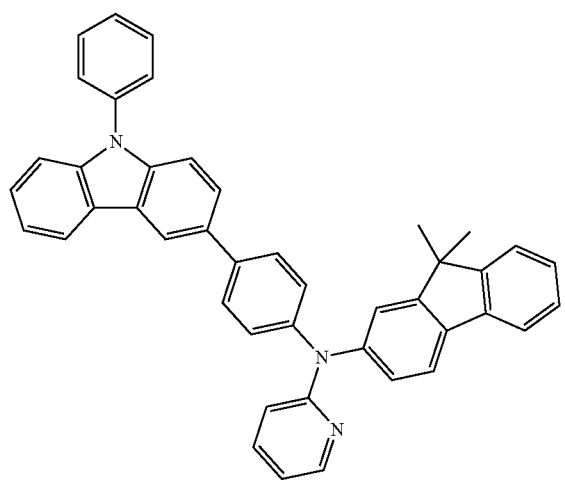
HT16
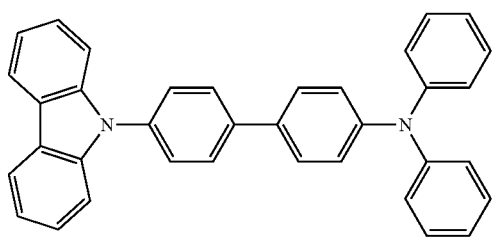
HT17
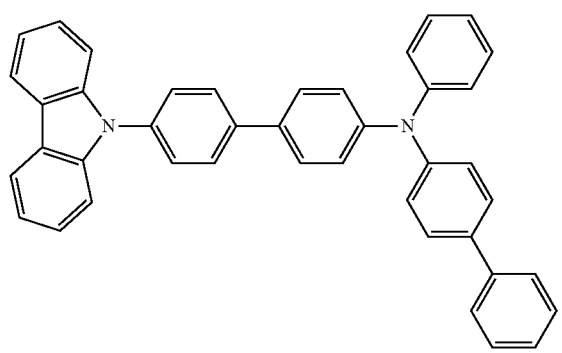
HT18
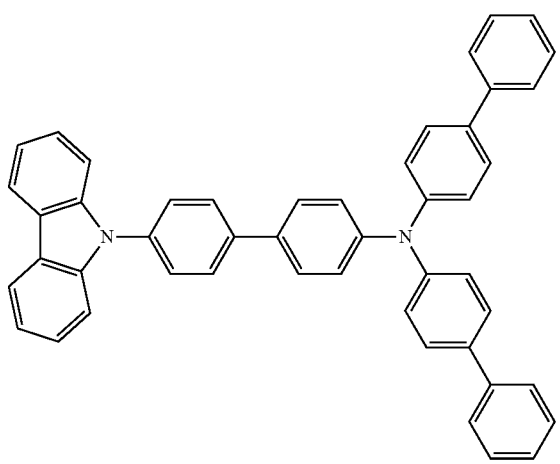

-continued
HT19
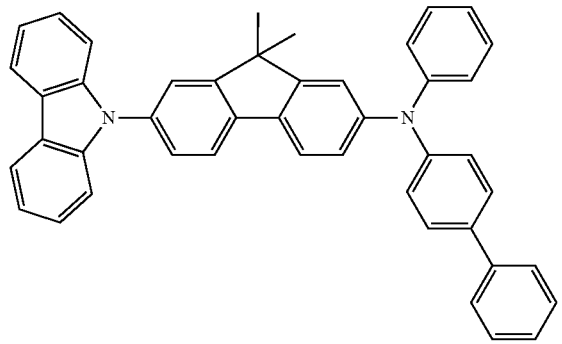
HT20
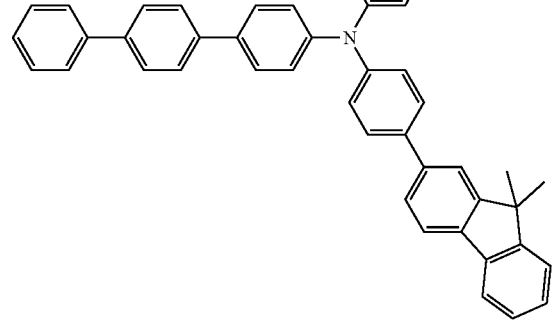
HT21
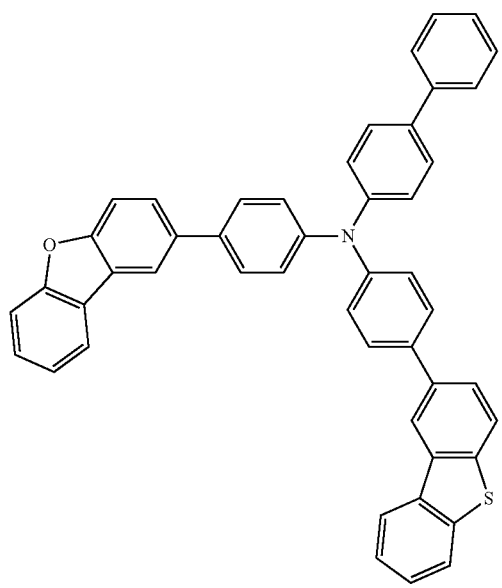
HT22
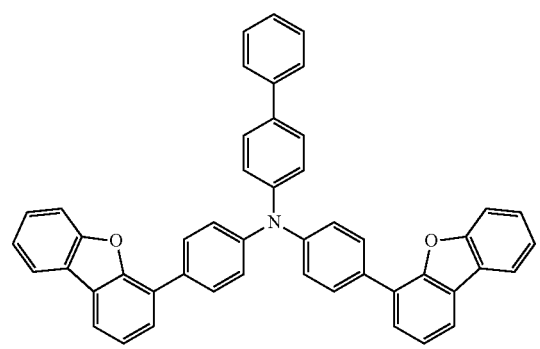

-continued
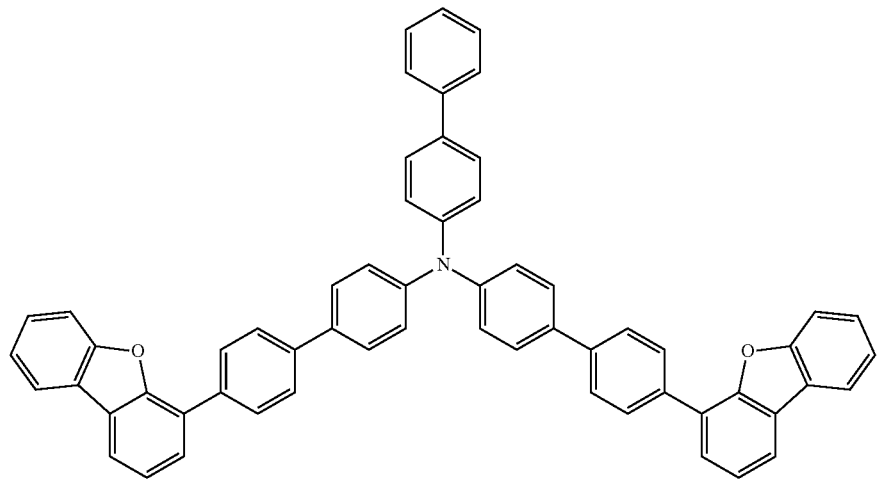
HT23
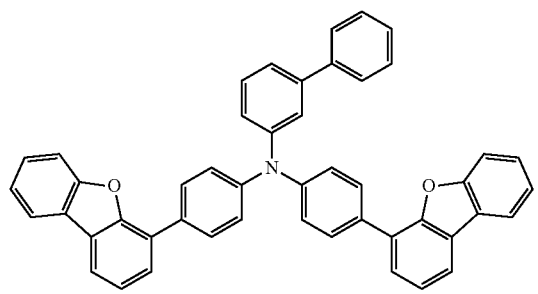
HT24
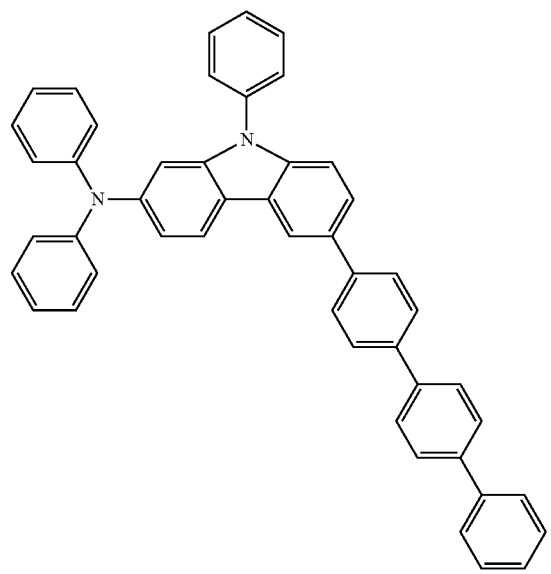
HT25
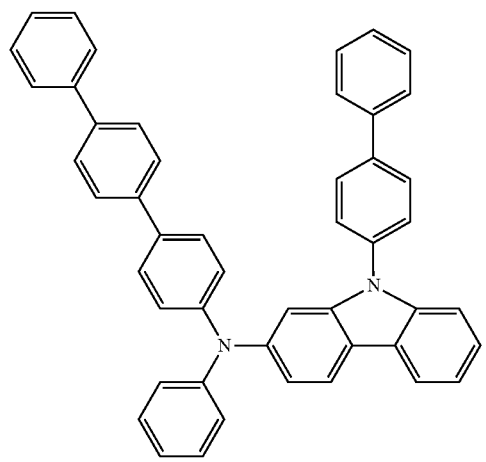
HT26
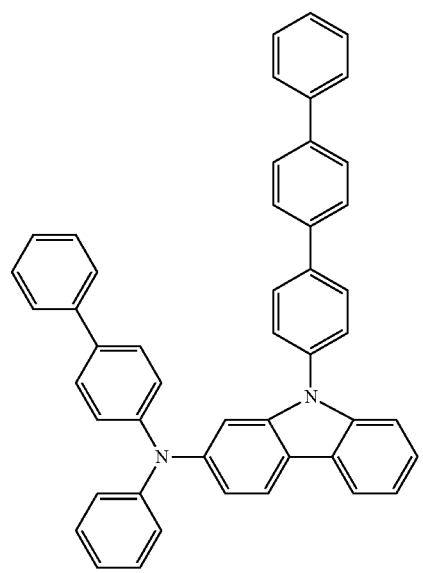
HT27

-continued
HT28
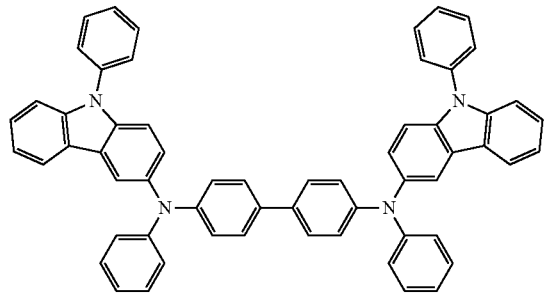
HT29
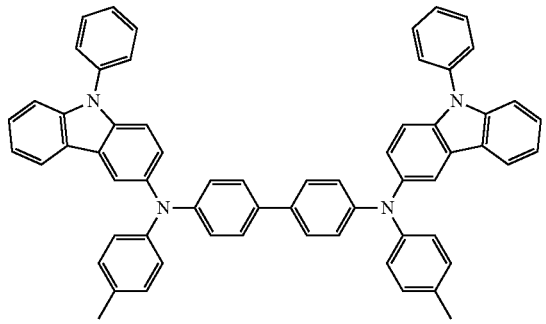
HT30
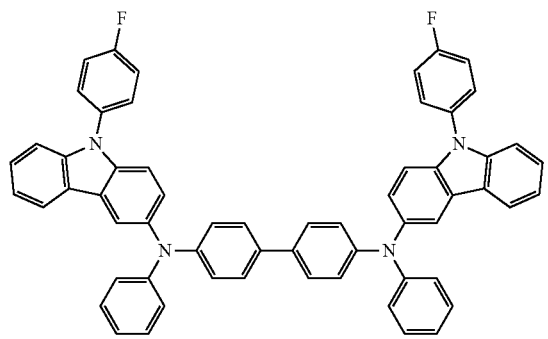
HT31
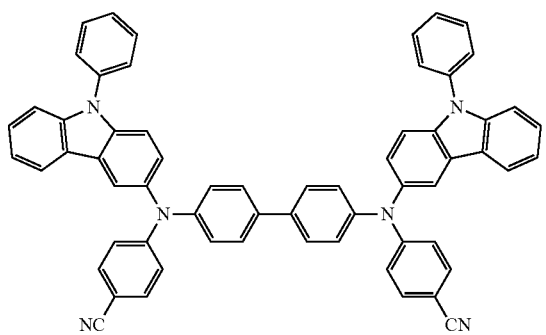
HT32
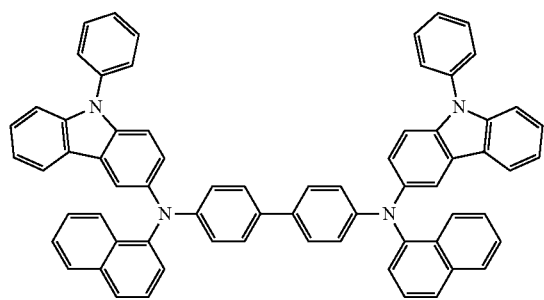
HT33
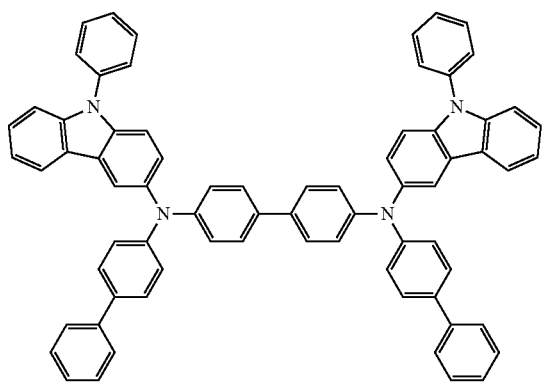
HT34
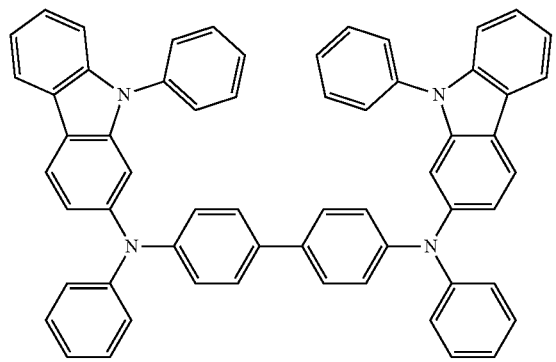
HT35
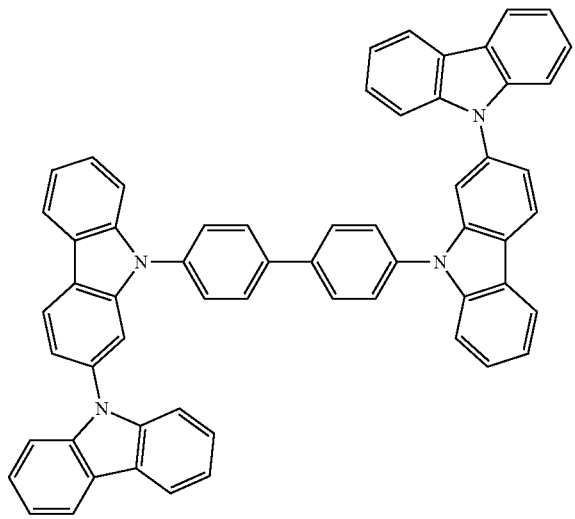

-continued

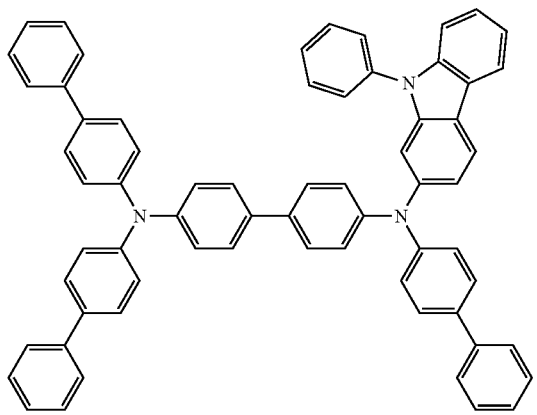
HT36

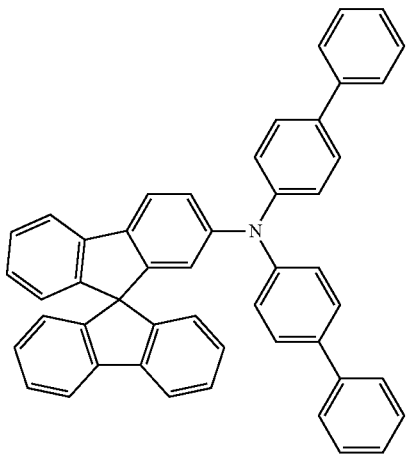
HT37

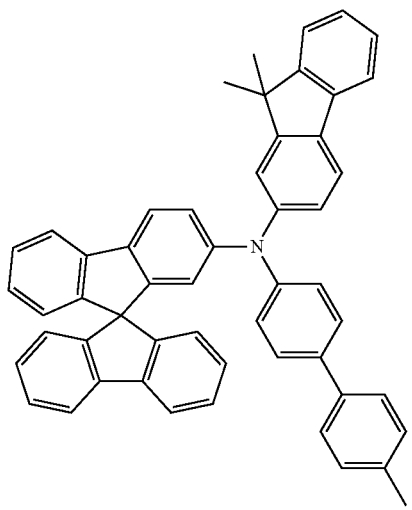
HT38

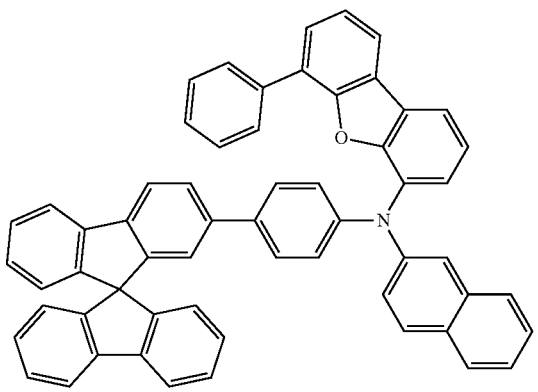
HT39

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described herein above.

P-Dopant

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In one embodiment, the p-dopant may have a lowest unoccupied molecular orbital (LUMO) level of −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from:

a quinone derivative, such as tetracyanoquinodimethane (TCNQ) or 2,3,5,6-tetrafluoro-7,7,8,8-tetracyanoquinodimethane (F4-TCNQ);

a metal oxide, such as tungsten oxide or molybdenum oxide;

1,4,5,8,9,11-hexaazatriphenylene-hexacarbonitrile (HAT-CN); and a compound represented by Formula 221, but embodiments of the present disclosure are not limited thereto:

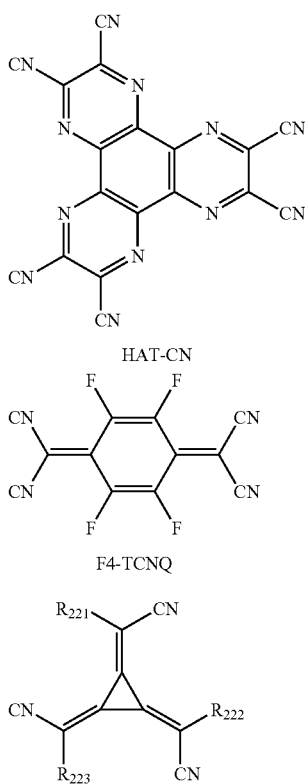

HAT-CN

F4-TCNQ

Formula 221

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with Br, and a $C_1$-$C_{20}$ alkyl group substituted with -I.

Emission Layer in Organic Layer 150

When the organic light-emitting device 10 is a full-color organic light-emitting device, the emission layer may be patterned into a red emission layer, a green emission layer, and a blue emission layer; or into a red emission layer, a green emission layer, a blue emission layer, and an NIR emission layer, according to an individual sub-pixel. In one or more embodiments, the emission layer may have a stacked structure of two or more layers selected from a red emission layer, a green emission layer, a blue emission layer, and/or an NIR emission layer, in which the two or more layers contact each other or are separated from each other. In one or more embodiments, the emission layer may include two or more materials selected from a red light-emitting material, a green light-emitting material, a blue light-emitting material, and/or an NIR light-emitting material, in which the two or more materials are mixed with each other in a single layer to emit white light.

The emission layer may include a host and a dopant. The dopant may include the organometallic compound represented by Formula 1. In one or more embodiments, the dopant may further include, in addition to the organometallic compound represented by Formula 1, at least one of a phosphorescent dopant and a fluorescent dopant:

In the emission layer, an amount of the dopant may be in a range of about 0.01 parts to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Host in Emission Layer

In one or more embodiments, the host may include a compound represented by Formula 301:

Formula 301

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer of 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), xb21 may be an integer of 1 to 5, and $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one embodiment, $Ar_{301}$ in Formula 301 may be selected from:
- a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and
- a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

When xb11 in Formula 301 is two or more, two or more Ar301(s) may be linked (e.g., may be directly chemically bonded to one another) via a single bond.

In one or more embodiments, the compound represented by Formula 301 may be represented by Formula 301-1 or 301-2:

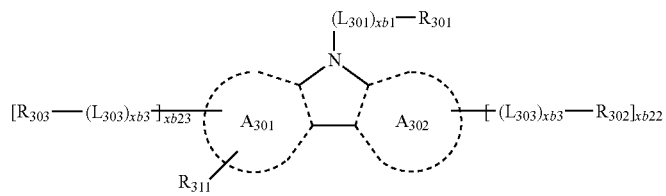

Formula 301-1

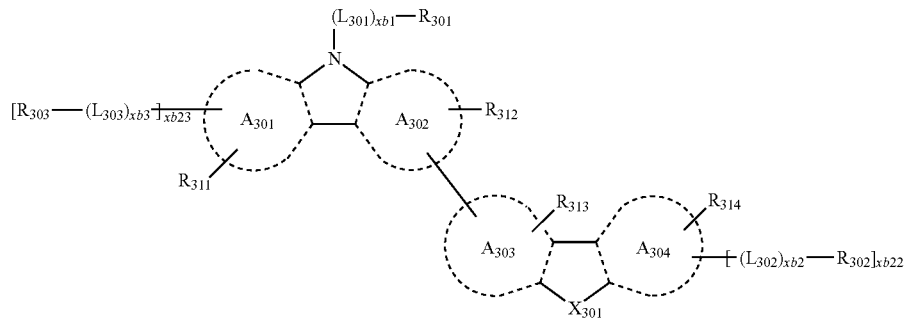

<Formula 301-2>

In Formulae 301-1 and 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonaphthothiophene group, and a dinaphthothiophene group, $X_{301}$ may be O, S, or N-[$(L_{304})_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, $L_{301}$, xb1, $R_{301}$, and $Q_{31}$ to $Q_{33}$ are the same as described herein above, $L_{302}$ to $L_{304}$ may each independently be defined the same as $L_{301}$, xb2 to xb4 may each independently be defined the same as xb1, and $R_{302}$ to $R_{304}$ may each independently be defined the same as $R_{301}$.

For example, in Formulae 301, 301-1, and 301-2, $L_{301}$ to $L_{304}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ are the same as described herein above.

In one embodiment, in Formulae 301, 301-1, and 301-2, $R_{301}$ to $R_{304}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2$$(Q_{31})$, and —P(=O)$(Q_{31})(Q_{32})$, and $Q_{31}$ to $Q_{33}$ are the same as described herein above.

In one embodiment, the host may include an alkaline earth metal complex. For example, the host may be selected from a Be complex (for example, Compound H55), a Mg complex, and a Zn complex.

The host may include at least one selected from 9,10-di (2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), bis(4-(9H-carbazol-9-yl)phenyl)diphenylsilane (BCPDS), 4-(1-(4-(diphenylamino)phenyl)cyclohexyl)phenyl)diphenyl-phosphine oxide (POPCPA), and Compounds H1 to H55, but embodiments of the present disclosure are not limited thereto:

BCPDS

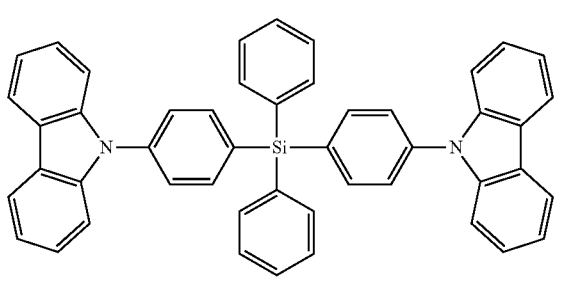

POPCPA

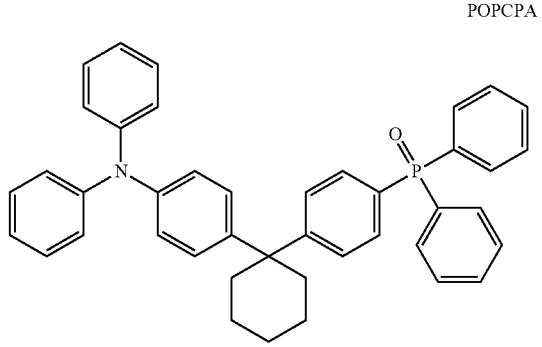

-continued
H1
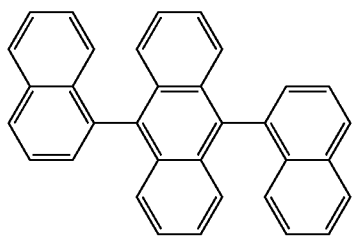
H2
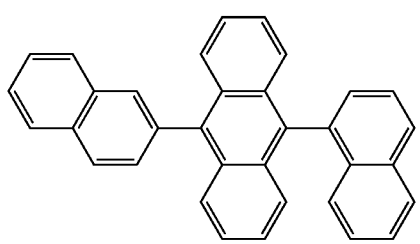
H3
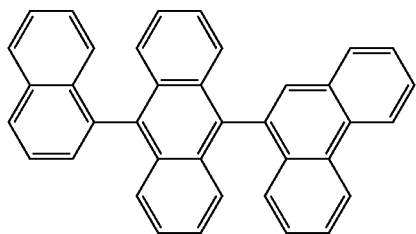
H4
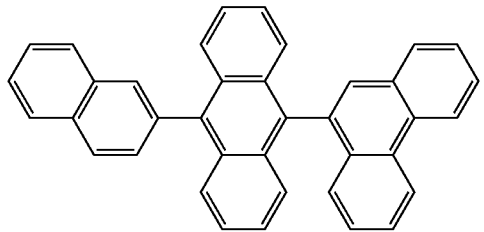
H5
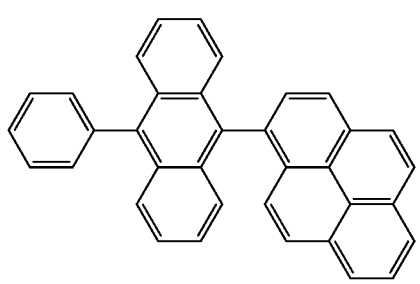
H6
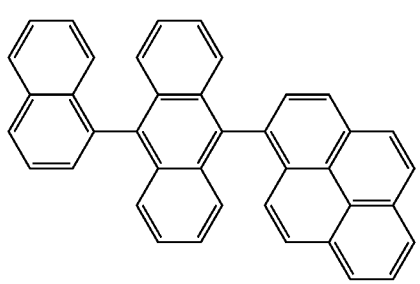
-continued
H7
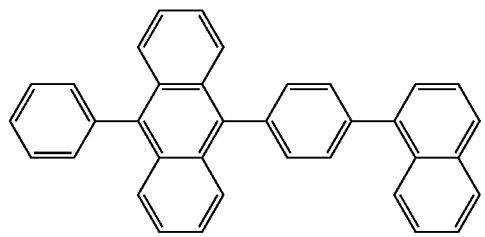
H8
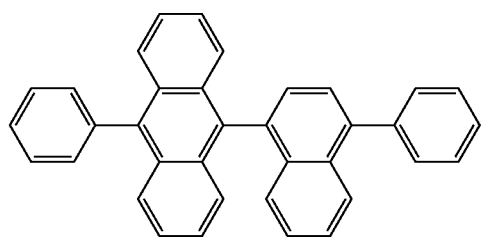
H9
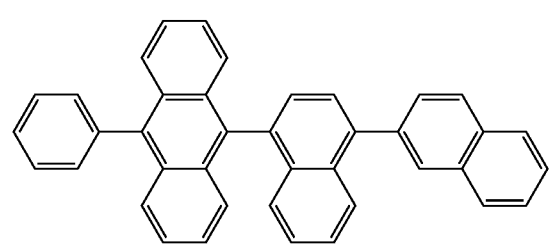
H10
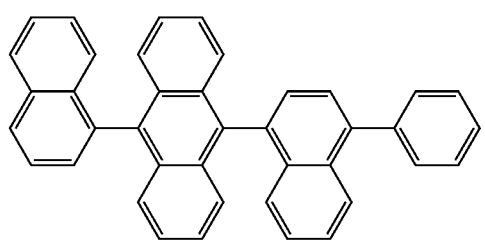
H11
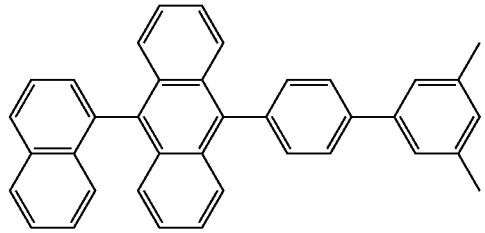
H12
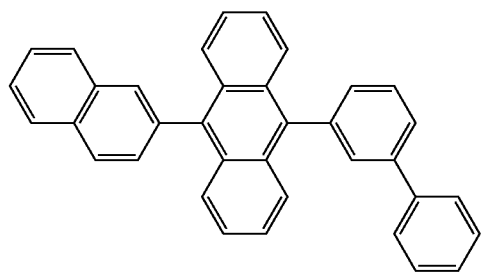

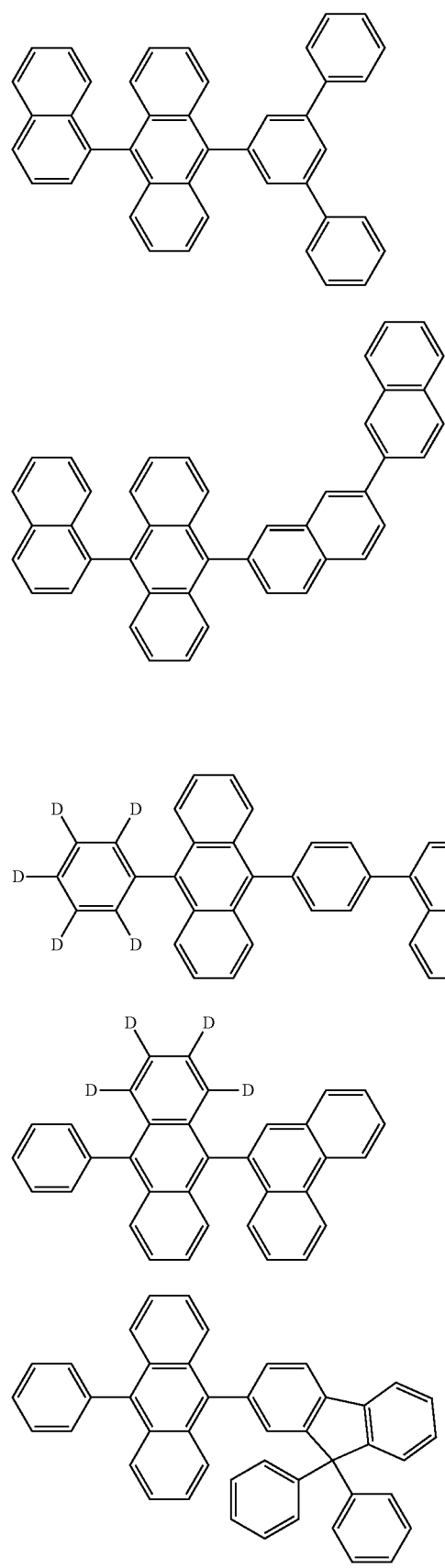

H23
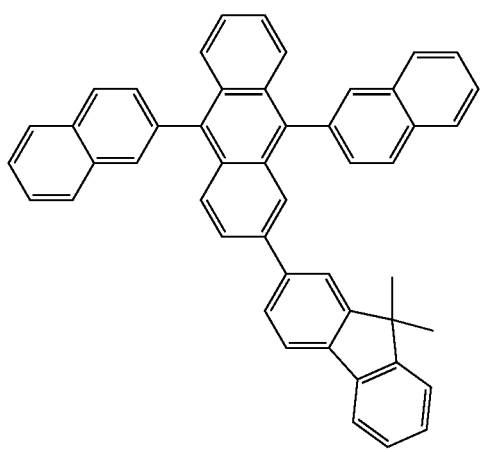
H24
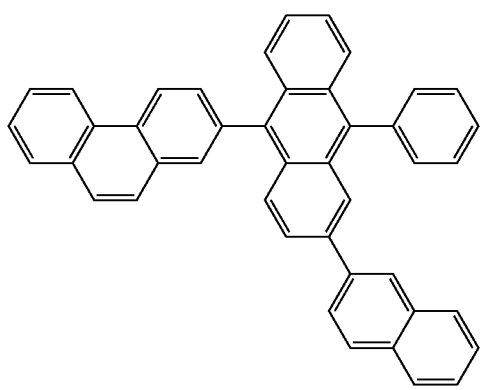
H25
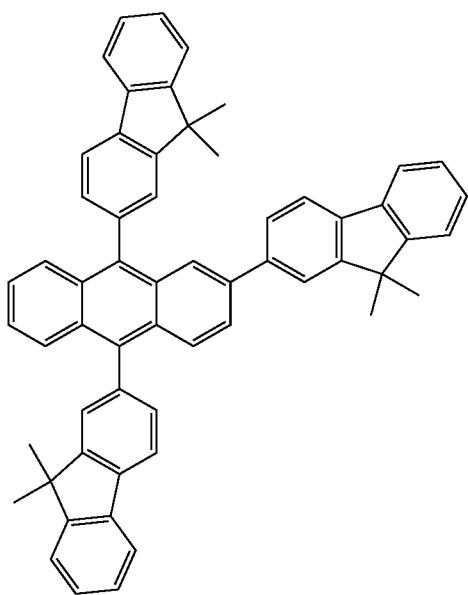
H26
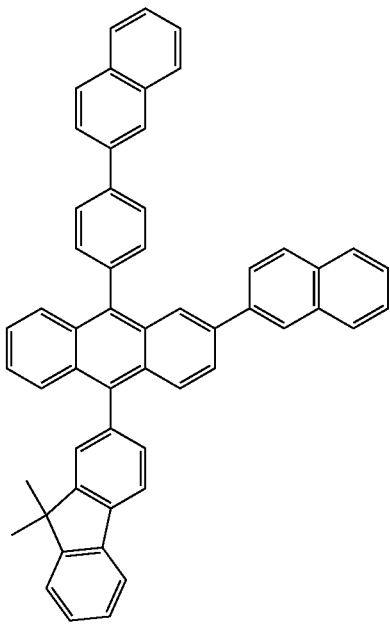
H27
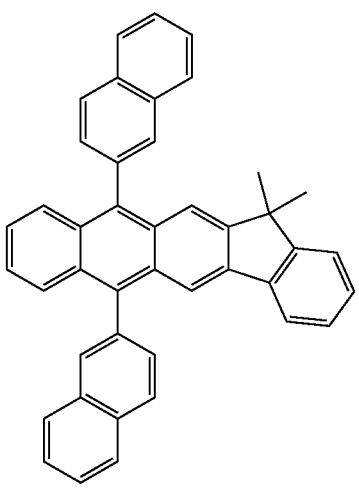
H28
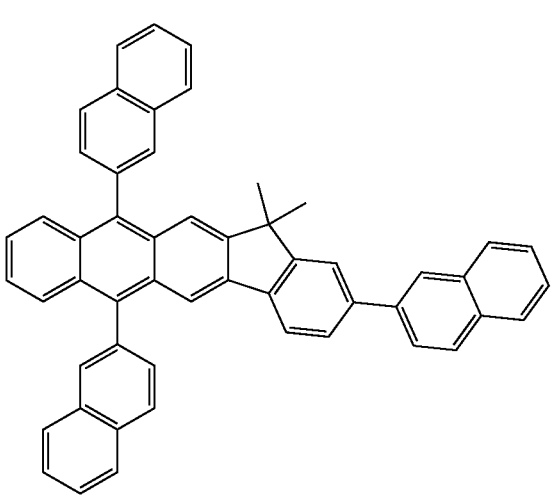

H29
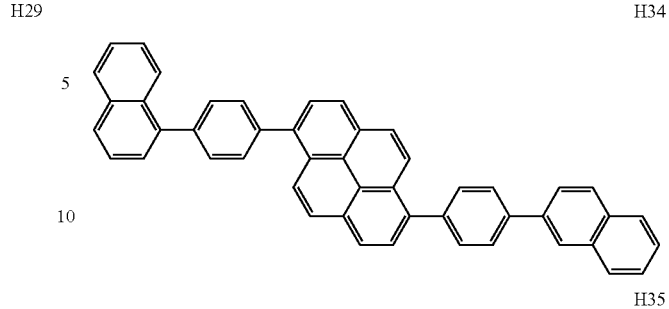
H30
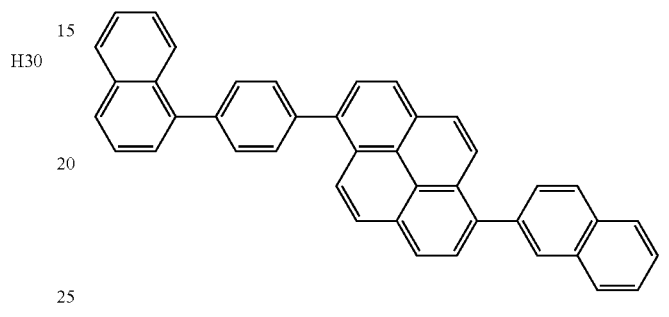
H31
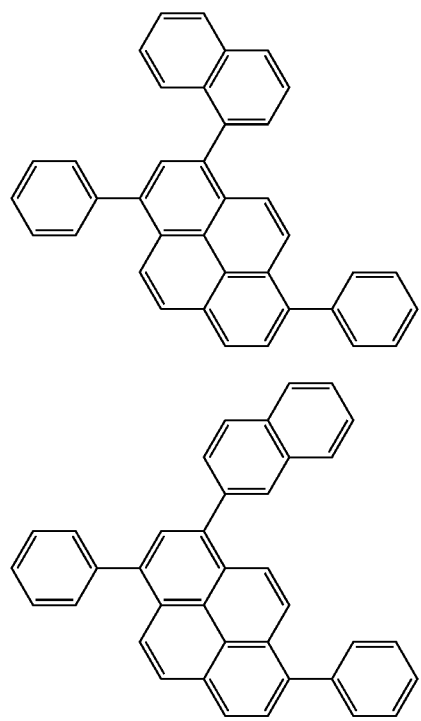
H32
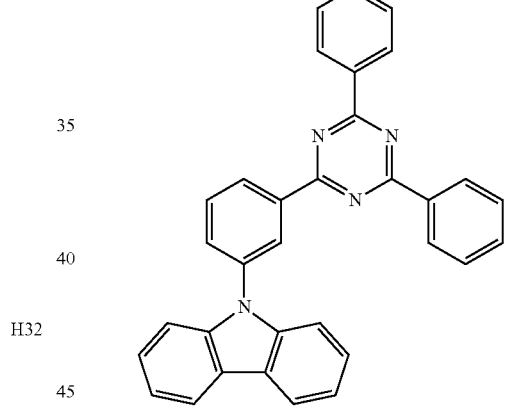
H33
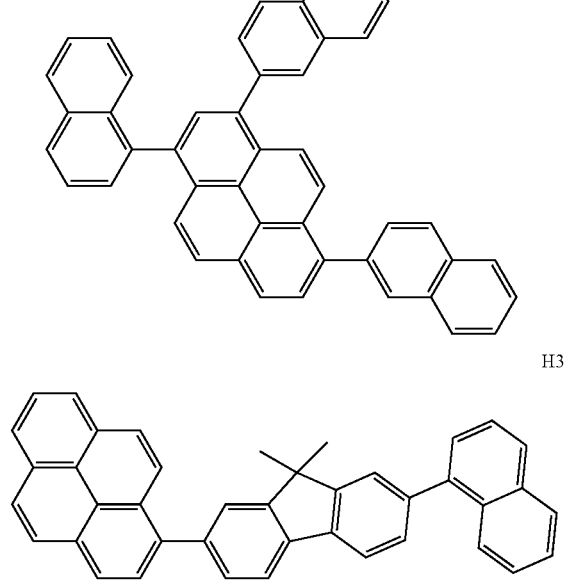
H34
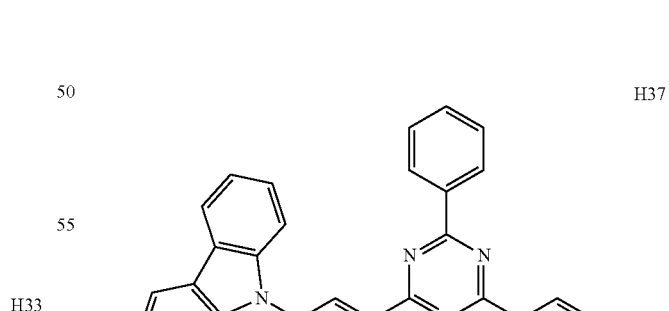
H35
H36
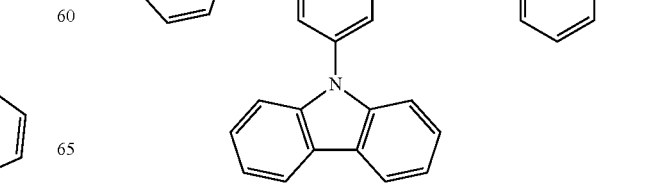
H37

-continued
H38
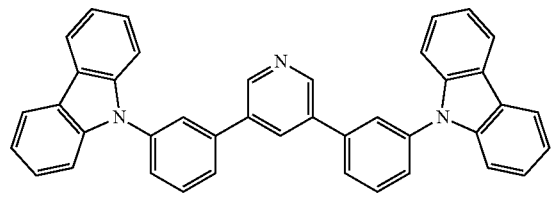
H39
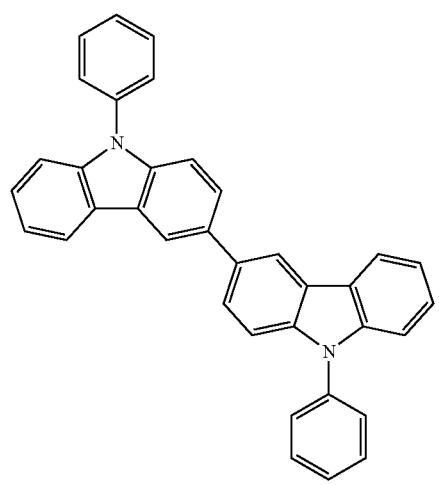
H40
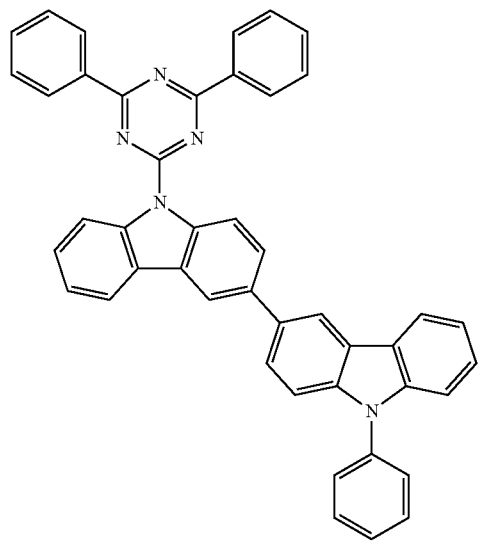
-continued
H41
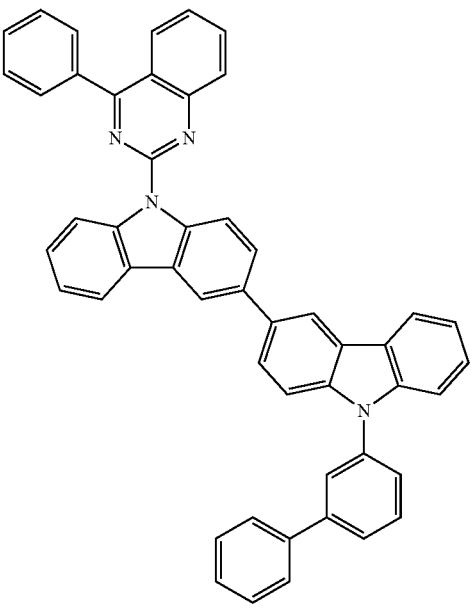
H42
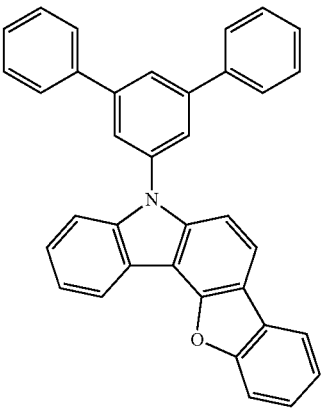
H43
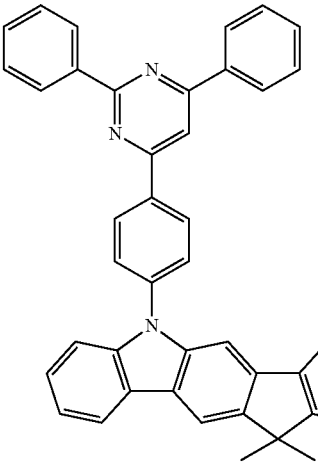

H44
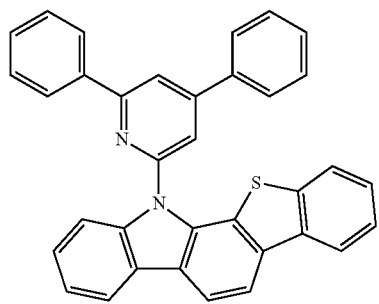
H45
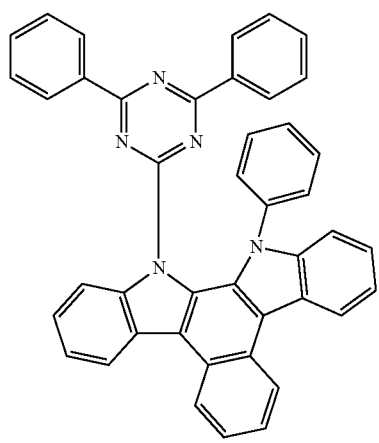
H46
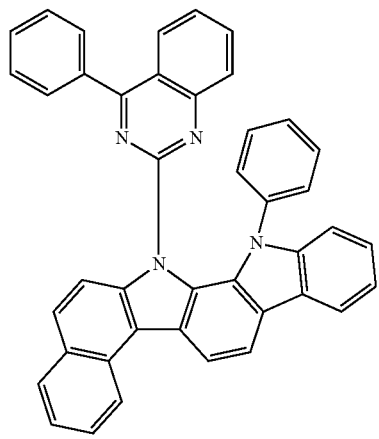
H47
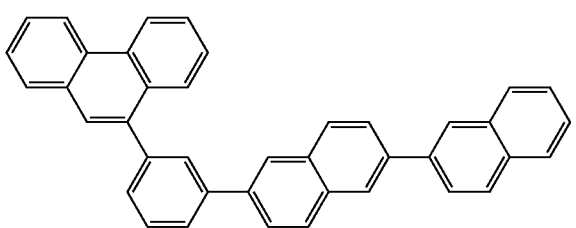
H48
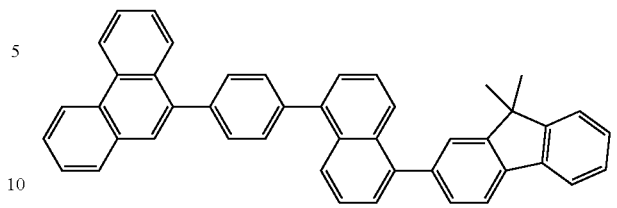
H49
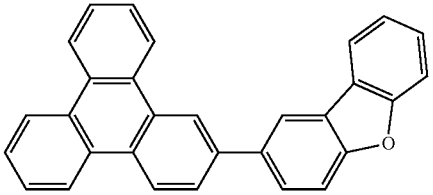
H50
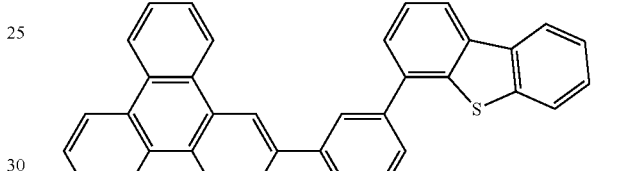
H51
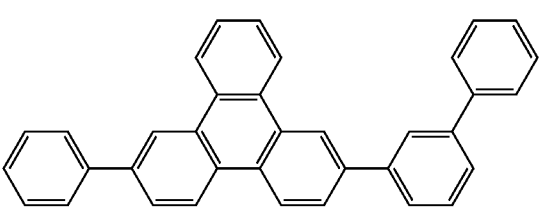
H52
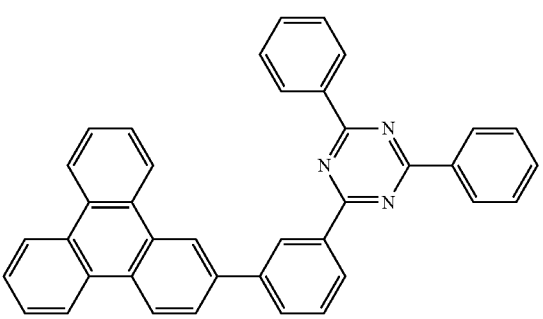
H53
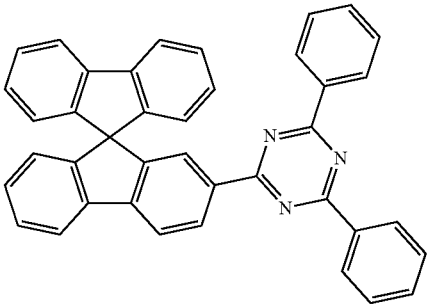

-continued

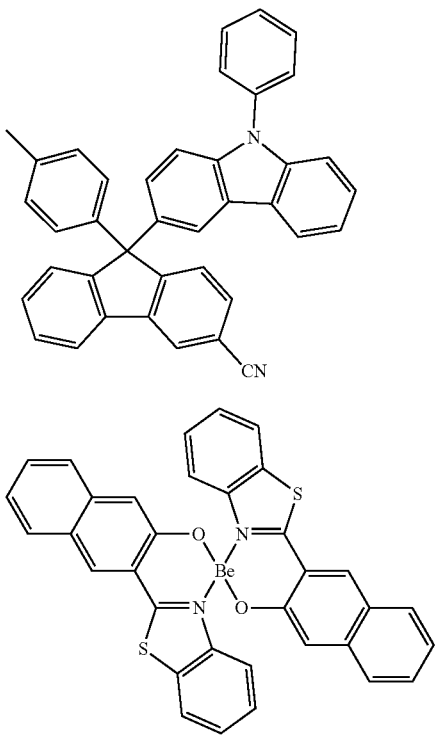

H54

H55

In one embodiment, the host may include at least one selected from a silicon-containing compound (for example, BCPDS used in the following examples or the like) and a phosphine oxide-containing compound (for example, POPCPA used in the following examples or the like).

However, embodiments of the present disclosure are not limited thereto. In one embodiment, the host may include only one compound, or two or more different compounds (for example, a host used in the following examples includes BCPDS and POPCPA).

Dopant Included in Emission Layer in Organic Layer 150

The phosphorescent dopant may include an organometallic compound represented by Formula 1. The organometallic compound represented by Formula 1 is the same as described herein above.

In one embodiment, an amount of host in the emission layer may be greater than that of the organometallic compound represented by Formula 1.

Electron Transport Region in Organic Layer 150

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer. However, embodiments of the structure of the electron transport region are not limited thereto.

The electron transport region (for example, a buffer layer, a hole blocking layer, an electron control layer, or an electron transport layer in the electron transport region) may include a metal-free compound containing at least one π electron-depleted nitrogen-containing ring.

The term "π electron-depleted nitrogen-containing ring," as used herein, indicates a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other (e.g., combined together), or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-depleted nitrogen-containing ring include an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole, but are not limited thereto.

For example, the electron transport region may include a compound represented by Formula 601:

$$[Ar_{601}]_{xe11}-[(L_{601})_{xe1}-R_{601}]_{xe21} \qquad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer of 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer of 1 to 5.

In one embodiment, at least one of $Ar_{601}$(s) in the number of xe11 and $R_{601}$(S) in the number of xe21 may include the π electron-depleted nitrogen-containing ring.

In one embodiment, ring $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more $Ar601$(s) may be linked (e.g., may be directly chemically bonded to one another) via a single bond.

In one or more embodiments, $Ar_{601}$ in Formula 601 may be an anthracene group.

In one or more embodiments, the compound represented by Formula 601 may be represented by Formula 601-1:

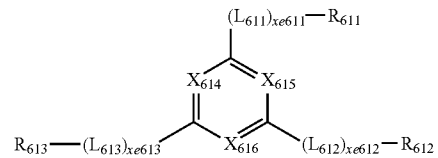

Formula 601-1

In Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each independently be defined the same as $L_{601}$, xe611 to xe613 may each independently be defined the same as xe1, $R_{611}$ to $R_{613}$ may each independently be defined the same as $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, in Formulae 601 and 601-1, $L_{601}$ and $L_{611}$ to $L_{613}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, in Formulae 601 and 601-1, xe1 and xe611 to xe613 may each independently be 0, 1, or 2.

In one or more embodiments, in Formulae 601 and 601-1, $R_{601}$ and $R_{611}$ to $R_{613}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and –P(=O)(Q$_{601}$)(Q$_{602}$), and Q$_{601}$ and Q$_{602}$ are same as described herein above.

The electron transport region may include at least one compound selected from Compounds ET1 to ET36, but embodiments of the present disclosure are not limited thereto:

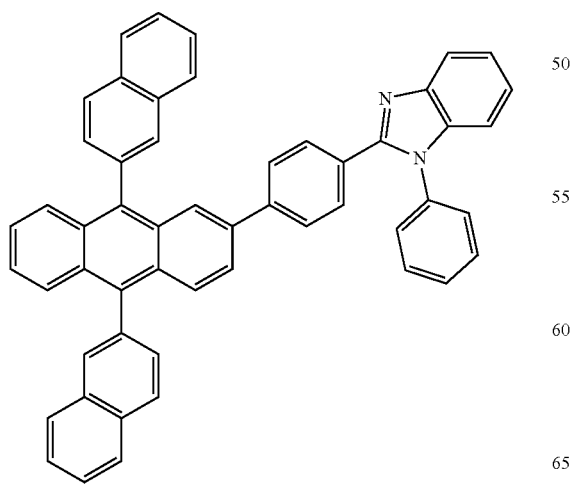

ET1

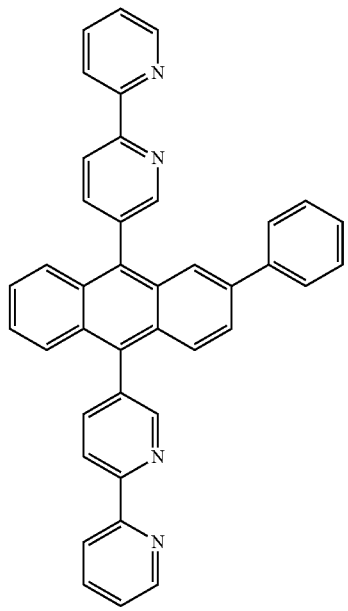

ET2

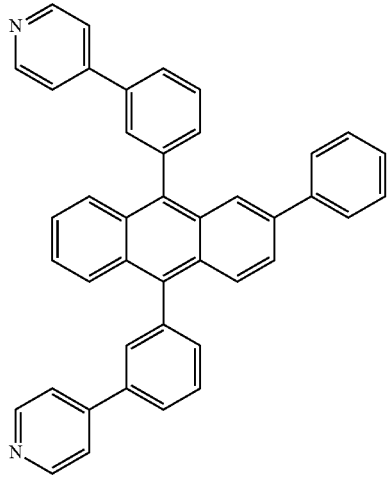

ET3

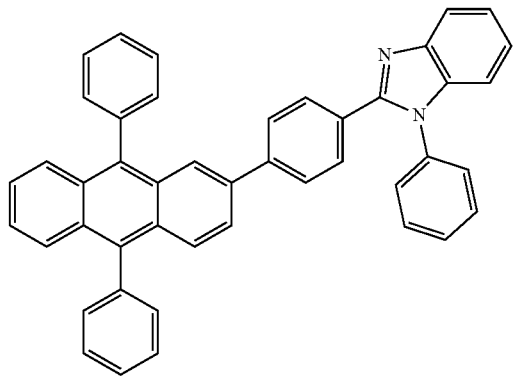

ET4

129
-continued
130
-continued
ET5
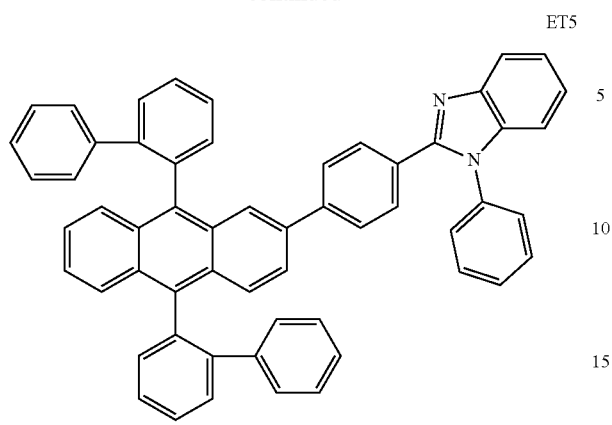
ET8
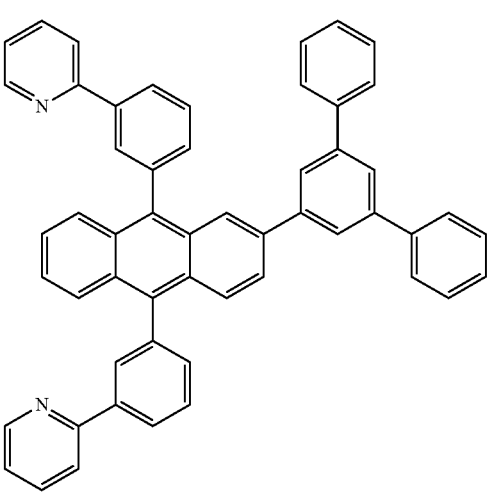
ET6
ET9
ET7
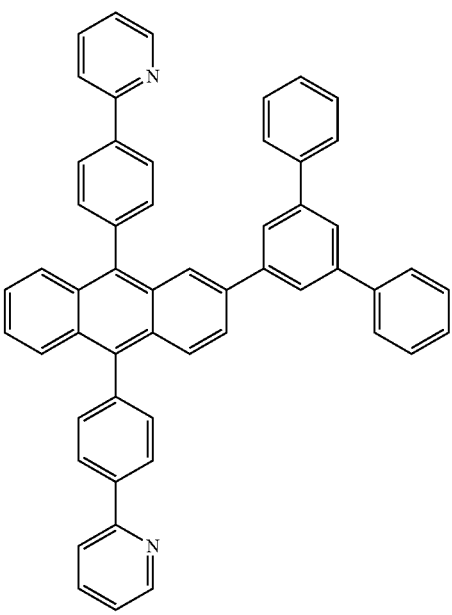

ET10
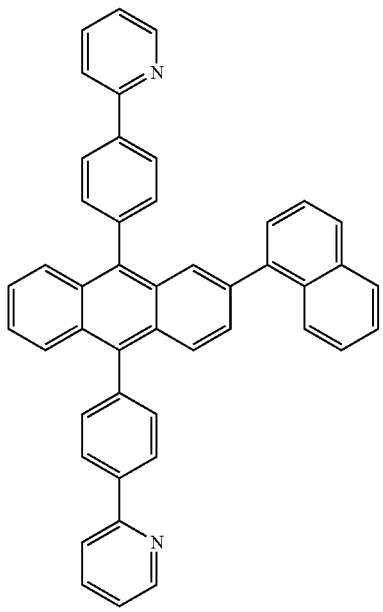
ET11
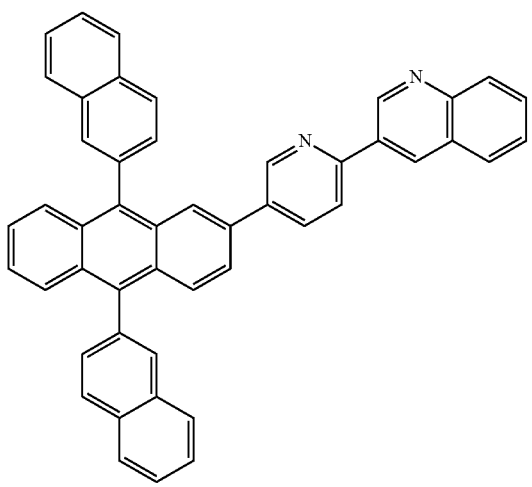
ET12
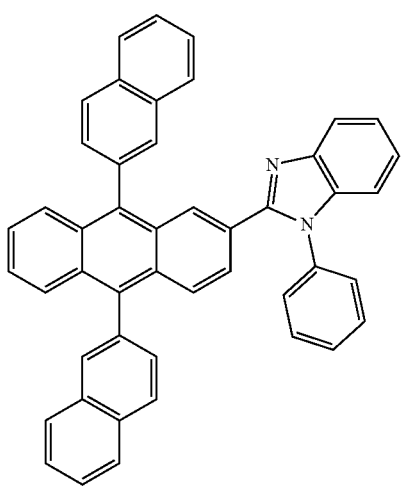
ET13
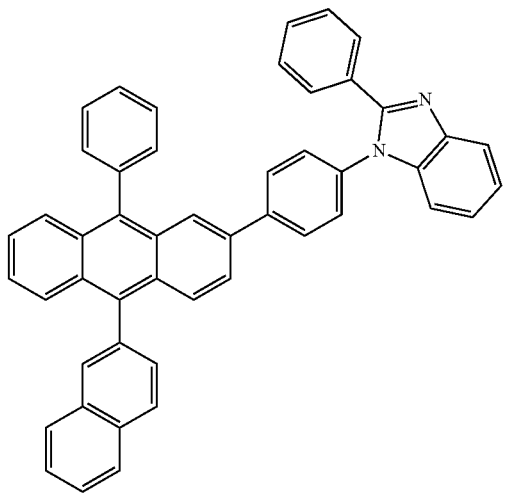
ET14
ET15
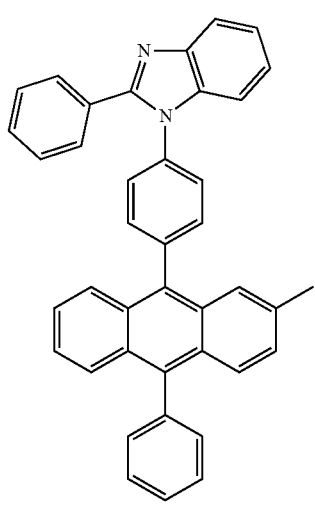

ET16
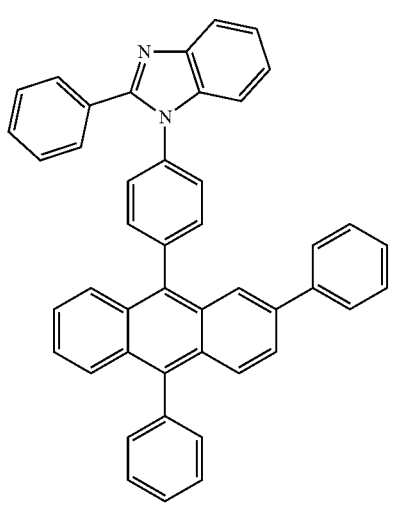
ET17
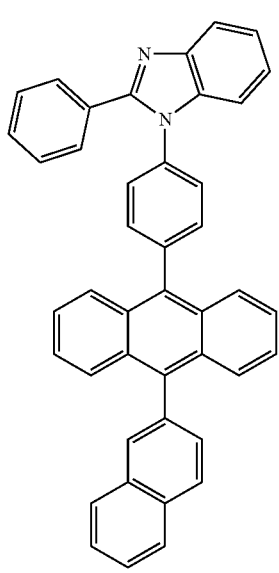
ET18
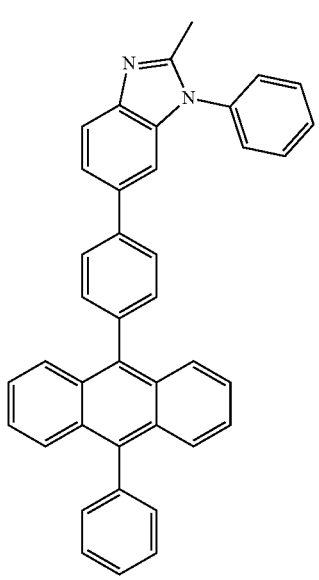
ET19
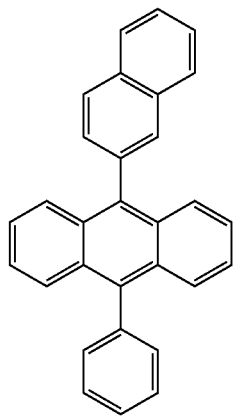
ET20
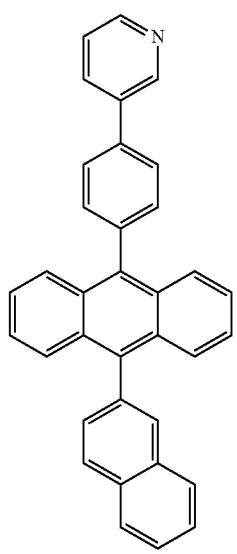
ET21
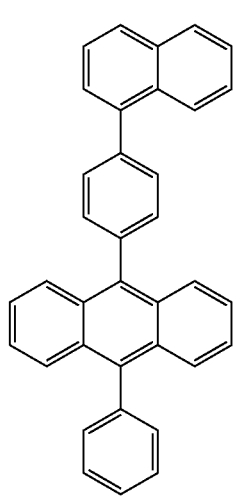

ET22
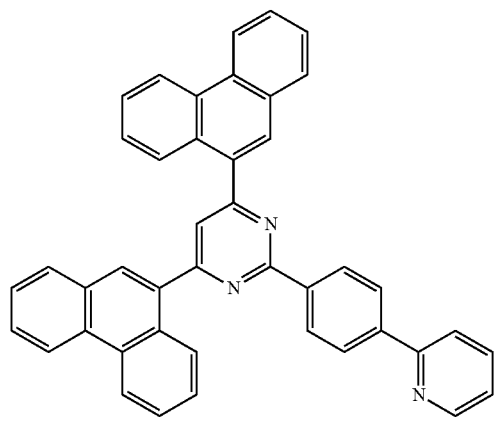
ET25
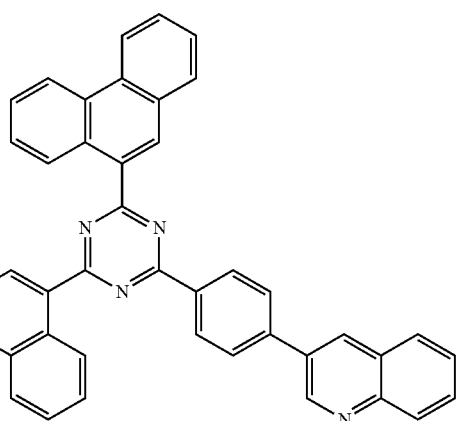
ET23 ET26
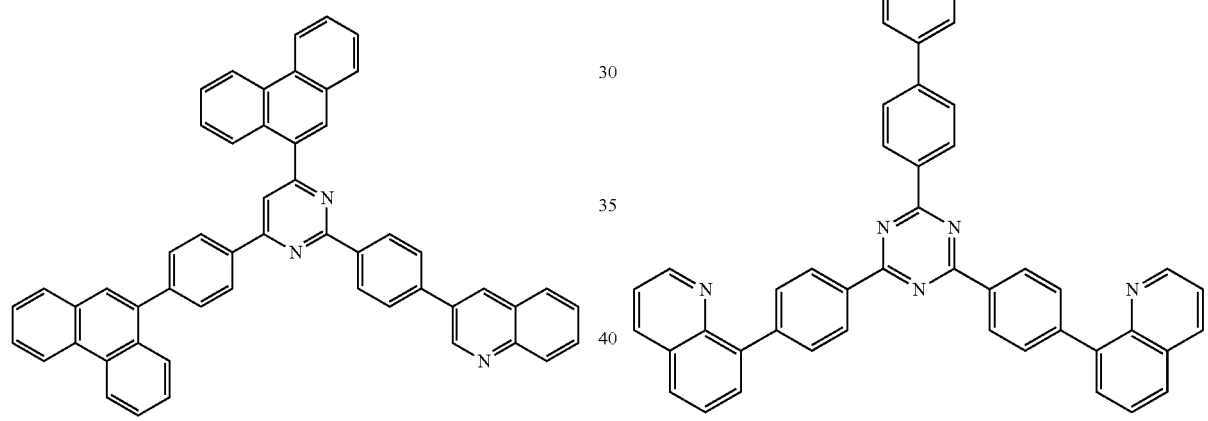
ET24
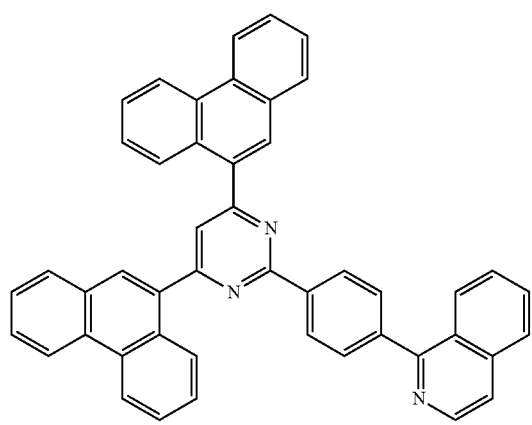
ET27
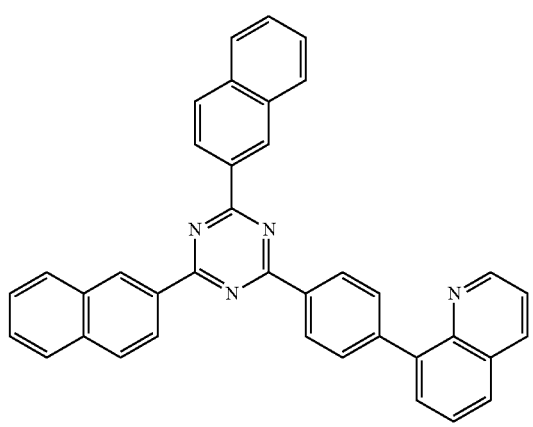

ET28
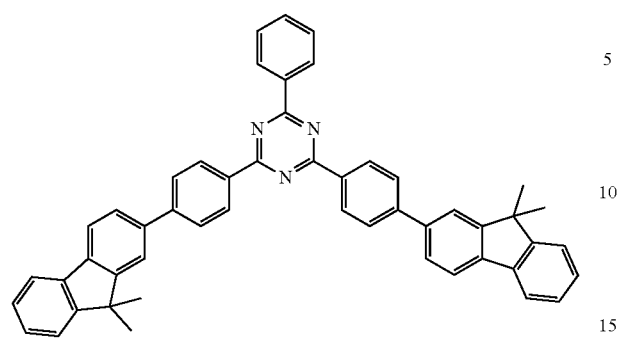
ET29
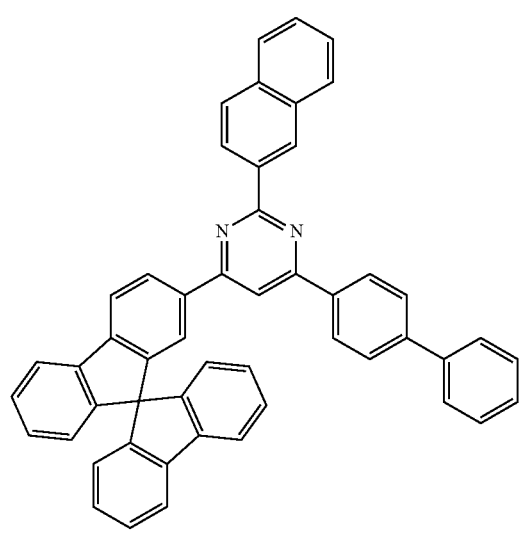
ET30
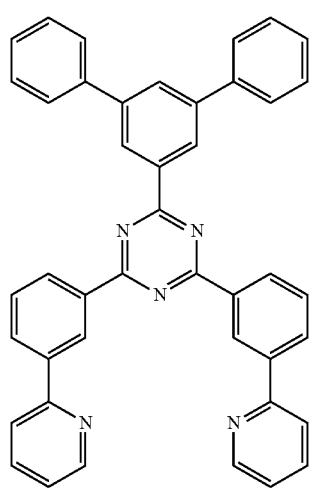
ET31
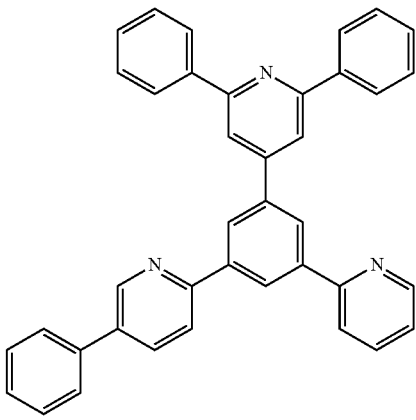
ET32
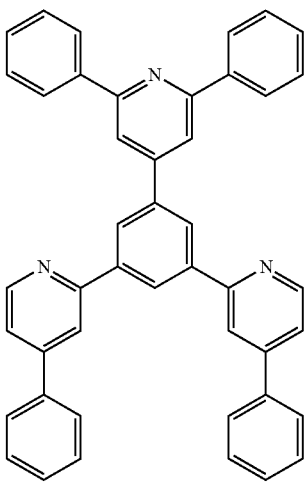
ET33
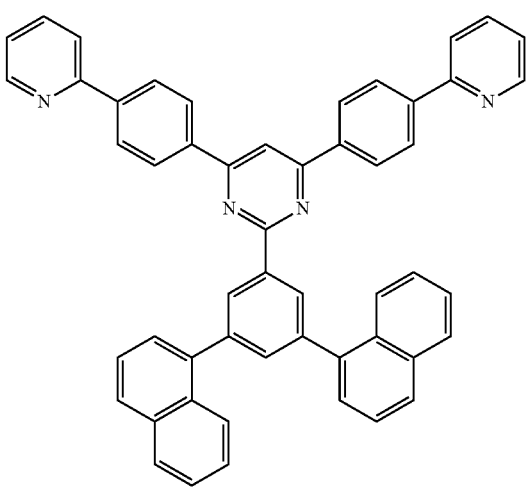

-continued

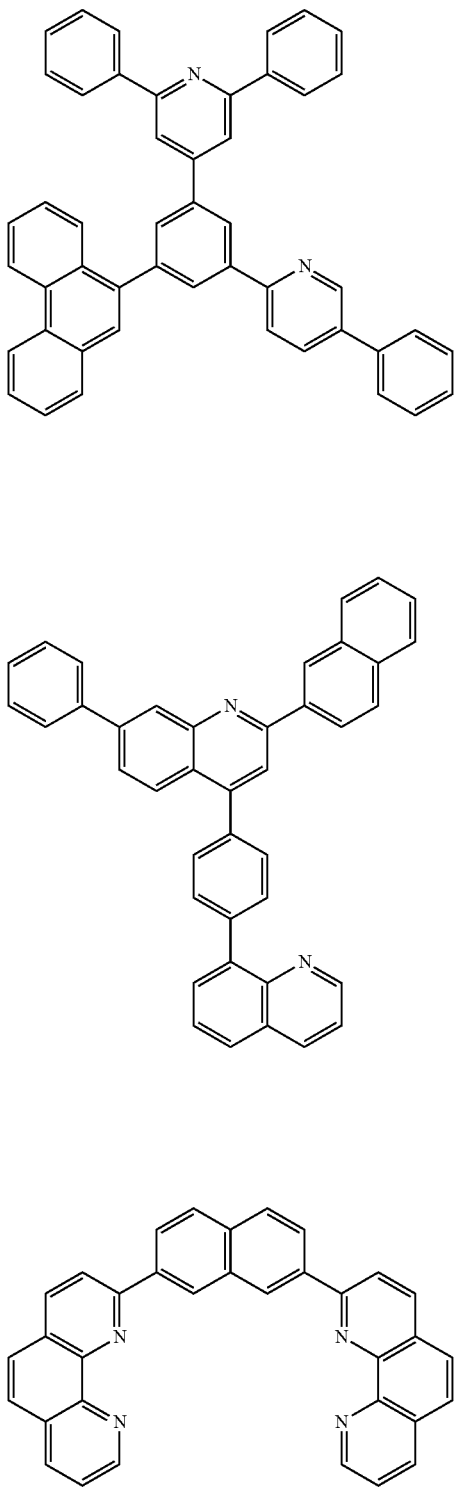

ET34

ET35

ET36

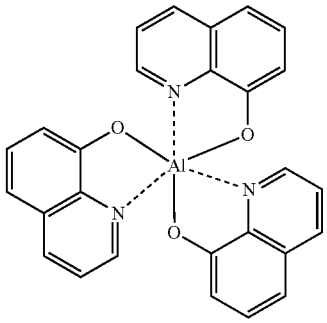

Alq₃

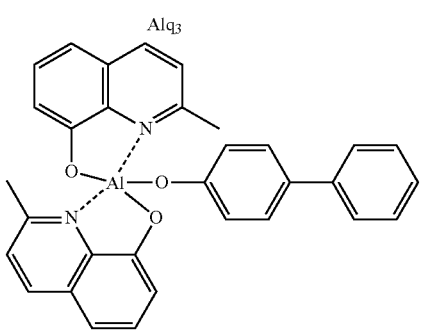

BAlq

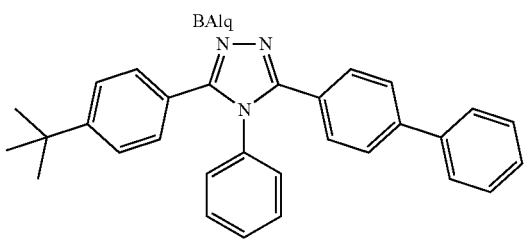

TAZ

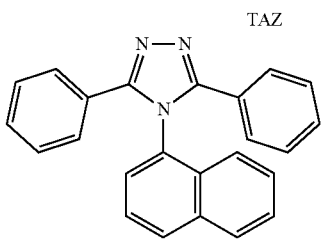

NTAZ

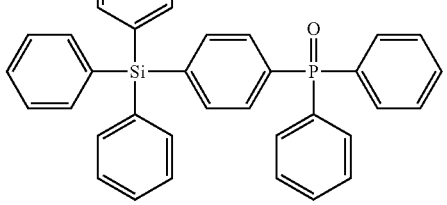

TSPO1

In one or more embodiments, the electron transport region may include at least one compound selected from 2,9-dimethyl-4,7-diphenyl-1,10-phenanthroline (BCP), 4,7-diphenyl-1,10-phenanthroline (Bphen), Alq₃, BAlq, 3-(biphenyl-4-yl)-5-(4-tert-butylphenyl)-4-phenyl-4H-1,2,4-triazole (TAZ), NTAZ, and diphenyl(4-(triphenylsilyl)phenyl)-phosphine oxide (TSPO1).

A thickness of the buffer layer, the hole blocking layer, or the electron control layer may be in a range of about 20 Å to about 1,000 Å, for example, about 30 Å to about 300 Å. When the thicknesses of the buffer layer, the hole blocking layer, and the electron control layer are within these ranges, the electron blocking layer may have excellent electron blocking characteristics or electron control characteristics without a substantial increase in driving voltage.

A thickness of the electron transport layer may be in a range of about 100 Å to about 1,000 Å, for example, about 150 Å to about 500 Å. When the thickness of the electron transport layer is within the range described herein above, the electron transport layer may have suitable or satisfactory electron transport characteristics without a substantial increase in driving voltage.

The electron transport region (for example, the electron transport layer in the electron transport region) may further include, in addition to the materials described herein above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

For example, the metal-containing material may include a Li complex. The Li complex may include, for example, Compound ET-D1 (lithium quinolate, LiQ) or ET-D2:

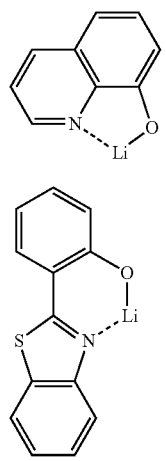

ET-D1

ET-D2

The electron transport region may include an electron injection layer that facilitates injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs. In one embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, KI, or RbI. In one embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}$ O (0<x<1), $Ba_xCa_{1-x}O$ (0<x<1). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described herein above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazol, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described herein above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described herein above, the electron injection layer may have suitable or satisfactory electron injection characteristics without a substantial increase in driving voltage.

Second Electrode 190

The second electrode 190 may be on the organic layer 150 having such a structure. The second electrode 190 may be a cathode which is an electron injection electrode, and in this regard, a material for forming the second electrode 190 may be selected from metal, an alloy, an electrically conductive compound, and a combination thereof, which have a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layered structure, or a multi-layered structure including two or more layers.

Figure 2:
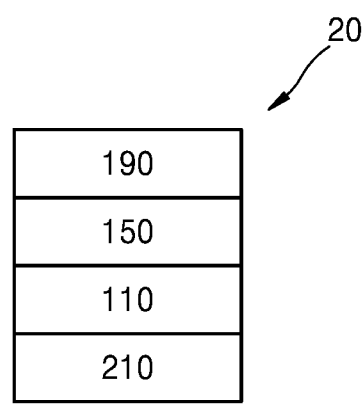
FIG. 2 is a schematic cross-sectional view of an organic light-emitting device according to an embodiment.
Figure 3:
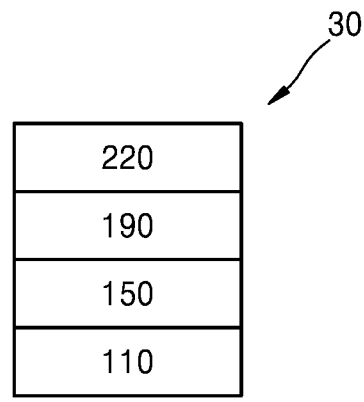
FIG. 3 is a schematic cross-sectional view of an organic light-emitting device according to an embodiment.
Figure 4:
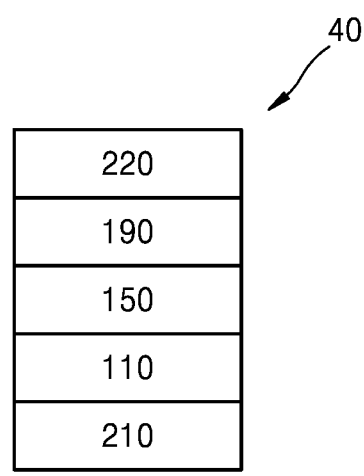
FIG. 4 is a schematic cross-sectional view of an organic light-emitting device according to an embodiment.

Description of FIGS. 2-4

An organic light-emitting device 20 of FIG. 2 includes a first capping layer 210, a first electrode 110, an organic layer 150, and a second electrode 190 which are sequentially stacked in this stated order, an organic light-emitting device 30 of FIG. 3 includes a first electrode 110, an organic layer 150, a second electrode 190, and a second capping layer 220 which are sequentially stacked in this stated order, and an organic light-emitting device 40 of FIG. 4 includes a first capping layer 210, a first electrode 110, an organic layer 150, a second electrode 190, and a second capping layer 220.

In FIGS. 2-4, the first electrode 110, the organic layer 150, and the second electrode 190 may be understood by referring to the description presented in connection with FIG. 1.

In the organic layer 150 of each of the organic light-emitting devices 20 and 40, light generated in an emission layer may pass through the first electrode 110, which is a semi-transmissive electrode or a transmissive electrode, and the first capping layer 210 toward the outside, and in the organic layer 150 of each of the organic light-emitting devices 30 and 40, light generated in an emission layer may pass through the second electrode 190, which is a semi-transmissive electrode or a transmissive electrode, and the second capping layer 220 toward the outside.

The first capping layer 210 and the second capping layer 220 may increase external luminescence efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphyrine derivatives, phthalocyanine derivatives, a naphthalocyanine derivatives, alkali metal complexes, and alkaline earth-based complexes. The carbocyclic compound, the heterocyclic compound, and the amine-based compound may be optionally substituted with a substituent containing at least one element selected from O, N, S, Se, Si, F, Cl, Br, and I. In one embodiment, at least one selected from the first capping layer 210 and the second capping layer 220 may each independently include an amine-based compound.

In one embodiment, at least one selected from the first capping layer 210 and the second capping layer 220 may each independently include the compound represented by Formula 201 or the compound represented by Formula 202.

In one or more embodiments, at least one selected from the first capping layer 210 and the second capping layer 220 may each independently include a compound selected from Compounds HT28 to HT33 and Compounds CP1 to CP5, but embodiments of the present disclosure are not limited thereto.

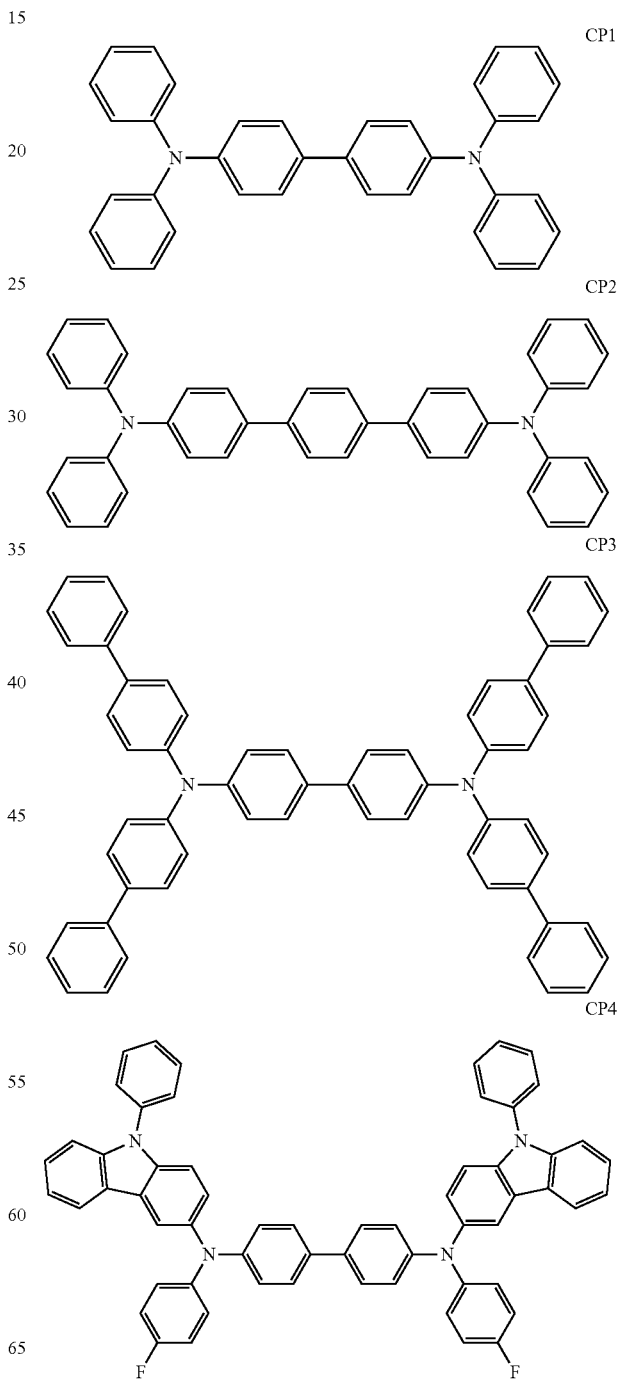

-continued

CP5

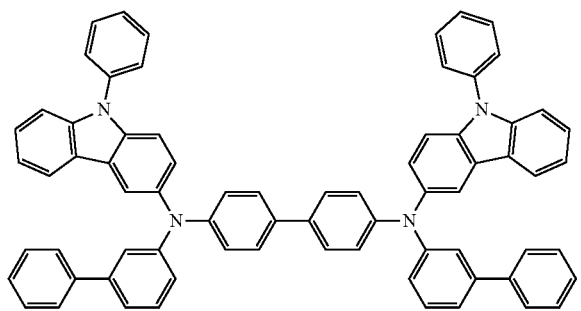

Hereinbefore, the organic light-emitting device according to an embodiment has been described in connection with FIGS. 1-4. However, embodiments of the present disclosure are not limited thereto.

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed, and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed, and the structure of a layer to be formed.

Apparatus

The organic light-emitting device may be used in various suitable apparatuses.

Another aspect of an embodiment of the present disclosure provides an apparatus including the organic light-emitting device.

The apparatus may be, for example, a light-emitting apparatus, an authentication apparatus, or an electronic apparatus, but embodiments of the present disclosure are not limited thereto.

The light-emitting apparatus may be used as various suitable displays, light sources, and the like.

The authentication apparatus may be, for example, a biometric authentication apparatus for authenticating an individual by using biometric information of a biometric body (for example, a finger tip, a pupil, or the like).

The authentication apparatus may further include, in addition to the organic light-emitting device, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, or endoscope displays), fish finders, various suitable measuring instruments, meters (for example, meters for a vehicle, an aircraft, and/or a vessel), projectors, and the like, but embodiments of the present disclosure are not limited thereto.

The apparatus may further include, in addition to the organic light-emitting device, a thin film transistor. Here, the thin film transistor may include a source electrode and a drain electrode, wherein at least one of the source electrode and the drain electrode of the thin film transistor may be electrically coupled to the first electrode of the organic light-emitting device.

General Definition of at Least Some of the Substituents

The term "first-row transition metal of the Periodic Table of Elements," as used herein, refers to a fourth-row element belonging to the d-block of the Periodic Table of Elements, including scandium (Sc), titanium (Ti), vanadium (V), chromium (Cr), manganese (Mn), iron (Fe), cobalt (Co), nickel (Ni), copper (Cu), and zinc (Zn).

The term "second-row transition metal of the Periodic Table of Elements," as used herein, refers to a fifth-row element belonging to the d-block of the Periodic Table of Elements, including yttrium (Y), zirconium (Zr), niobium (Nb), molybdenum (Mo), technetium (Tc), ruthenium (Ru), rhodium (Rh), palladium (Pd), silver (Ag), and cadmium (Cd).

The term "third-row transition metal of the Periodic Table of Elements," as used herein, refers to a sixth-row element belonging to the lanthanides or d-block of the Periodic Table of Elements, including lanthanum (La), samarium (Sm), europium (Eu), terbium (Tb), thulium (Tm), ytterbium (Yb), lutetium (Lu), hafnium (Hf), tantalum (Ta), tungsten (W), rhenium (Re), osmium (Os), iridium (Ir), platinum (Pr), gold (Au), and mercury (Hg).

The term "$C_1$-$C_{60}$ alkyl group," as used herein, refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a hydrocarbon group having at least one double bond at a main chain (e.g., in the middle) or at a terminal end (e.g., at the terminus) of the $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a hydrocarbon group having at least one triple bond at a main chain (e.g., in the middle) or at a terminal end (e.g., at the terminus) of the $C_2$-$C_{60}$ alkyl group, and examples thereof include an ethynyl group, and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent monocyclic group having at least one heteroatom selected from N, O, Si, P, and S as a ring-forming atom and 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one double bond in the ring thereof and no aromaticity (e.g., the entire ring and/or group is not aromatic), and examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other (e.g., combined together).

The term "$C_1$-$C_{60}$ heteroaryl group," as used herein, refers to a monovalent group having a carbocyclic aromatic system that has at least one heteroatom selected from N, O, Si, P, and S as a ring-forming atom, in addition to 1 to 1 carbon atoms. The term "$C_1$-$C_{60}$ heteroarylene group," as used herein, refers to a divalent group having a carbocyclic aromatic system that has at least one heteroatom selected from N, O, Si, P, and S as a ring-forming atom, in addition to 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other (e.g., combined together).

The term "$C_6$-$C_{60}$ aryloxy group," as used herein, indicates —$OA_{102}$ (wherein $A_{102}$ is the $C_6$-$C_{60}$ aryl group), and a $C_6$-$C_{60}$ arylthio group indicates —$SA_{103}$ (wherein $A_{103}$ is the $C_6$-$C_{60}$ aryl group).

The term "$C_1$-$C_{60}$ heteroaryloxy group," as used herein, indicates —$OA_{104}$ (wherein $A_{104}$ is the $C_1$-$C_{60}$ heteroaryl group), and the term "C6-$C_{60}$ heteroarylthio group," as used herein, indicates —SA105 (wherein $A_{105}$ is the $C_1$-$C_{60}$ heteroaryl group).

The term "monovalent non-aromatic condensed polycyclic group," as used herein, refers to a monovalent group (for example, having 8 to 60 carbon atoms) having two or more rings condensed with each other (e.g., combined together), only carbon atoms as ring-forming atoms, and no aromaticity in its entire molecular structure (e.g., the entire group and/or molecule is not aromatic). An example of the monovalent non-aromatic condensed polycyclic group is a fluorenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group (for example, having 1 to 60 carbon atoms) having two or more rings condensed to each other (e.g., combined together), at least one heteroatom selected from N, O, Si, P, and S, other than carbon atoms, as a ring-forming atom, and no aromaticity in its entire molecular structure (e.g., the entire group and/or molecule is not aromatic). An example of the monovalent non-aromatic condensed heteropolycyclic group is a carbazolyl group. The term "divalent non-aromatic condensed heteropolycyclic group," as used herein, refers to a divalent group having substantially the same structure as the monovalent non-aromatic condensed heteropolycyclic group.

The term "$C_5$-$C_{60}$ carbocyclic group," as used herein, refers to a monocyclic or polycyclic group having 5 to 60 carbon atoms in which a ring-forming atom is a carbon atom only. The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group," as used herein, refers to a group having substantially the same structure as the $C_5$-$C_{60}$ carbocyclic group, except that as a ring-forming atom, at least one heteroatom selected from N, O, Si, P, and S is used in addition to carbon (the number of carbon atoms may be in a range of 1 to 60).

In embodiments of the present disclosure, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{31}$)($Q_{32}$), —C(=O)($Q_{31}$), —S(=O)$_2$($Q_{31}$), and —P(=O)($Q_{31}$)($Q_{32}$), and $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph," as used herein, refers to a phenyl group, the term "Me," as used herein, refers to a methyl group, the term "Et," as used herein, refers to an ethyl group, the term "ter-Bu" or "Bu$^t$," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a compound according to embodiments and an organic light-emitting device according to embodiments will be described in more detail with reference to Synthesis Examples and Examples. The wording "B was used instead of A" used in describing Synthesis Examples indicates that an identical (e.g., substantially identical) molar equivalent of B was used in place of A.

EXAMPLES

Synthesis Example 1: Synthesis of Compound 1

1) Synthesis of Compound A-3

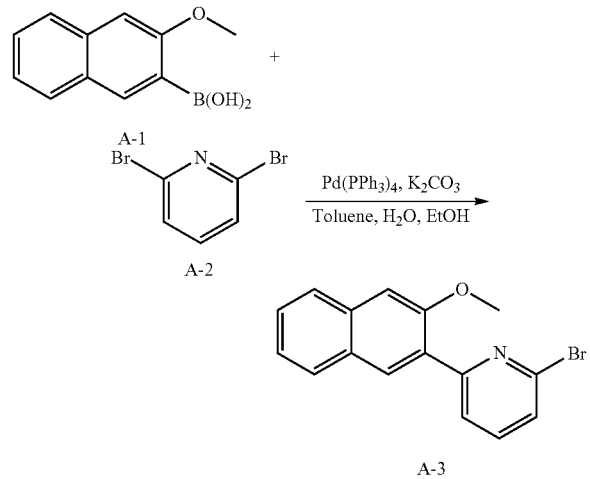

Compound A-1 (20.2 g, 100 mmol), Compound A-2 (23.7 g, 100 mmol), tetrakis(triphenylphosphine)palladium (3.5 g, 3.0 mmol), and potassium carbonate (41.5 g, 300 mmol) were added to a flask, and 500 ml of toluene, 100 ml of ethanol, and 100 ml of H$_2$O were added thereto. The reaction mixture was stirred at room temperature for 30 minutes to bubble N$_2$. Then, the reaction mixture was heated and stirred for 6 hours under reflux. The reaction mixture was cooled to room temperature and added to methanol to filter the generated precipitate. Column chromatography using dichloromethane and n-hexane as a developing solvent was performed thereon to obtain Compound A-3 (14.1 g, 45.0 mmol, yield of 45%).

MS (MALDI-TOF) m/z: 314 [M]+

2) Synthesis of Compound A-7

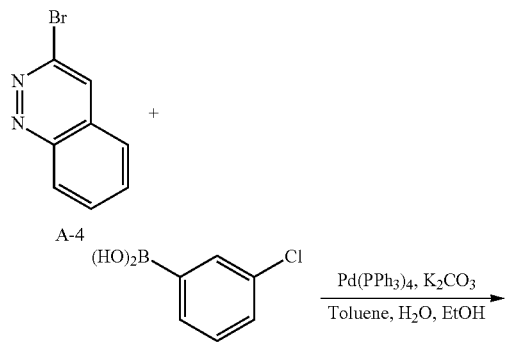

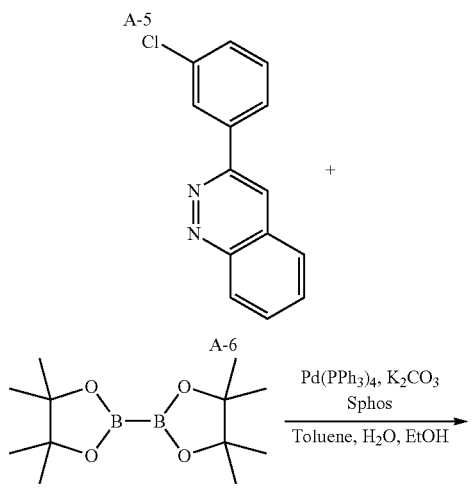

Compound A-4 (20.9 g, 100 mmol), Compound A-5 (15.6 g, 100 mmol), tetrakis(triphenylphosphine)palladium (3.5 g, 3.0 mmol), and potassium carbonate (41.5 g, 300 mmol) were added to a flask, and 500 ml of toluene, 100 ml of ethanol, and 100 ml of H$_2$O were added thereto. The reaction mixture was stirred at room temperature for 30 minutes to bubble N$_2$. Then, the reaction mixture was heated and stirred for 6 hours under reflux. The reaction mixture was cooled to room temperature and added to methanol to filter the generated precipitate. Column chromatography using dichloromethane and n-hexane as a developing solvent was performed thereon to obtain Compound A-6 (9.1 g, 38.0 mmol, yield of 38%).

MS (MALDI-TOF) m/z: 240 [M]+

Compound A-6 (9.1 g, 38.0 mmol), pinacol diborane (10.6 g, 41.6 mmol), tetrakis(triphenylphosphine)palladium (1.3 g, 1.1 mmol), potassium carbonate (15.7 g, 113 mmol), and dicyclohexyl(2',6'-dimethoxy-[1,1'-biphenyl]-2-yl)phosphine (SPhos, 0.8 g, 1.9 mmol) were added to a flask, and 200 ml of toluene, 40 ml of ethanol, and 40 ml of H$_2$O were added thereto. The reaction mixture was stirred at room temperature for 30 minutes to bubble N$_2$. Then, the reaction mixture was heated and stirred for 6 hours under reflux. The reaction mixture was cooled to room temperature and added to methanol to filter the generated precipitate. Column chromatography using dichloromethane and n-hexane as a developing solvent was performed thereon to obtain Compound A-7 (7.8 g, 23.4 mmol, yield of 62%).

MS (MALDI-TOF) m/z: 332 [M]+

3) Synthesis of Compound 1

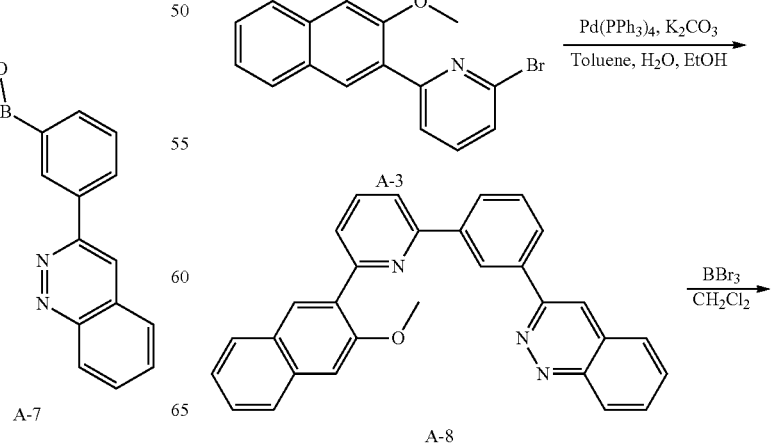

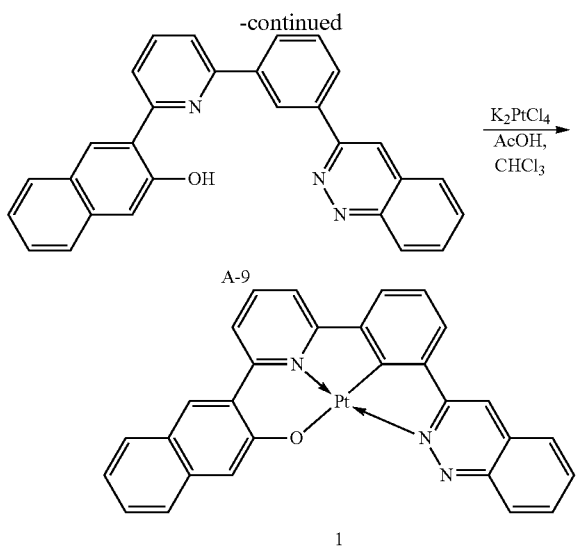

Compound A-7 (7.8 g, 23.5 mmol), Compound A-3 (7.4 g, 23.5 mmol), tetrakis(triphenylphosphine)palladium (0.8 g, 0.7 mmol), and potassium carbonate (9.7 g, 70.4 mmol) were added to a flask, and 200 ml of toluene, 40 ml of ethanol, and 40 ml of $H_2O$ were added thereto. The reaction mixture was stirred at room temperature for 30 minutes to bubble $N_2$. Then, the reaction mixture was heated and stirred for 6 hours under reflux. The reaction mixture was cooled to room temperature and added to methanol to filter the generated precipitate. Column chromatography using dichloromethane and n-hexane as a developing solvent was performed thereon to obtain Compound A-8 (5.9 g, 13.4 mmol, yield of 57%).

MS (MALDI-TOF) m/z: 439 [M]+

Compound A-8 (5.9 g, 13.4 mmol) was dissolved in 120 ml of dichloromethane and maintained at a temperature of 0° C. in a nitrogen atmosphere. Tribromoboron (20.1 ml, 1.0 M solution in dichloromethane) was slowly added dropwise thereto and stirred for 4 hours. After confirming by thin-film chromatography that all of Compound A-8 was reacted, water was added thereto and an organic layer was separated therefrom. The organic layer was distilled under reduced pressure to generate a solid, and column chromatography using ethyl acetate and n-hexane was performed on the solid to obtain Compound A-9 (2.9 g, 6.7 mmol, yield of 50%).

MS (MALDI-TOF) m/z: 425 [M]+

Compound A-9 (2.9 g, 6.7 mmol) was added to 290 ml of acetic anhydride and 30 ml of chloroform, and potassium tetrachloroplatinate (3.3 g, 8.0 mmol) was further added thereto. The reaction mixture was stirred under reflux and heated for 24 hours. The reaction mixture was heated to room temperature and neutralized with a sodium carbonate solution. Then, an organic layer was extracted therefrom by using dichloromethane. Magnesium sulfate was added to the organic layer, stirred for 30 minutes, filtered, and distilled under reduced pressure to obtain a solid. Column chromatography using dichloromethane and n-hexane as a developing solvent was performed on the obtained solid to obtain Compound 1 (1.5 g, 2.4 mmol, yield of 36%).

MS (MALDI-TOF) m/z: 618 [M]+

An organic light-emitting device including the organometallic compound may emit red light or near-infrared light having a maximum emission wavelength of, for example, about 720 nm or more and about 2,500 nm or less, and may have a low driving voltage and high external quantum efficiency.

It should be understood that embodiments described herein should be considered in a descriptive sense only and not for purposes of limitation. Descriptions of features or aspects within each embodiment should typically be considered as available for other similar features or aspects in other embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the figures, it will be understood by those of ordinary skill in the art that various changes in form and details may be made therein without departing from the spirit and scope as defined by the following claims, and equivalents thereof.

What is claimed is:
1. An organic light-emitting device comprising:
a first electrode;
a second electrode; and
an organic layer between the first electrode and the second electrode and comprising an emission layer,
wherein the organic layer comprises an organometallic compound represented by Formula 1:

$$M_1(L_1)_{n1}(L_2)_{n2} \qquad \text{Formula 1}$$

Formula 1-1

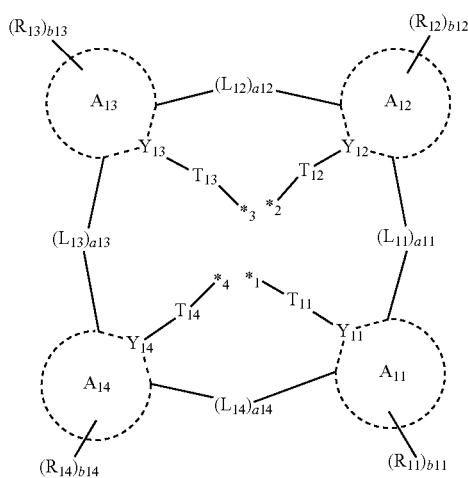

Formula 2

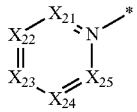

Formula 3

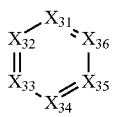

wherein, in Formulae 1, 1-1, 2, and 3,
$M_1$ is selected from a first-row transition metal, a second-row transition metal, and a third-row transition metal of the Periodic Table of Elements,
*1 to *4 each indicate a binding site to $M_1$,
$L_1$ is a ligand represented by Formula 1-1,
$L_2$ is selected from a monodentate ligand and a bidentate ligand,
n1 is 1,
n2 is selected from 0, 1, and 2,
$A_{12}$ is selected from a group represented by Formula 2, a group represented by Formula 3, a $C_5$-$C_{60}$ carbocyclic group, and a $C_1$-$C_{60}$ heterocyclic group,
$A_{13}$ is a group represented by Formula 3,
$A_{14}$ is selected from a quinoxaline group, and a phenazine group,
$Y_{11}$ is N,
$Y_{12}$ to $Y_{14}$ are each independently selected from N and C,
$T_{11}$ to $T_{14}$ are each independently selected from a single bond, *—O—*', *—S—*', *—C($R_{15}$)($R_{16}$)—*', *—N($R_{15}$)—*', and *—P($R_{15}$)—*',
$L_{11}$ to $L_{14}$ are each independently selected from a single bond, *—O—*', *—S—*', *—C($R_{17}$)($R_{18}$)—*', *—C($R_{17}$)=*', *=C($R_{17}$)—*', *—C($R_{17}$)=C($R_{18}$)—*', *—C(=O)—*', *—C(=S)—*', *—C≡C—*', *—B($R_{17}$)—*', *—N($R_{17}$)—*', *—P($R_{17}$)—*', *—Si($R_{17}$)($R_{18}$)—*', *—P($R_{17}$)($R_{18}$)—*', and *—Ge($R_{17}$)($R_{18}$)—*',
a11 to a14 are each independently selected from 0, 1, 2, and 3, wherein at least three selected from a11 to a14 are selected from 1, 2, and 3,
when a11 is 0, $A_{11}$ and $A_{12}$ are not linked, when a12 is 0, $A_{12}$ and $A_{13}$ are not linked, when a13 is 0, $A_{13}$ and $A_{14}$ are not linked, and when a14 is 0, $A_{14}$ and $A_{11}$ are not linked,
$X_{21}$ is N, N—*, C—*, or C($R_{21}$), $X_{22}$ is N, N—*, C—*, or C($R_{22}$), $X_{23}$ is N, N—*, C—*, or C($R_{23}$), $X_{24}$ is N, N—*, C—*, or C($R_{24}$), and $X_{25}$ is N or N—*,
$X_{31}$ is N, N—*, C—*, or C($R_{31}$), $X_{32}$ is N, N—*, C—*, or C($R_{32}$), $X_{33}$ is N, N—*, C—*, or C($R_{33}$), $X_{34}$ is N, N—*, C—*, or C($R_{34}$), $X_{35}$ is N, N—*, C—*, or C($R_{35}$), and $X_{36}$ is N, N—*, C—*, or C($R_{36}$),
$R_{11}$ to $R_{18}$, $R_{21}$ to $R_{24}$, and $R_{31}$ to $R_{36}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$),
$R_{17}$ and $R_{11}$, $R_{17}$ and $R_{12}$, $R_{17}$ and $R_{13}$, and/or $R_{17}$ and $R_{14}$ are optionally linked to form a substituted or unsubstituted $C_5$-$C_{60}$ carbocyclic group or a substituted or unsubstituted $C_1$-$C_{60}$ heterocyclic group,
$R_{17}$ and $R_{18}$ are optionally linked to form a substituted or unsubstituted $C_5$-$C_{60}$ carbocyclic group or a substituted or unsubstituted $C_1$-$C_{60}$ heterocyclic group,
$R_{21}$ to $R_{24}$ are optionally linked to form a substituted or unsubstituted $C_5$-$C_{60}$ carbocyclic group or a substituted or unsubstituted $C_1$-$C_{60}$ heterocyclic group,
$R_{31}$ to $R_{36}$ are optionally linked to form a substituted or unsubstituted $C_5$-$C_{60}$ carbocyclic group or a substituted or unsubstituted $C_1$-$C_{60}$ heterocyclic group, b11 to b14 are each independently selected from 1, 2, 3, 4, 5, 6, 7, and 8, $Q_1$ to $Q_3$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group,

* and *' each indicate a binding site to a neighboring atom, wherein $A_{11}$ is represented by one selected from Formulae 2-1 to 2-7:

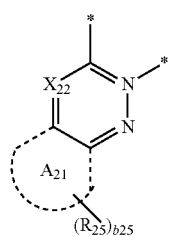

2-1

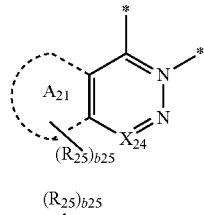

2-2

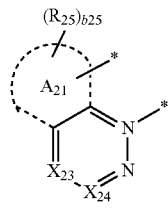

2-3

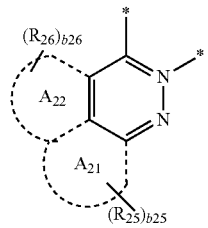

2-4

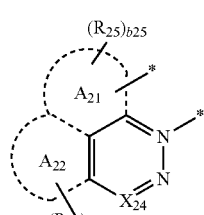

2-5

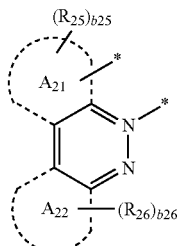

2-6

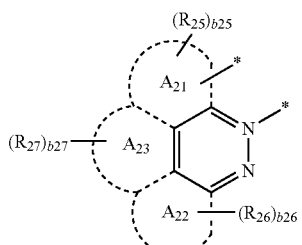

2-7 wherein, in Formulae 2-1 to 2-7, $X_{22}$ to $X_{24}$ are each independently the same as described with respect to Formula 2, $R_{25}$ to $R_{27}$ are each independently the same as described in connection with $R_{21}$ in Formula 2, $R_{25}$ to $R_{27}$ are optionally linked to form a substituted or unsubstituted $C_5$-$C_{60}$ carbocyclic group or a substituted or unsubstituted $C_1$-$C_{60}$ heterocyclic group, b25 to b27 are each independently selected from 1, 2, 3, 4, 5, 6, 7, and 8, $A_{21}$ to $A_{23}$ are each independently selected from a benzene group, a naphthalene group, a phenalene group, an anthracene group, a pyrene group, a chrysene group, and a triphenylene group,

* indicates a binding site to a neighboring atom, and wherein the organometallic compound emits red light or near-infrared light having a maximum emission wavelength of about 720 nm or more and about 2,500 nm or less.

2. The organic light-emitting device of claim 1, wherein: $M_1$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm).

3. The organic light-emitting device of claim 1, wherein: $M_1$ is selected from Pt, Pd, Ru, and Os.

4. The organic light-emitting device of claim 1, wherein: $A_{12}$ is selected from a group represented by Formula 2, a group represented by Formula 3, a) a 6-membered ring, b) a condensed ring in which at least two 6-membered rings are condensed, and c) a condensed ring in which at least one 6-membered ring and one 5-membered ring are condensed, the 6-membered ring is selected from a cyclohexane group, a cyclohexene group, a cyclohexadiene group, an adamantane group, a norbornane group, a norbornene group, a benzene group, a pyridine group, a dihydropyridine group, tetrahydropyridine group, a pyrimidine group, a dihydropyrimidine group, a tetrahydropyrimidine group, a pyrazine group, a dihydropyrazine group, a tetrahydropyrazine group, a pyridazine group, a dihydropyridazine group, a tetrahydropyridazine group, and a triazine group, and the 5-membered ring is selected from a cyclopentane group, a cyclopentene group, a cyclopentadiene group, a furan group, a thiophene group, a silole group, a pyrrole group, a pyrazole group, an imidazole group, a triazole group, a 2,3-dihydroimidazole group, a 2,3-dihydrotriazole group, an oxazole group, an isoxazole group, a thiazole group, an isothiazole group, an oxadiazole group, and a thiadiazole group.

5. The organic light-emitting device of claim 4, wherein:
the 6-membered ring is selected from a cyclohexane group, a cyclohexene group, a cyclohexadiene group, a benzene group, a pyridine group, a pyrimidine group, a pyrazine group, a pyridazine group, and a triazine group, and
the 5-membered ring is selected from a cyclopentane group, a cyclopentene group, a cyclopentadiene group, a furan group, a thiophene group, a pyrrole group, an oxazole group, and a thiazole group.

6. The organic light-emitting device of claim 1, wherein:
two selected from $Y_{12}$ to $Y_{14}$ are each C, and the other thereof is N.

7. The organic light-emitting device of claim 1, wherein:
$T_{14}$ is selected from a single bond, *—O—*', *—S—*', *—C($R_{15}$)($R_{16}$)—*', *—N($R_{15}$)—*', and *—P($R_{15}$)—*', and
$T_{11}$ to $T_{13}$ are each a single bond.

8. The organic light-emitting device of claim 1, wherein:
$L_{11}$ to $L_{14}$ are each a single bond.

9. The organic light-emitting device of claim 1, wherein:
a11 to a14 are each independently selected from 0 and 1, and
the sum of a11 to a14 is selected from 3 and 4.

10. The organic light-emitting device of claim 1, wherein:
a11 to a13 are each 1, and
a14 is 0.

11. The organic light-emitting device of claim 1, wherein:
$X_{21}$ is $C(R_{21})$, $X_{22}$ is $C(R_{22})$, $X_{23}$ is $C(R_{23})$, $X_{24}$ is $C(R_{24})$, $X_{25}$ is N, and $R_{21}$ and $R_{22}$ are linked to form a substituted or unsubstituted $C_5$-$C_{60}$ carbocyclic group or a substituted or unsubstituted $C_1$-$C_{60}$ heterocyclic group;
$X_{21}$ is C—*, $X_{22}$ is $C(R_{22})$, $X_{23}$ is $C(R_{23})$, $X_{24}$ is $C(R_{24})$, $X_{25}$ is N, and $R_{22}$ and $R_{23}$ are linked to form a substituted or unsubstituted $C_5$-$C_{60}$ carbocyclic group or a substituted or unsubstituted $C_1$-$C_{60}$ heterocyclic group;
$X_{21}$ is C—*, $X_{22}$ is $C(R_{22})$, $X_{23}$ is $C(R_{23})$, $X_{24}$ is $C(R_{24})$, $X_{25}$ is N, and $R_{23}$ and $R_{24}$ are linked to form a substituted or unsubstituted $C_5$-$C_{60}$ carbocyclic group or a substituted or unsubstituted $C_1$-$C_{60}$ heterocyclic group;
$X_{21}$ is $C(R_{21})$, $X_{22}$ is $C(R_{22})$, $X_{23}$ is $C(R_{23})$, $X_{24}$ is $C(R_{24})$, $X_{25}$ is N, and $R_{21}$ and $R_{22}$, and $R_{22}$ and $R_{23}$ are each independently linked to form a substituted or unsubstituted $C_5$-$C_{60}$ carbocyclic group or a substituted or unsubstituted $C_1$-$C_{60}$ heterocyclic group;
$X_{21}$ is C—*, $X_{22}$ is $C(R_{22})$, $X_{23}$ is $C(R_{23})$, $X_{24}$ is $C(R_{24})$, $X_{25}$ is N, and $R_{22}$ and $R_{23}$, and $R_{23}$ and $R_{24}$ are each independently linked to form a substituted or unsubstituted $C_5$-$C_{60}$ carbocyclic group or a substituted or unsubstituted $C_1$-$C_{60}$ heterocyclic group;
$X_{21}$ is $C(R_{21})$, $X_{22}$ is $C(R_{22})$, $X_{23}$ is $C(R_{23})$, $X_{24}$ is $C(R_{24})$, $X_{25}$ is N, and $R_{21}$ and $R_{22}$, and $R_{23}$ and $R_{24}$ are each independently linked to form a substituted or unsubstituted $C_5$-$C_{60}$ carbocyclic group or a substituted or unsubstituted $C_1$-$C_{60}$ heterocyclic group; or
$X_{21}$ is $C(R_{21})$, $X_{22}$ is $C(R_{22})$, $X_{23}$ is $C(R_{23})$, $X_{24}$ is $C(R_{24})$, $X_{25}$ is N, and $R_{21}$ and $R_{22}$, $R_{22}$ and $R_{23}$, and $R_{23}$ and $R_{24}$ are each independently linked to form a substituted or unsubstituted $C_5$-$C_{60}$ carbocyclic group or a substituted or unsubstituted $C_1$-$C_{60}$ heterocyclic group.

12. The organic light-emitting device of claim 1, wherein:
$X_{31}$ is N—*, $X_{32}$ is $C(R_{32})$, $X_{33}$ is $C(R_{33})$, $X_{34}$ is $C(R_{34})$, $X_{35}$ is $C(R_{35})$, and $X_{36}$ is $C(R_{36})$;
$X_{31}$ is C—*, $X_{32}$ is $C(R_{32})$, $X_{33}$ is $C(R_{33})$, $X_{34}$ is $C(R_{34})$, $X_{35}$ is $C(R_{35})$, and $X_{36}$ is $C(R_{36})$; or
$X_{31}$ is N—*, $X_{32}$ is $C(R_{32})$, $X_{33}$ is $C(R_{33})$, $X_{34}$ is N, $X_{35}$ is $C(R_{35})$, and $X_{36}$ is $C(R_{36})$.

13. The organic light-emitting device of claim 1, wherein:
the organometallic compound represented by Formula 1 is selected from Compounds 17 to 20, 29, and 30:

17

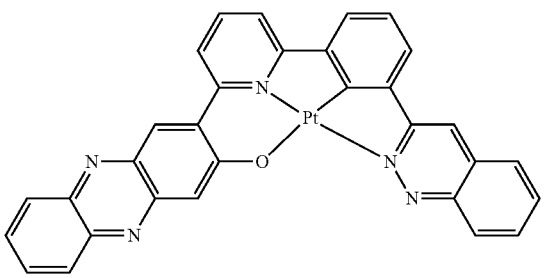

18

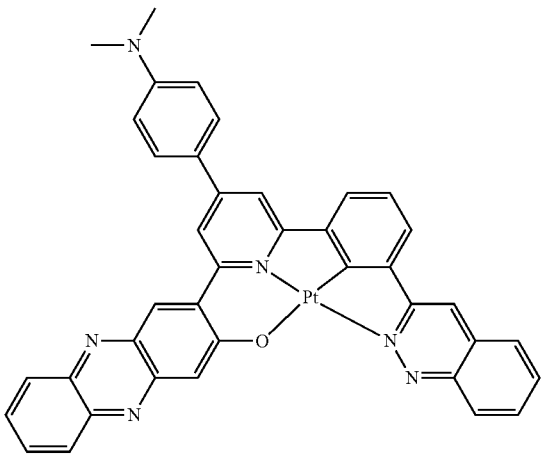

19

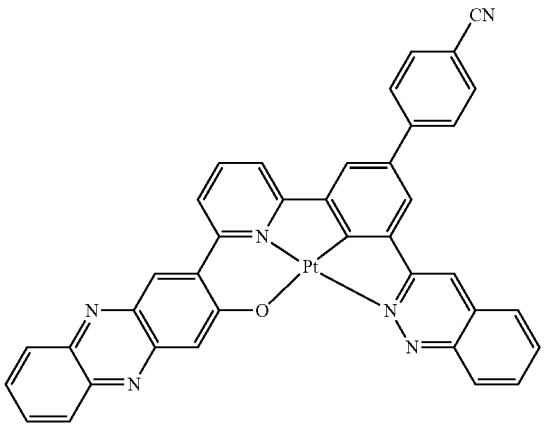

-continued

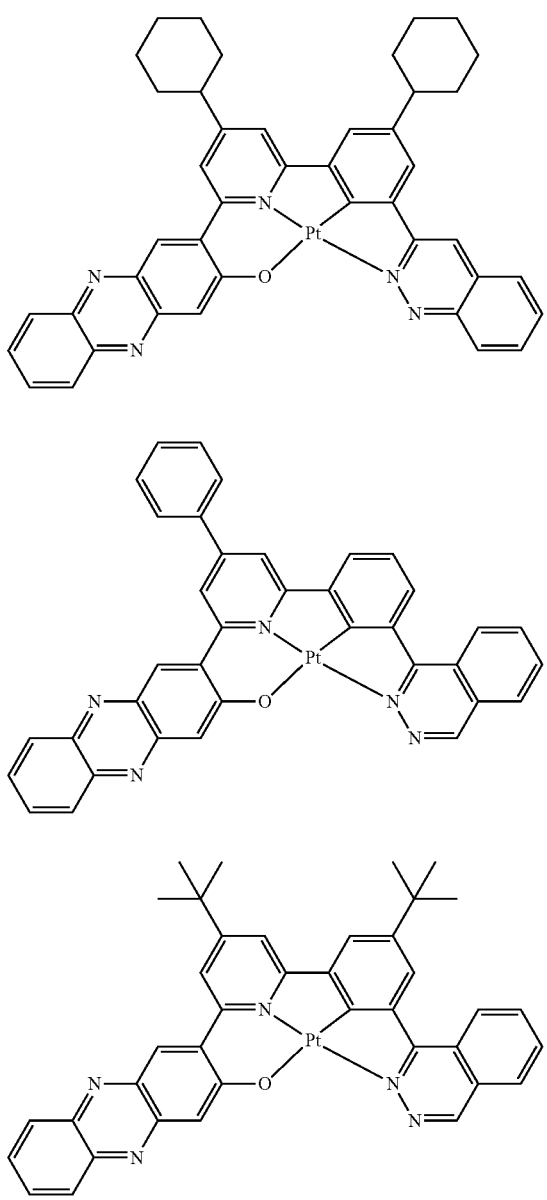

14. The organic light-emitting device of claim 1, wherein:
the first electrode is an anode,
the second electrode is a cathode,
the organic layer further comprises a hole transport region between the first electrode and the emission layer and/or an electron transport region between the emission layer and the second electrode,
the hole transport region comprises a hole injection layer, a hole transport layer, an emission auxiliary layer, an electron blocking layer, or any combination thereof, and
the electron transport region comprises a hole blocking layer, an electron transport layer, an electron injection layer, or any combination thereof.

15. The organic light-emitting device of claim 1, wherein: the emission layer comprises the organometallic compound.

16. An apparatus comprising the organic light-emitting device of claim 1.

17. The apparatus of claim 16, wherein:
the apparatus is a light-emitting apparatus, an authentication apparatus, or an electronic apparatus.

18. An organometallic compound represented by Formula 1:

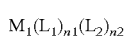

Formula 1

Formula 1-1

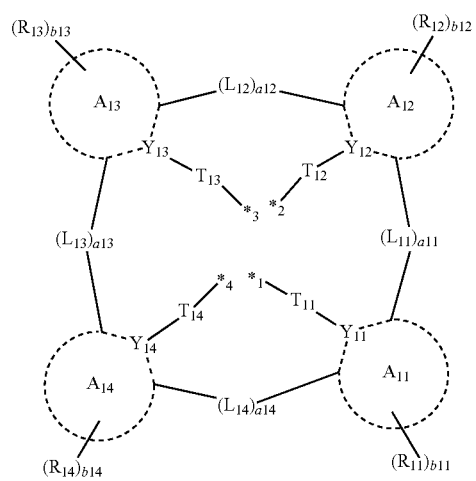

Formula 2

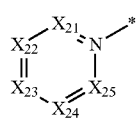

Formula 3

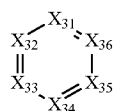

wherein, in Formulae 1, 1-1, 2, and 3,
$M_1$ is selected from a first-row transition metal, a second-row transition metal, and a third-row transition metal, of the Periodic Table of Elements,
*1 to *4 each indicate a binding site to $M_1$,
$L_1$ is a ligand represented by Formula 1-1,
$L_2$ is selected from a monodentate ligand and a bidentate ligand,
n1 is 1,
n2 is selected from 0, 1, and 2,
$A_{12}$ is selected from a group represented by Formula 2, a group represented by Formula 3, a $C_5$-$C_{60}$ carbocyclic group, and a $C_1$-$C_{60}$ heterocyclic group,
$A_{13}$ is a group represented by Formula 3,
$A_{14}$ is selected from a quinoxaline group, and a phenazine group,
$Y_{11}$ is N,
$Y_{12}$ to $Y_{14}$ are each independently selected from N and C,
$T_{11}$ to $T_{14}$ are each independently selected from a single bond, *—O—*', *—S—*', *—C($R_{15}$)($R_{16}$)—*', *—N($R_{15}$)—*', and *—P($R_{15}$)—*', L$_{11}$ to L$_{14}$ are each independently selected from a single bond, *—O—*', *—S—*', *—C(R$_{17}$)(R$_{18}$)—*', *—C(R$_{17}$)=*', *=C(R$_{17}$)—*', *—C(R$_{17}$)=C(R$_{18}$)—*', *—C(=O)—*', *—C(=S)—*', *—C≡C—*', *—B(R$_{17}$)—*', *—N(R$_{17}$)—*', *—P(R$_{17}$)—*', *—Si(R$_{17}$)(R$_{18}$)—*', *—P(R$_{17}$)(R$_{18}$)—*', and *—Ge(R$_{17}$)(R$_{18}$)—*', a11 to a14 are each independently selected from 0, 1, 2, and 3, wherein at least three selected from a11 to a14 are selected from 1, 2, and 3, when a11 is 0, A$_{11}$ and A$_{12}$ are not linked, when a12 is 0, A$_{12}$ and A$_{13}$ are not linked, when a13 is 0, A$_{13}$ and A$_{14}$ are not linked, and when a14 is 0, A$_{14}$ and A$_{11}$ are not linked, X$_{21}$ is N, N—*, C—*, or C(R$_{21}$), X$_{22}$ is N, N—*, C—*, or C(R$_{22}$), X$_{23}$ is N, N—*, C—*, or C(R$_{23}$), X$_{24}$ is N, N—*, C—*, or C(R$_{24}$), and X$_{25}$ is N or N—*, X$_{31}$ is N, N—*, C—*, or C(R$_{31}$), X$_{32}$ is N, N—*, C—*, or C(R$_{32}$), X$_{33}$ is N, N—*, C—*, or C(R$_{33}$), X$_{34}$ is N, N—*, C—*, or C(R$_{34}$), X$_{35}$ is N, N—*, C—*, or C(R$_{35}$), and X$_{36}$ is N, N—*, C—*, or C(R$_{36}$), R$_{11}$ to R$_{18}$, R$_{21}$ to R$_{24}$, and R$_{31}$ to R$_{36}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted C$_1$-C$_{60}$ heteroaryloxy group, a substituted or unsubstituted C$_1$-C$_{60}$ heteroarylthio group, a substituted or unsubstituted monovalent non-aromatic condensed polycyclic group, a substituted or unsubstituted monovalent non-aromatic condensed heteropolycyclic group, —Si(Q$_1$)(Q$_2$)(Q$_3$), —B(Q$_1$)(Q$_2$), —N(Q$_1$)(Q$_2$), —P(Q$_1$)(Q$_2$), —C(=O)(Q$_1$), —S(=O)(Q$_1$), —S(=O)$_2$(Q$_1$), —P(=O)(Q$_1$)(Q$_2$), and —P(=S)(Q$_1$)(Q$_2$), R$_{17}$ and R$_{11}$, R$_{17}$ and R$_{12}$, R$_{17}$ and R$_{13}$, and/or R$_{17}$ and R$_{14}$ are optionally linked to form a substituted or unsubstituted C$_5$-C$_{60}$ carbocyclic group or a substituted or unsubstituted C$_1$-C$_{60}$ heterocyclic group, R$_{17}$ and R$_{18}$ are optionally linked to form a substituted or unsubstituted C$_5$-C$_{60}$ carbocyclic group or a substituted or unsubstituted C$_1$-C$_{60}$ heterocyclic group, R$_{21}$ to R$_{24}$ are optionally linked to form a substituted or unsubstituted C$_5$-C$_{60}$ carbocyclic group or a substituted or unsubstituted C$_1$-C$_{60}$ heterocyclic group, R$_{31}$ to R$_{36}$ are optionally linked to form a substituted or unsubstituted C$_5$-C$_{60}$ carbocyclic group or a substituted or unsubstituted C$_1$-C$_{60}$ heterocyclic group, b11 to b14 are each independently selected from 1, 2, 3, 4, 5, 6, 7, and 8, Q$_1$ to Q$_3$ are each independently selected from hydrogen, deuterium, —F, —Cl, —Br, —I, a hydroxyl group, a cyano group, a nitro group, an amidino group, a hydrazino group, a hydrazono group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a C$_1$-C$_{60}$ heteroaryloxy group, a C$_1$-C$_{60}$ heteroarylthio group, a monovalent non-aromatic condensed polycyclic group, a monovalent non-aromatic condensed heteropolycyclic group, a biphenyl group, and a terphenyl group,

* and *' each indicate a binding site to a neighboring atom, wherein A$_{11}$ is represented by one selected from Formulae 2-1 to 2-7:

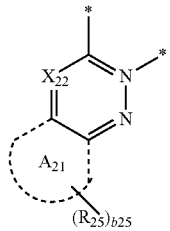

2-1

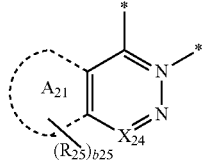

2-2

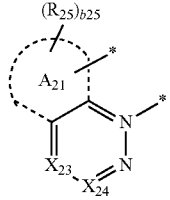

2-3

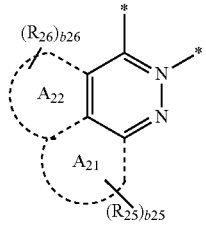

2-4

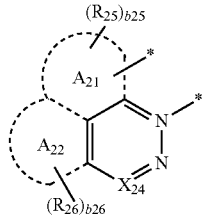

2-5

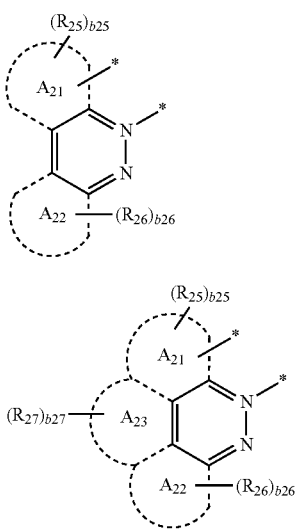

wherein, in Formulae 2-1 to 2-7, $X_{22}$ to $X_{24}$ are each independently the same as described with respect to Formula 2, $R_{25}$ to $R_{27}$ are each independently the same as described in connection with $R_{21}$ in Formula 2, $R_{25}$ to $R_{27}$ are optionally linked to form a substituted or unsubstituted $C_5$-$C_{60}$ carbocyclic group or a substituted or unsubstituted $C_1$-$C_{60}$ heterocyclic group, b25 to b27 are each independently selected from 1, 2, 3, 4, 5, 6, 7, and 8, $A_{21}$ to $A_{23}$ are each independently selected from a benzene group, a naphthalene group, a phenalene group, an anthracene group, a pyrene group, a chrysene group, and a triphenylene group,

* indicates a binding site to a neighboring atom, and wherein the organometallic compound emits red light or near-infrared light having a maximum emission wavelength of about 720 nm or more and about 2,500 nm or less.

* * * * *